(12) United States Patent
Curt et al.

(10) Patent No.: US 7,209,804 B2
(45) Date of Patent: Apr. 24, 2007

(54) SYSTEM AND METHOD FOR PROVIDING REMOTE MONITORING OF VOLTAGE POWER TRANSMISSION AND DISTRIBUTION DEVICES

(75) Inventors: Walter Curt, Harrisonburg, VA (US); Chris Mullins, Harrisonburg, VA (US); Glen Shomo, Harrisonburg, VA (US); Wayne Bruffy, Mount Crawford, VA (US)

(73) Assignee: Power Monitors, Inc., Harrisonburg, VA (US)

( * ) Notice: Subject to any disclaimer, the term of this patent is extended or adjusted under 35 U.S.C. 154(b) by 232 days.

(21) Appl. No.: 10/958,685

(22) Filed: Oct. 6, 2004

(65) Prior Publication Data

US 2005/0132241 A1 Jun. 16, 2005

Related U.S. Application Data

(60) Provisional application No. 60/508,380, filed on Oct. 6, 2003.

(51) Int. Cl.
*G06F 19/00* (2006.01)
*G01R 31/36* (2006.01)

(52) U.S. Cl. .................... 700/286; 700/295; 702/61; 702/188; 713/300

(58) Field of Classification Search ............... 700/286, 700/295; 702/61, 62, 176; 713/300
See application file for complete search history.

(56) References Cited

U.S. PATENT DOCUMENTS

| | | | |
|---|---|---|---|
| 6,415,244 B1 * | 7/2002 | Dickens et al. | 702/187 |
| 6,545,482 B1 | 4/2003 | Fedirchuk et al. | |
| 6,633,823 B2 | 10/2003 | Bartone et al. | |
| 6,792,337 B2 * | 9/2004 | Blackett et al. | 700/295 |
| 6,957,158 B1 * | 10/2005 | Hancock et al. | 702/61 |
| 2002/0043969 A1 | 4/2002 | Duncan et al. | |
| 2004/0138786 A1 * | 7/2004 | Blackett et al. | 700/295 |
| 2004/0138835 A1 * | 7/2004 | Ransom et al. | 702/62 |
| 2005/0138432 A1 * | 6/2005 | Ransom et al. | 713/201 |

* cited by examiner

*Primary Examiner*—Leo Picard
*Assistant Examiner*—Douglas S. Lee
(74) *Attorney, Agent, or Firm*—Bell, Boyd & Lloyd LLP

(57) ABSTRACT

The present invention provides a system and method for providing remote monitoring of a power device. In architecture, the system includes a service device that includes a transceiver circuitry to receive information of a power condition from the power device, and a computation circuitry to compute an electrical value for the power device. In addition, the service device includes a display circuitry that displays the computed electrical value in conjunction with operational parameters of the power device. The present invention can also be viewed as a method for providing remote monitoring of a power device. The method operates by detecting a power condition of the power device, and computing an electrical value for the power device. The electrical value computed in conjunction with the operational parameters is then displayed.

37 Claims, 59 Drawing Sheets

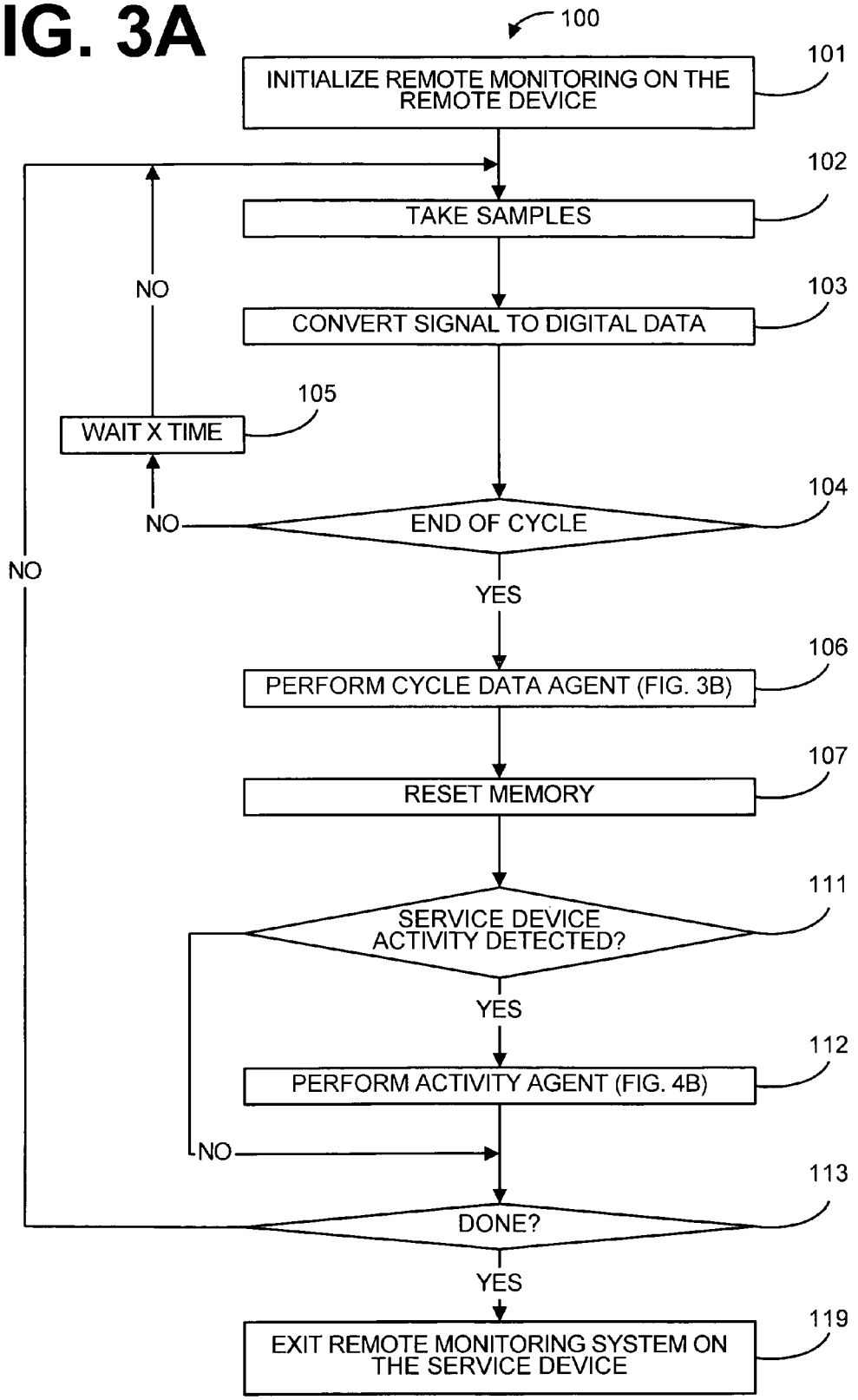

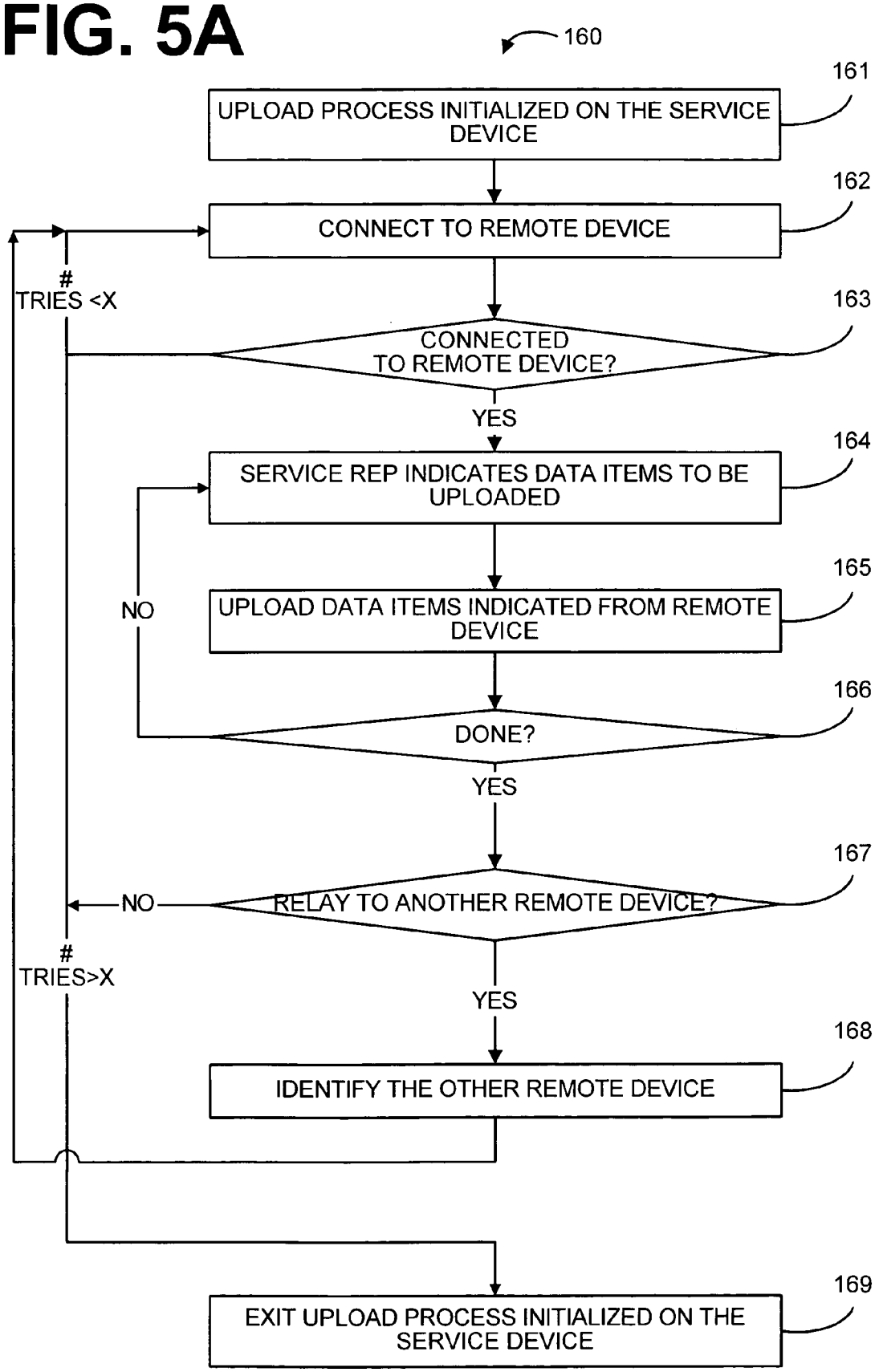

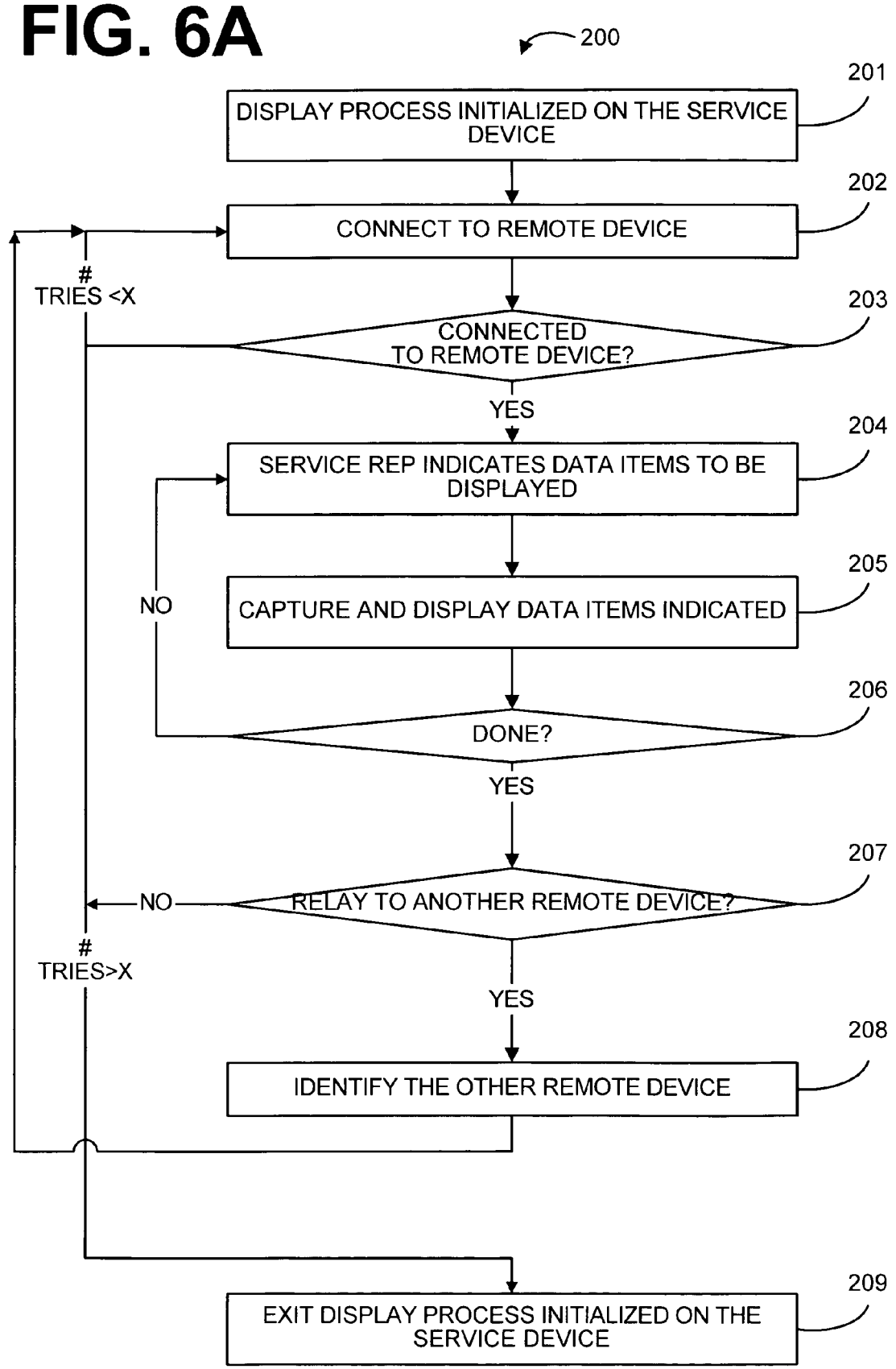

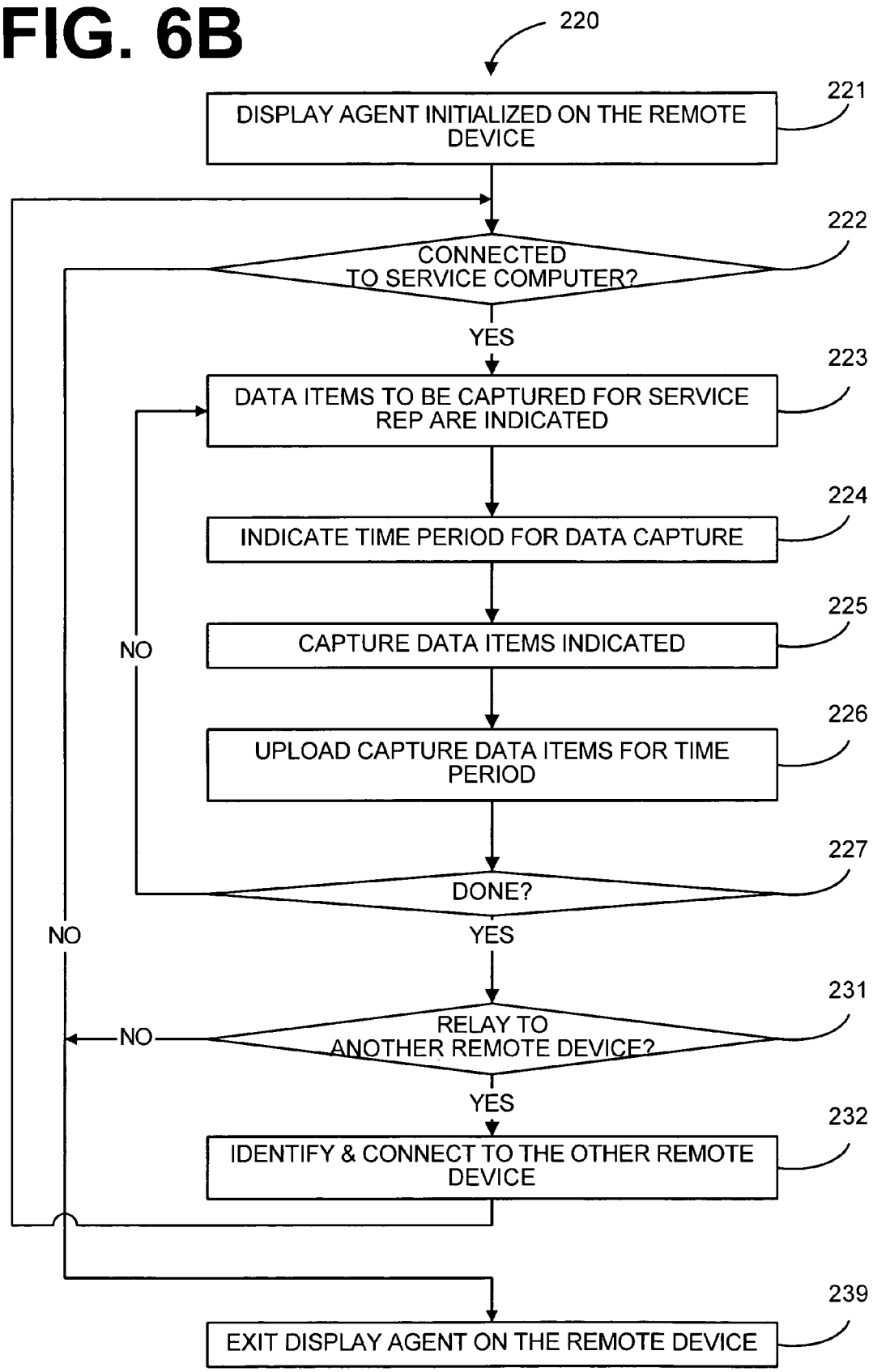

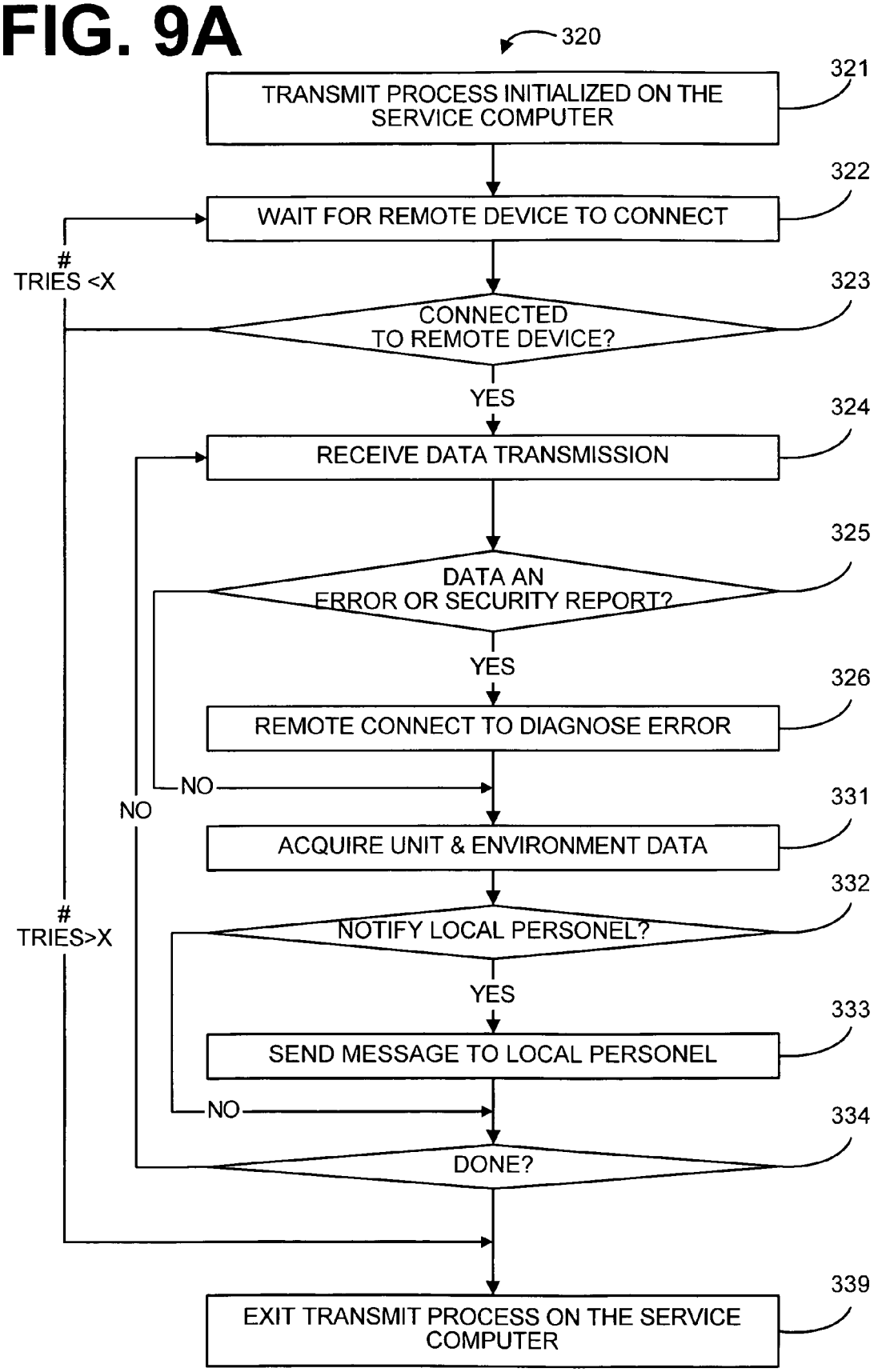

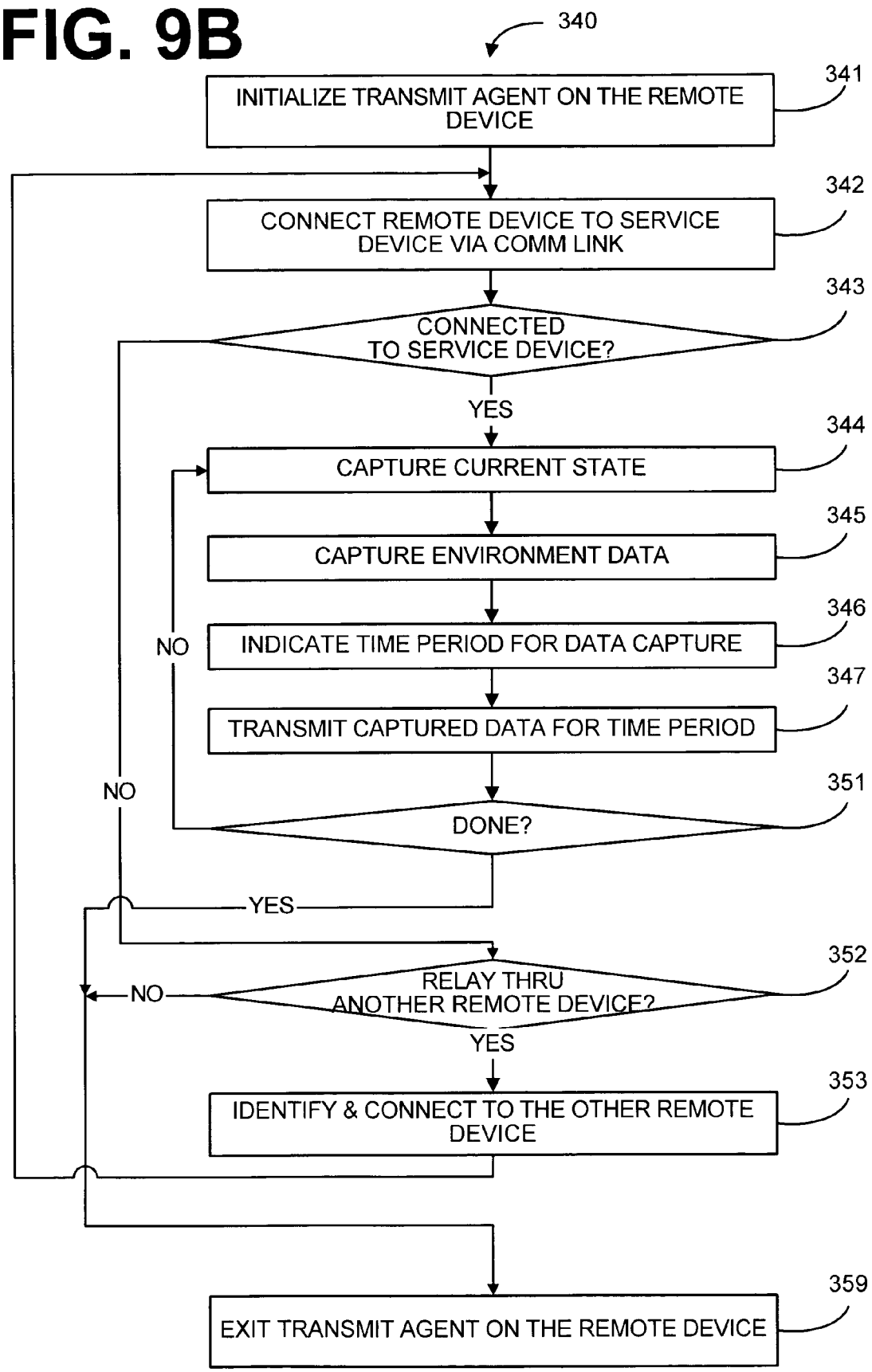

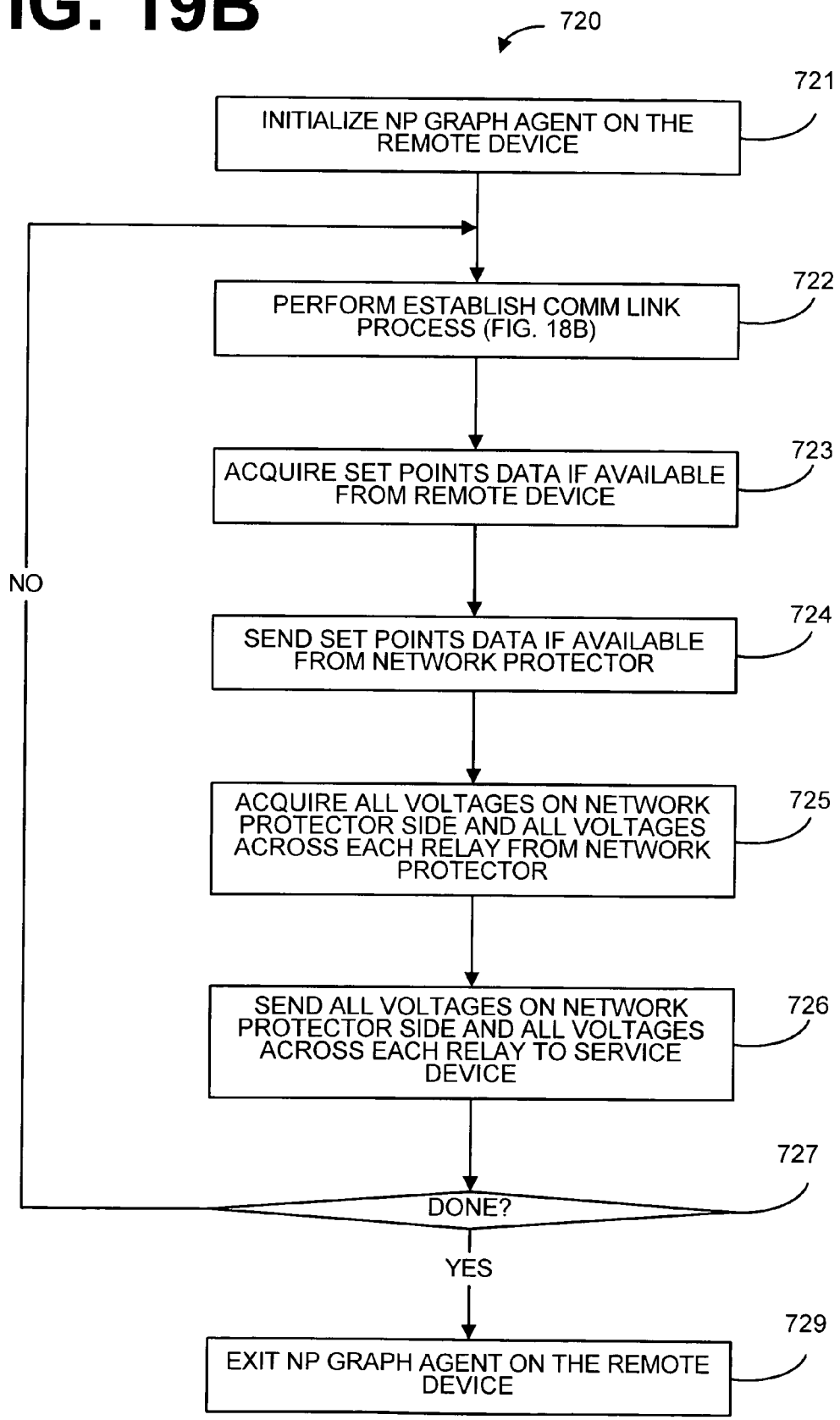

SYSTEM AND METHOD FOR PROVIDING REMOTE MONITORING OF VOLTAGE POWER TRANSMISSION AND DISTRIBUTION DEVICES

CROSS-REFERENCE TO RELATED APPLICATIONS

This application claims the benefit of U.S. patent application Ser. No. 10/920,460, filed on Aug. 18, 2004, entitled "A SYSTEM AND METHOD FOR PROVIDING REMOTE MONITORING OF VOLTAGE POWER TRANSMISSION AND DISTRIBUTION DEVICES", and U.S. patent application Ser. No. 60/508,380, filed on Oct. 6, 2003, entitled "A SYSTEM AND METHOD FOR PROVIDING REMOTE MONITORING OF VOLTAGE POWER TRANSMISSION AND DISTRIBUTION DEVICES" both of which is incorporated by reference herein in its entirety.

COPYRIGHT NOTICE

A portion of the disclosure of this patent document may contain material, which is subject to copyright protection. The copyright owner has no objection to the facsimile reproduction by anyone of the patent document or patent disclosure as it appears in the U.S. Patent and Trademark Office patent file or records, but otherwise reserves all copyright rights whatsoever.

TECHNICAL FIELD

The present invention relates to a method and system for maintaining operation of voltage power transmission devices, and more particularly, relates to a method and system for providing remote monitoring of voltage power transmission and distribution devices.

BACKGROUND OF THE INVENTION

Conventional voltage, current and power analyzers have required many connections to a physically large recording box. Typically, access is required to an electrical panel or transformer case where the connections to the analyzer equipment can be made. In addition, physical access to the analyzer is required to view real-time measurements and status, as well as to extract recorded data.

For instance, often a communications cable and power cable are required. This creates serious safety concerns for both the technician user, and for the manufacturer. The need to attach the communication and power cables to the analyzer generally requires the technician to be in close proximity with the analyzer.

Safety issues include proximity to hazardous high voltages, technician exposure to confined locations (e.g. underground vaults), explosive atmospheres, etc. Frequently high voltage electrical power to the power system device being monitored must be removed before a technician is allowed to enter a confined area where a power analyzer may be located. Since this may disrupt electrical service to a large area, this is often impractical.

In addition, the large size of existing recorders, and the necessity for physical access to it later, can make it difficult to enclose and lock such conventional analyzing equipment in an electrical panel or transformer case. The result is that the panel or transformer cover must be left off during an analyzing recording session. Obviously, this creates unsafe conditions by putting the technician and others at great risk of electrocution.

Also, safe voltage isolation has been difficult to achieve in a small recorder when all voltage channels are to be brought into a single recorder unit. This is extremely difficult to achieve at voltages as high as 600 Volts. This is particularly important in any instrument designed for field use such as on a utility pole.

Thus, heretofore an unaddressed need exists in the industry to address the aforementioned deficiencies quickly and efficiently.

SUMMARY OF THE INVENTION

The present invention provides a system and method for providing remote monitoring of a power device or power delivery system.

In architecture, the system includes a service for performing the operation. The service device includes a transceiver circuitry to receive information of a power condition from the power device, and a computation circuitry to compute an electrical value for the power device. In addition, the service device includes a display circuitry that displays the computed electrical value in conjunction with operational parameters of the power device.

The present invention can also be viewed as a method for providing remote monitoring of a power device. The method operates by (1) detecting a power condition of the power device; (2) computing an electrical value for the power device; and (3). displaying the electrical value computed in conjunction with operational parameters.

BRIEF DESCRIPTION OF THE DRAWINGS

The present invention, as defined in the claims, can be better understood with reference to the following drawings. The components within the drawings are not necessarily to scale relative to each other, emphasis instead being placed upon clearly illustrating the principles of the present invention.

FIG. 3A is a flow chart illustrating an example of the operation of the remote power monitoring system of the present invention on the remote monitoring device, as shown in FIGS. 1, 2B and 2C.

FIG. 5A is a flow chart illustrating an example of the operation of the upload process utilized by the remote power monitoring system of the present invention, as shown in FIGS. 2A, 3A and 4A.

FIG. 6A is a flow chart illustrating an example of the operation of the display process utilized by the remote power monitoring system of the present invention, as shown in FIGS. 2A, 3A and 4A.

FIG. 6B is a flow chart illustrating an example of the operation of the display agent utilized in the remote monitoring device and utilized by the remote power monitoring system of the present invention, as shown in FIGS. 2B, 3B, 3C and 4B.

FIG. 9A is a flow chart illustrating an example of the operation of the network transmit process utilized by the remote power monitoring system of the present invention, as shown in FIGS. 2A, 3A and 4A.

FIG. 9B is a flow chart illustrating an example of the operation of the network transmit agent utilized in the remote monitoring device and utilized by the remote power monitoring system of the present invention, as shown in FIGS. 2B, 3B, 3C and 4B.

FIG. 19B is a flow chart illustrating an example of the operation of the NP graph agent utilized in the remote monitoring device and utilized by the remote power monitoring system of the present invention, as shown in FIGS. 2B, 3B, 3C and 4B.

DETAILED DESCRIPTION OF THE PREFERRED EMBODIMENTS

Figure 1:
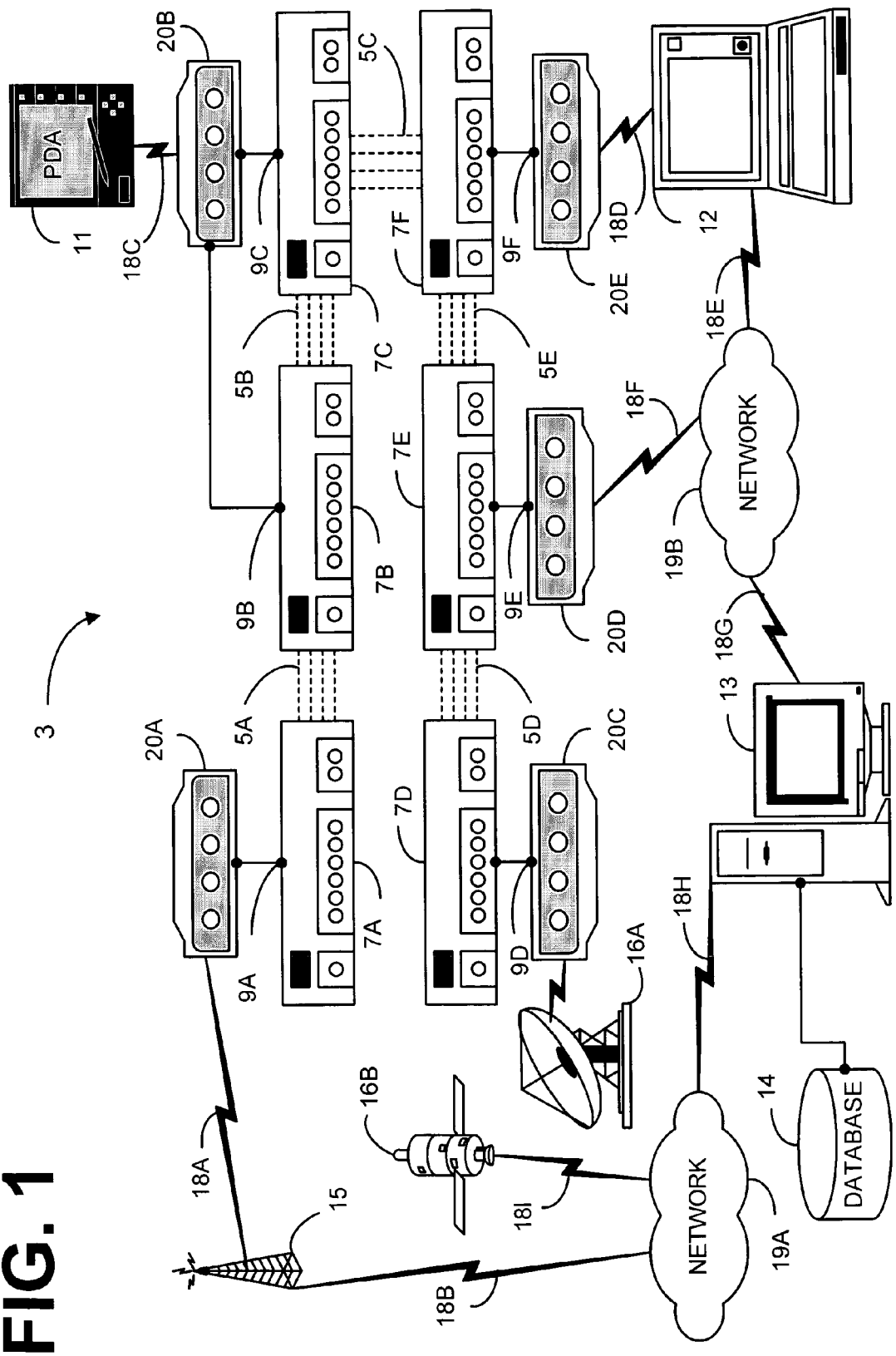
FIG. 1 is a block diagram illustrating an example of the network environment for a service system and the remote monitoring devices utilizing the remote power monitoring system of the present invention.

The present invention solves many problems, while it delivers accuracy and provides the user with much greater flexibility over conventional arrangements. The present invention relates to power analyzers for use in the field in monitoring power transmission and distribution systems.

In particular, the present invention relates to a small, wireless, remote power monitoring system. The remote power monitoring system is capable of independently sensing and recording voltage and current conditions, including but not limited to performance conditions and external environmental conditions. The remote power monitoring system performing in a larger system collects, and records voltage and current conditions detected by one or more transducers in accordance with the invention. These larger systems, include but are not limited to, network protectors, circuit breakers, electrical panels, transformers, reclosers, capacitor banks, fuses, transfer switches, voltage regulators, VAR compensators, and the like. In particular, the remote power monitoring system may be embedded into or attached or retrofitted to a device (e.g. a circuit breaker or network protector), thus creating an integrated device.

The remote power monitoring system of the present invention comprises circuitry and external leads. The external leads connect to the voltage to be recorded, and the transducers clamp around the conductor of the voltage or use other means to convert the current flow into a suitable input signal. The circuitry is generally contained within a unitary casing, however, an external clamp portion can be utilized to incorporate signal conditioning circuitry. The remote monitoring device contains all analog and digital circuitry necessary to digitize voltage and current waveform data collected from the conductor, transducer and the external leads. From such data, all power quality parameters such as RMS voltage, current, power, power factor, harmonics, and the like can be computed. The data is stored in digital memory located on a circuit board in the remote monitoring device. To provide this information to the analyzing device, the remote monitoring device of the present invention utilizes communication technology.

A remote power monitoring system in accordance with the invention includes a recording unit with a RF transceiver. The remote power monitoring system of the present invention preferably uses a low-power wireless transceiver, for example but not limited to, a transceiver equipped with a Bluetooth system. Other types of communication technologies may be utilized including, but not limited to, WiFi, cellular, optical, satellite, radio frequency (RF), conventional telephone system (POTS), magnetic induction, Ethernet, LAN, WAN or the like. This transceiver allows the engineer or technician to use a separate display device, such as for example, a Bluetooth-enabled personal digital assistant (PDA), to view real-time waveforms and data, and to download recorded data from the transducer into the PDA for later analysis.

In addition, the remote power monitoring system in accordance with the invention can control other equipment both by initiating control signals through an optical, wired or wireless port, and relaying control signals received through the optical, wired or wireless interface, through a port attached to the equipment. This allows the user to use existing or new software to control their equipment, without modification, and without having to enter a confined space, voltage area, or other hazardous or inaccessible location.

The remote power monitoring system of the present invention is a measurement and recording system which measures and records power quality, power flow parameters and statistics. It can also transmit real-time and previously recorded data through an optical, wired or wireless interface to allow safe access to the data, where it was previously impracticable to acquire such data. In addition, it can control other equipment both by initiating control signals through an optical, wired or wireless port, and relaying control signals received through the optical, wired or wireless interface, through a port to attached equipment. A handheld computer, laptop, PDA, Pocket PC or other like device may be used to communicate with the remote power monitoring system. The remote power monitoring system can record data for several years, depending on the user setup.

The measurement and recording aspect of the invention is based on conventional methods, such as the Vip power analyzer, and the VP-2 available from Power Monitors, Inc. The data measured and recorded includes, but is not limited to: (for single and multiple phase power transmission and distribution equipment) RMS voltage and current, real power, apparent power, harmonics, phase angle, reactive power, power factors, displacement power factor, total harmonic distortion, total power quantities, total real power, total reactive power, total apparent power, total power factors, phase angles, cycle histograms, cycle event changes, flicker, abnormal voltages, stray voltages and power outages; (for remote power monitoring system) parameters, log, current status, set-up parameters, sensor data and the like, and (for environmental conditions) temperature, humidity, air pressure, smoke (i.e. smoke detector), security status, and the like. For example, standards such as IEC 61000-4-30, IEC 61000-4-7, IEC 61000-4-15 may also be used as measurement techniques, and EN 50160, IEEE 1159 and 519 to characterize voltage events and power quality. Parameters, device operations, and other measurements from connected equipment may also be recorded.

The remote power monitoring system of the present invention preferably includes a wireless interface. The compact size of the remote power monitoring system of the present invention allows these conventional measurements and recordings to be acquired in situations that were unsafe or impossible with existing designs. The wireless aspect provides voltage isolation, protecting the user from hazardous voltages. Other safety issues such as high voltage, confined space and explosion hazards are also eliminated in underground vault locations, since the device can communicate information to locations outside the confined space or hazardous location. This also allows equipment users to interface with their equipment without breaching secure locations (such as underground vaults in urban areas which have been secured for homeland defense). If the remote power monitoring system of the present invention is embedded in a circuit breaker or network protector, the wireless interface allows the communication of information from the device without opening an electrical panel cover or access door, thus greatly increasing user safety.

In addition, the control functionality of the remote power monitoring system of the present invention allows the control of other equipment from outside the hazardous location. A wired port (preferably an RS-232 or 12C) or wireless communication link from the remote power monitoring system of the present invention connects to other equipment (such as a circuit breaker, network protector, recloser, etc.) Other types of communication technologies may also be utilized including, but not limited to, Bluetooth, WiFi, cellular, optical, satellite, RF, POTS, Ethernet, LAN, WAN, magnetic induction, coax, RS-485, INCOM, SCADA or the like.

The remote power monitoring system of the present invention can initiate control signals based on its own measurements, or relay received commands from the wireless interface. This allows the user to use existing software to control its equipment, without modification, but without having to enter a confined space, voltage area, or other hazardous or inaccessible location. The compact size of the remote power monitoring system of the present invention allows for placement inside other pieces of equipment, such as a network protector, circuit breaker, electrical panel, switchgear, transformer, etc., where it was previously impractical to do so.

Voltage signals are routed through a voltage front-end in the remote power monitoring system of the present invention, which reduces the high input voltages to appropriate levels. The signals are fed through signal conditioning circuitry, which terminates into an A/D converter. Each voltage channel is isolated for safety. The preferred method is galvanical isolation, however, it is understood that other methods may be used. Current inputs use conventional techniques.

The remote power monitoring system of the present invention is preferably controlled by a processor (i.e. a DSP), which interfaces to the A/D converters, wireless module, RS-232 port, 12C port, static RAM, FLASH memory, real-time clock, and other digital circuitry. This processor handles all computations, control functions, data storage, and communications. Firmware resides on a FLASH integrated circuit, which is also used for data storage.

A rechargeable battery provides power for operation during a power outage, and a primary battery provides long-term memory backup power. However, because of the compact size and power demand of the remote power monitoring system of the present invention, power may be drawn directly from the sources being measured without distorting measurements.

The remote power monitoring system of the present invention allows the recording of power quality data in novel applications due to its small size and power consumption, wireless interface, and safety designs. In the preferred embodiment, the remote power monitoring system of the present invention is currently designed for IEC Category III or higher environments, which are desired for electrical applications).

The challenge of reducing the device size so that it could be used in previously impractical situations was addressed with novel circuit design, and firmware algorithms (which relaxed constraints on the hardware). Some of these include but are not limited to:

The use of a combination of protective impedance and double insulation safety techniques in a single device to meet IEC Cat III or greater requirements. This includes the arrangement and selection of voltage front-end resistors, the physical placement of each circuit board, and the combination of the digital isolators and isolation transformer that comprises the voltage front-end and signal conditioning section.

The use of a signal digital line to combine the functions of an A/D clock and chip select signal. This multiplexing was achieved by a combination of timing circuitry and firmware control.

A multi-input, isolated power supply which allows the device to be powered from an input voltage channel, an external DC supply, or rechargeable internal battery.

An input circuit which allows the device to detect the presence of a distribution transformer. This lets the device distinguish the difference between a power outage and removal of the device from service.

Circuitry to allow digital isolators with a 4000 volt rating to meet 15,000 volt IEC Cat III tests.

Pre-regulator circuitry ensures that the power supply output is self-limiting or regulating.

Relay circuitry that uses the optical, wired or wireless link to monitor and control other equipment both by initiating control signals through the link and relaying control signals received through the optical, wired or wireless interface, through a port to attached equipment.

In an alternative embodiment, the remote power monitoring system of the present invention will initiate a connection to a communication link to transmit information to a central service computer. The central service computer receives the data stream from the remote power monitoring system. The data stream includes, but is not limited to: for single and multiple phases (raw sampled waveforms, RMS voltage and current, real power, apparent power, harmonics, phase angle, reactive power, power factor, displaced power factor, total harmonic distortion, total power quantities, total real and reactive and apparent power, total power factors, phase angles, cycle histograms, cycle event changes, flicker, abnormal voltages, stray voltages and power outages), for a remote power monitoring system (parameters, log, current device status, set up parameters, calibration and sensor data and the like.), for environmental conditions (temperature, humidity, pressure, the smoke content, security status, and the like), and for analog and digital parameters from attached equipment (transformer temperature, oil level, recloser and circuit breaker operation, network protector status, etc.)

With the data in the data stream, a service representative will be able to analyze and perform online troubleshooting of the power system device. Currently, a service representative actually has to visit the location of the power system device to acquire all the data items that are available in the data stream. This saves time and money in the effort to monitor the power system device.

If the service representative determines that adjustment can be made remotely, then the remote power monitoring system of the present invention facilitates the service representative in adjusting any system parameter in the power system device. In the past, adjustments of any system parameter required a service representative to actually physically go to the location of the power system device to perform the adjustment. With the remote adjustment feature, time and money is saved.

The remote power monitoring system of the present invention also enables the collection of power system device performance data for reporting purposes. This feature enables the producer of the power system device to monitor the power system device to track the performance of the power system device.

The remote power monitoring system of the present invention also enables the capability to download software patches, upgrades and new versions of software from the service computer to any supportable remote power system device. The remote power monitoring system of the present invention also enables the capability to download software patches, upgrades and new versions of software from the service computer to any device connected to the remote power monitoring system. (e.g. such as a network protector, etc.)

The remote power monitoring system of the present invention is applicable to all computer processing systems connected to a power system device. The system and method for remote monitoring of a power system device is typically implemented in a networked computing arrangement in which any number of power system devices communicate with at least one service computer device. Examples of communication methods applicable include but are not limited to: the Internet, a local area network (LAN), a wide area network (WAN), CDMA, GSM, TDMA or other wireless network, SCADA, via a telephone line using a modem, any other like networks, or any combination of connections.

Moreover, the remote power monitoring system in accordance with the present invention includes the ability to provide real-time measurements of all power quality, quantity, system parameters. This real-time information can be transmitted to a separate display device utilizing the low-power wireless transceiver described, above. This real-time information includes, but it is not limited to the network voltage measurements, transformer voltage measurements and network voltage and power measurements in digital and graphic forms. These graphic forms include overlaying connected equipment parameters with real-time system measurements.

Referring now to the drawings, in which like numerals illustrate like elements throughout the several views, FIG. 1 illustrates an example of the network environment 3 for a service devices (11, 12 or 13) and the remote monitoring devices 20 utilizing the remote power monitoring system of the present invention.

The network environment 3 includes power system devices 7(a–f), service computers 11–13 contain applications, and service computer 13 further contains a database 14. The power system devices 7 (a–f) include, but are not limited to, network protectors, circuit breakers, electrical panels, transformers, reclosers, capacitor banks, fuses, transfer switches, voltage regulators, VAR compensators, and the like. Hereinafter, the power system devices 7 (a–f) will be referred to as to power device 7 for the sake of brevity. It is understood that a network protector includes a protector and relay.

Service computer 11–13 can access the remote monitoring devices 20(a–f) via intermittent connections 18(a–i), respectively, over network 18. Service computer 11–13 include, but are not limited to: PCs, workstations, laptops, PDAs, palm devices, tablets and the like. The computer 13 may also be connected to the local area network (LAN) within an organization.

The structure and operation of the remote power monitoring system enables the service computers 11–13 to monitor power system devices 7 (a–f) more efficiently than previously known systems. Particularly, the remote power monitoring system of the present invention enables the power system devices 7 (a–f) to operate more efficiently by increasing uptime through the closer monitoring. When the remote monitoring devices 20(a–f) connect to the service computer 11–13, the user may have access to power system devices 7(a–f) power measurements. In an alternative embodiment, service computer 13 may provide online or remote support.

The power measurements from power system devices 7(a–f) may be stored on the database 14 for later comparisons and statistical analysis.

As depicted in FIG. 1, power system devices 7 (a–f) are connected together via example transmission lines 5 (a–e). Attached to each of power system devices 7 is a remote monitoring device 20. The remote monitoring devices 20 measures and records of the remote monitoring devices 20 and then provides for efficient communication of the measurements of power system 7 to service computers 11–13. Hereinafter, the service device 11–13 will be referred to as to service device 11 for the sake of brevity.

As stated previously, there are a number of communication methods that can be utilized to perform the communication of the measurements. These methods include, but are not limited to, Bluetooth, WiFi, cellular, optical, satellite, RF, POTS, Ethernet, LAN, WAN, magnetic induction, coax, RS-485, INCOM, SCADA or the like.

The service device may implement two or more communication methods, and may also act as a bridge between two or more methods, which would enable it to relay commands and data to other devices.

Figure 2A:
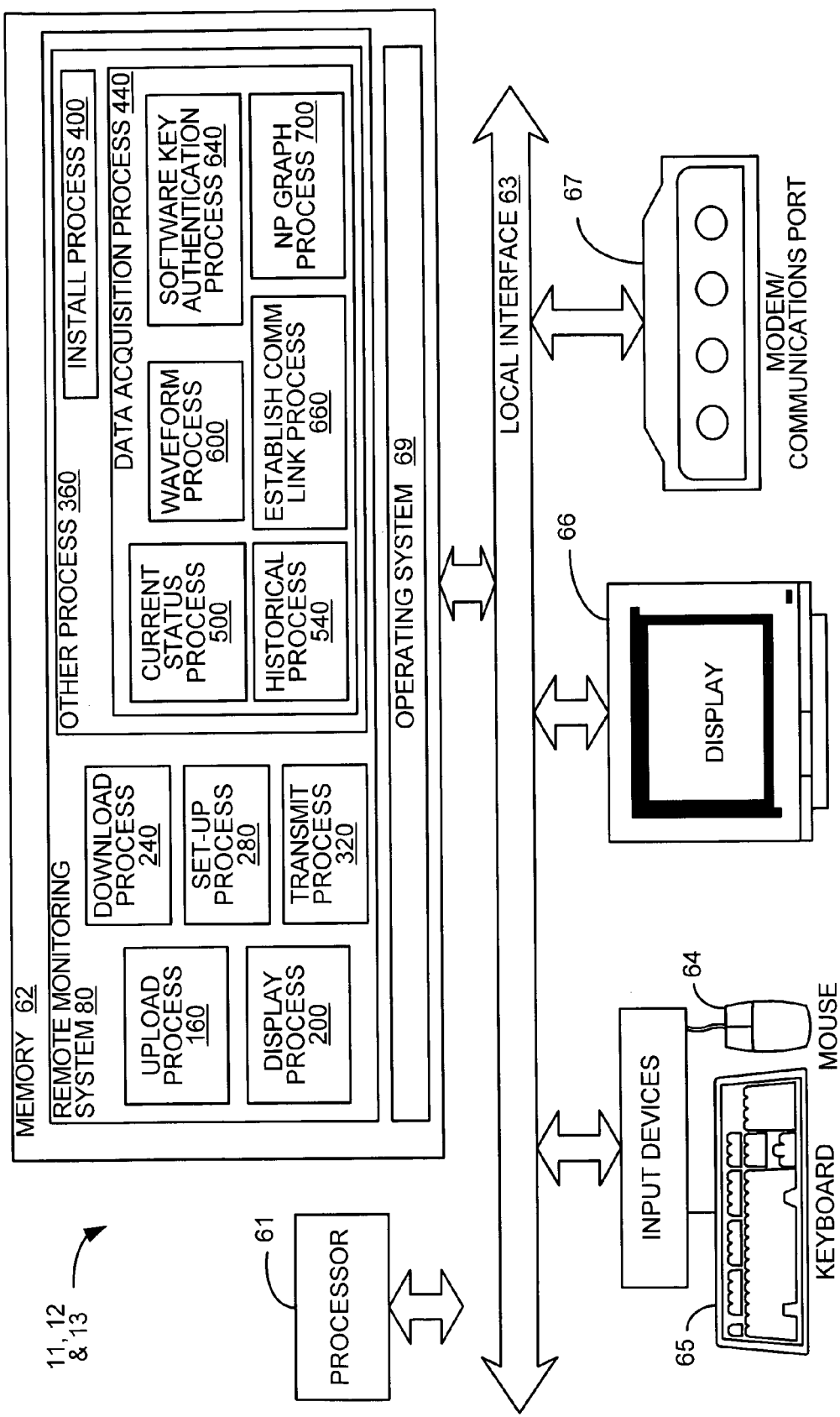
FIG. 2A is a block diagram illustrating an example of a service device utilizing the remote power monitoring system of the present invention, as shown in FIG. 1.
Figure 2B:
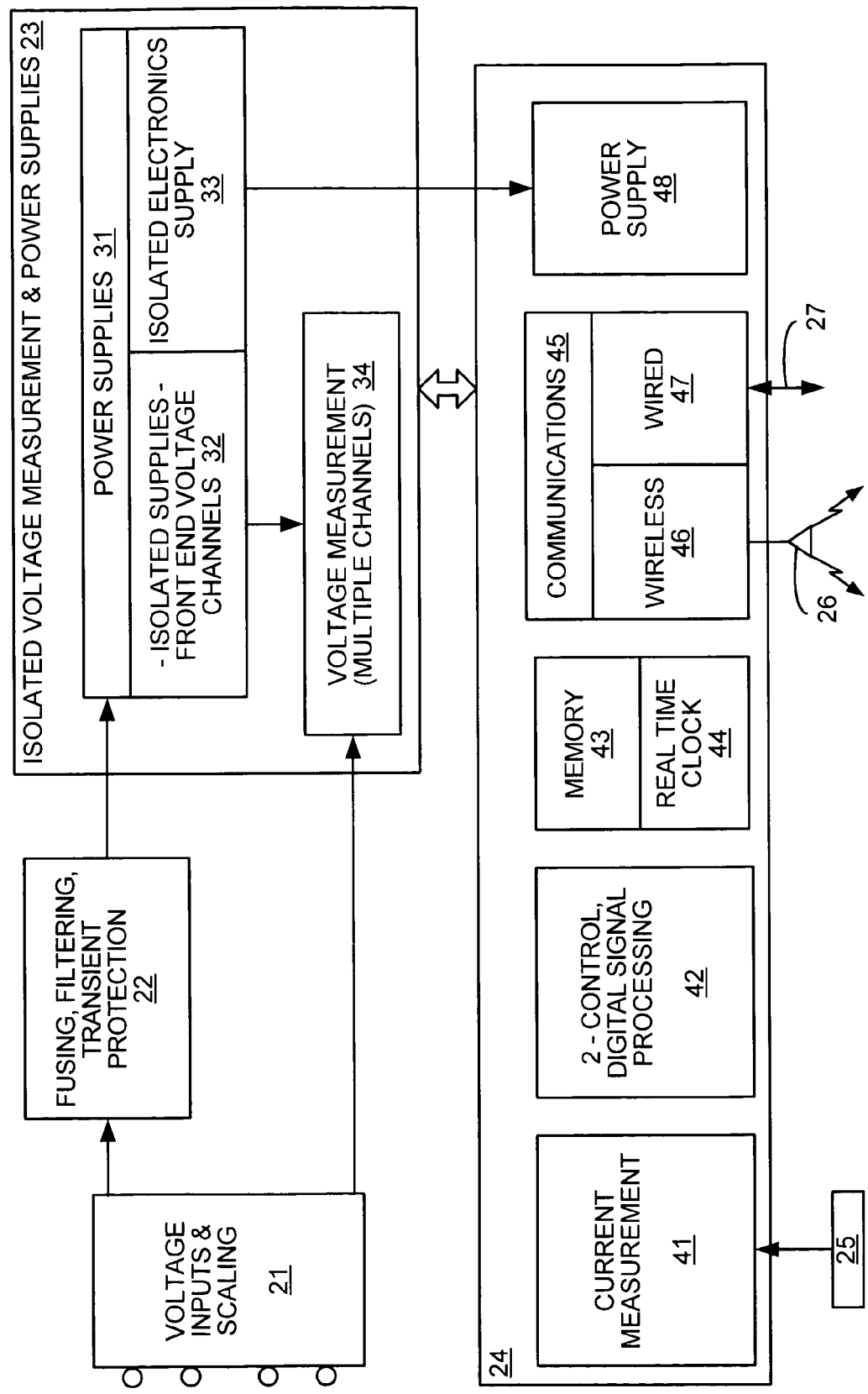
FIG. 2B is a block diagram illustrating an example of functional elements in the remote monitoring device to provide for the remote power monitoring system of the present invention, as shown in FIG. 1.
Figure 2C:
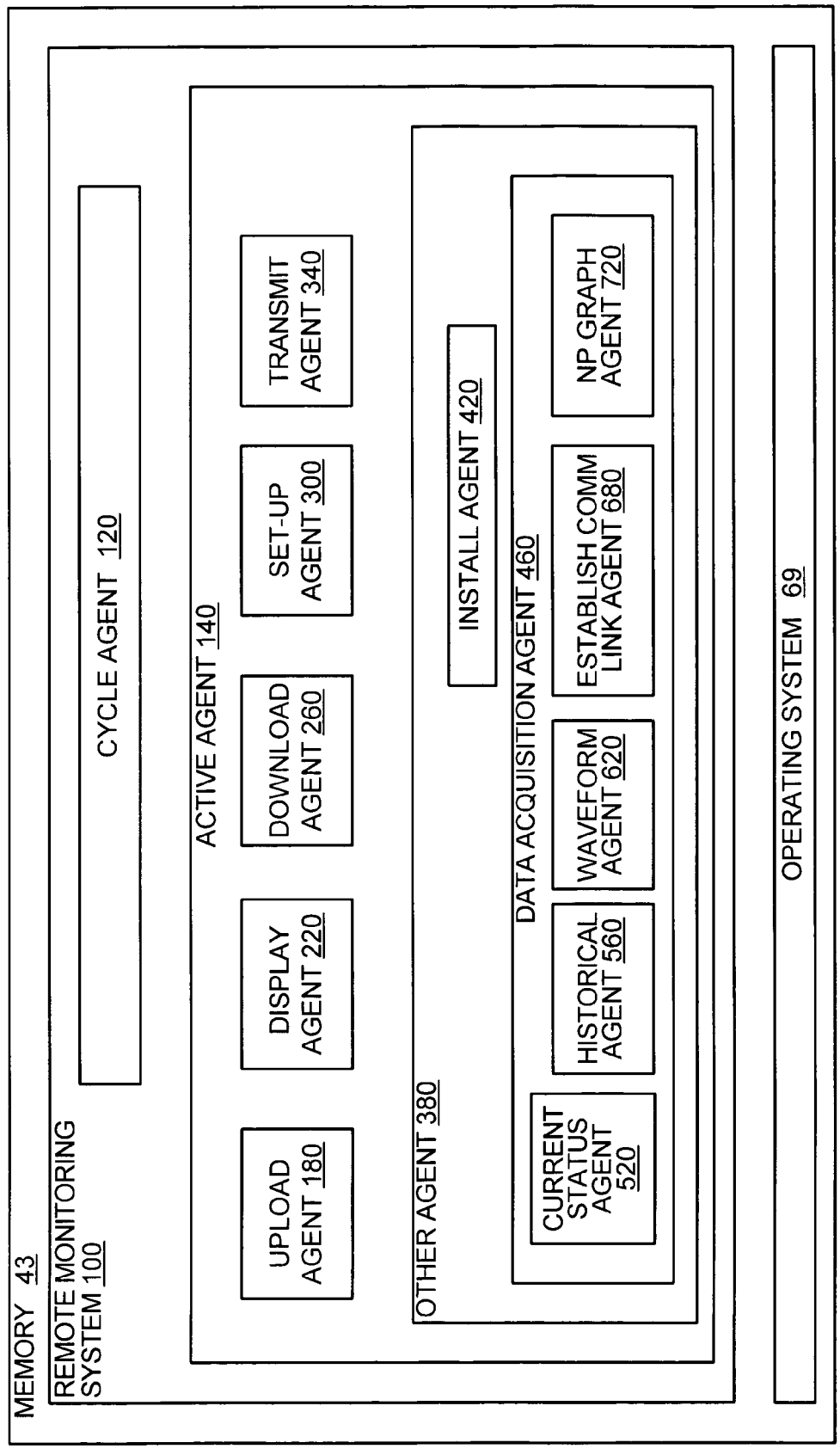
FIG. 2C is a block diagram illustrating an example of the memory for the remote monitoring device using the remote power monitoring system of the present invention, as shown in FIG. 2B.

Illustrated in FIG. 2A is a block diagram demonstrating an example of service device 11–13, as shown in FIG. 1, utilizing the remote power monitoring system 80 of the present invention. Service devices 11 include, but are not limited to, PCs, workstations, laptops, PDAs, palm devices and the like. Illustrated in FIGS. 2B and 2C, is an example demonstrating a remote power monitoring device 20 utilizing remote monitoring system of the present invention. The processing components of the remote power monitoring device 20 are similar to that of the description for the service computer 11–13 (FIG. 2A).

Generally, in terms of hardware architecture, as shown in FIG. 2A, the service computer 11–13 include a processor 61, memory 62, and one or more input and/or output (I/O) devices (or peripherals) that are communicatively coupled via a local interface 63. The local interface 63 can be, for example but not limited to, one or more buses or other wired or wireless connections, as is known in the art. The local interface 63 may have additional elements, which are omitted for simplicity, such as controllers, buffers (caches), drivers, repeaters, and receivers, to enable communications. Further, the local interface 63 may include address, control, and/or data connections to enable appropriate communications among the aforementioned components.

The processor 61 is a hardware device for executing software that can be stored in memory 62. The processor 61 can be virtually any custom made or commercially available processor, a central processing unit (CPU), data signal processor (DSP) or an auxiliary processor among several processors associated with the service computer 16, and a semiconductor based microprocessor (in the form of a microchip) or a macroprocessor. Examples of suitable commercially available microprocessors are as follows: an 80×86 or Pentium series microprocessor from Intel Corporation, U.S.A., a PowerPC microprocessor from IBM, U.S.A., a Sparc microprocessor from Sun Microsystems, Inc, a PA-RISC series microprocessor from Hewlett-Packard Company, U.S.A., or a 68xxx series microprocessor from Motorola Corporation, U.S.A.

The memory 62 can include any one or combination of volatile memory elements (e.g., random access memory (RAM, such as dynamic random access memory (DRAM), static random access memory (SRAM), etc.)) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 62 may incorporate electronic, magnetic, optical, and/or other types of storage media. Note that the memory 62 can have a distributed architecture, where various components are situated remote from one another, but can be accessed by the processor 61.

The software in memory 62 may include one or more separate programs, each of which comprises an ordered listing of executable instructions for implementing logical functions. In the example illustrated in FIG. 2A, the software in the memory 62 includes a suitable operating system (O/S) 69 and the remote power monitoring system 80 of the present invention. As illustrated, the remote monitoring system 80 of the present invention comprises numerous of functional components including but not limited to that upload process 160, display process 200, download process 240, setup process 280, transmit process 320, other process 1200, install process 400, data acquisition process 440, where the data acquisition process 440 includes but is not limited to current status process 500, history process 540, waveform process 600, software authentication process 640, established communication link process 660, and NP graph process 700.

A non-exhaustive list of examples of suitable commercially available operating systems 69 is as follows (a) a Windows operating system available from Microsoft Corporation; (b) a Netware operating system available from Novell, Inc.; (c) a Macintosh operating system available from Apple Computer, Inc.; (e) a UNIX operating system, which is available for purchase from many vendors, such as the Hewlett-Packard Company, Sun Microsystems, Inc., and AT&T Corporation; (d) a LINUX operating system, which is freeware that is readily available on the Internet; (e) a run time Vxworks operating system from WindRiver Systems, Inc.; or (f) an appliance-based operating system, such as that implemented in handheld computers or personal data assistants (PDAs) (e.g., Symbian OS available from Symbian, Inc., PalmOS available from Palm Computing, Inc., and Windows CE available from Microsoft Corporation).

The operating system 69 essentially controls the execution of other computer programs, such as the remote power monitoring system 80, and provides scheduling, input-output control, file and data management, memory management, and communication control and related services. However, it is contemplated by the inventors that the remote power monitoring system 80 of the present invention is applicable on all other commercially available operating systems.

The remote power monitoring system 80 may be a source program, executable program (object code), script, or any other entity comprising a set of instructions to be performed. When a source program, then the program is usually translated via a compiler, assembler, interpreter, or the like, which may or may not be included within the memory 62, so as to operate properly in connection with the O/S 69. Furthermore, the remote power monitoring system 80 can be written as (a) an object oriented programming language, which has classes of data and methods, or programming language, which has routines, subroutines, and/or functions, for example but not limited to, C, C++, Pascal, BASIC, FORTRAN, COBOL, Perl, Java, ADA and the like.

The I/O devices may include input devices, for example but not limited to, a keyboard 65, mouse 64, scanner (not shown), microphone (not shown), etc. Furthermore, the I/O devices may also include output devices, for example but not limited to, a printer (not shown), display 66, etc. Finally, the I/O devices may further include devices that communicate both inputs and outputs, for instance but not limited to, a NIC or modulator/demodulator 67 (for accessing power system devices, other files, devices, systems, or a network), a radio frequency (RF) or other transceiver (not shown), a telephonic interface (not shown), a bridge (not shown), a router (not shown), etc.

If the service computer 11–13 is a PC, workstation, intelligent device or the like, the software in the memory 62 may further include a basic input output system (BIOS) (omitted for simplicity). The BIOS is a set of essential software routines that initialize and test hardware at startup, start the O/S 69, and support the transfer of data among the hardware devices. The BIOS is stored in some type of read-only-memory, such as ROM, PROM, EPROM EEPROM or the like, so that the BIOS can be executed when the service computer 11–13 is activated.

When the computers 11–13 are in operation, the processor 61 is configured to execute software stored within the memory 62, to communicate data to and from the memory 62, and to generally control operations of the service computer 11–13 are pursuant to the software. The remote power monitoring system 80 and the O/S 69 are read, in whole or in part, by the processor 61, perhaps buffered within the processor 61, and then executed.

When the remote power monitoring system 80 is implemented in software, as is shown in FIG. 2A, it should be noted that the remote power monitoring system 80 can be stored on virtually any computer readable medium for use by or in connection with any computer related system or method. In the context of this document, a computer readable medium is an electronic, magnetic, optical, or other physical device or means that can contain or store a computer program for use by or in connection with a computer related system or method. The remote power monitoring system 80 can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium.

More specific examples (a nonexhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM, EEPROM, or Flash memory) (electronic), an optical fiber (optical), and a portable compact disc read-only memory (CDROM) (optical). Note that the computer-readable medium could even be paper or another suitable medium, upon which the program is printed, as the program can be electronically captured, via for instance optical scanning of the paper or other medium, then compiled, interpreted or otherwise processed in a suitable manner if necessary, and then stored in a computer memory.

In an alternative embodiment, where the remote power monitoring system 80 is implemented in hardware, the remote power monitoring system 80 can be implemented with any one or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

Illustrated in FIG. 2B is a block diagram demonstrating an example of functional elements in the remote monitoring device 20 that enables the remote power monitoring system of the present invention, as shown in FIG. 1. The remote monitoring device 20 measures numerous power characteristics of power system device 7 and computes a number of recordable measurements. The characteristics and recordable measurements are then stored in memory for later access by service device 11–13.

The functional elements of the remote monitoring device 20 include the voltage input and scaling circuitry 21, filtering and transient protection circuitry 22.

Voltage input and scaling circuitry 21 samples voltages from a conductor (not shown) as input to filtering and transient protection circuitry 22 and voltage measurement circuitry 34.

In the preferred embodiment, the voltage input and scaling circuitry 21 includes an isolator circuit to eliminate the need for a third optical insulator per channel and pre-regulator circuitry. The isolator circuit and pre-regulator circuitry are illustrated in further detail with regard to FIGS. 10 and 11 respectively.

The remote monitoring device 20 further includes the isolated voltage measurement and power supply circuitry 23. The isolated voltage measurement and power supply circuitry and 23 further includes power supply circuitry 31, front end voltage channels circuitry 32, isolated electronic supply circuitry and 33 and voltage measurement circuitry 34. As shown, there are multiple voltage inputs to voltage input and scaling circuitry 21 and therefore, multiple inputs into voltage measurement circuitry 34. The voltage measurement circuitry 34 further includes isolator circuitry that is herein illustrated in further detail with regard to FIG. 10.

The power supply circuitry 31 includes circuitry to a multi-input and isolated power supply. This multi-input power supply circuitry 31 enables the remote monitoring device 20 to be powered from an input voltage channel, external PCs power supply or a rechargeable internal battery. An example of the multi-source power supply component is herein illustrated in further detail with regard to FIG. 12.

Digital components 20 of the remote monitoring device 20 include power supply circuitry 48, current measurement circuitry 41, digital signal processor (DSP) circuitry 42, memory 43, real-time clock circuitry 44 and communication circuitry 45 that is connected to both wireless circuitry 46 and wired circuitry 47. Power supply circuitry 48 is herein illustrated in greater detail with regard to FIG. 12.

The DSP 42 samples the digital voltage and current waveform data and controls storage of the waveform data in a digital memory 43. From voltage and current waveform data sampled by DSP 42 and stored in memory 43, all standard power quality parameters can be calculated. That is, for example, RMS voltage, current, power, power factor, and harmonics, all can be computed. The DSP 42 is herein illustrated in greater detail with regard to FIG. 15.

Communication circuitry 45, wireless circuitry 46 and wired circuitry 47 are illustrated in greater detail with regard to FIG. 13. Wireless circuitry 46 provides for wireless transmission and therefore preferably has only small power consumption requirements itself. To this end, DSP 42 controls modulation of a RF signal generated by wireless circuitry 46 to transmit any desired digital waveform data from memory 43.

A personal data assistant (PDA) 11, laptop 12 or similar device communicates with wireless circuitry 46 to receive the waveform data transmittal by remote monitoring device 20. PDA 11 and laptop 12 are contemplated as having RF reception and demodulation capabilities in order to provide real-time waveforms and power quality data from the transmitted waveform data in user-readable form. The PDA 11 and laptop 12 generally have sufficient computational capacity to perform all necessary calculations to present the standard power quality parameters, and to display the voltage and current waveforms present in the monitored conduct, and then display this data by way of its display (not shown).

The PDA 11 and laptop 12 can be any kind of device with wireless capability, as will be apparent to those of ordinary skill. Preferred PDA 11 and laptop 12 downloads recorded power quality parameter data and waveform data from the remote monitoring device 20 for later analysis. It is to be noted that a technician holding and operating PDA 11 and laptop 12 will remain isolated away from voltages on the monitored cable (not shown). As such, only initial connection of remote monitoring device 20 need be done in proximity to voltage and current conditions. Thereafter, analysis and review of voltage and current waveform data detected and recorded by the remote monitoring device 20 can be done remotely from the monitored voltage and current cables at the PDA 11 or laptop 12

FIG. 2C is a block diagram illustrating an example of the memory 43 for the remote monitoring device 20 using the remote power monitoring system 100 of the present invention, as shown in FIG. 2B. Located in memory 43 is the remote power monitoring system 100 which includes, but is not limited to, cycle agent 120, active agent 140 and other agent 380. The active agent 140 further includes upload agent 180, display agent 220, downloading agent 260, set-up agent 280 and transmit agent 320. The other agent 380 includes the install agent 420 and data acquisition agent 460, where the data acquisition agent 460 includes but is not limited to current status agent 520, history agent 560, waveform agent 620, established communication link agent 680, and NP graph agent 720.

The agents are herein defined in further detail with regard to FIGS. 3A, 3B, 4B, 5B, 6B, 7B, 8B, 9B, 10B–14B, 16A, 16B, 18B and 19B respectively. When the remote power monitoring system 100 is implemented in software, as is shown in FIG. 2C, it can be stored on virtually any computer readable medium for use by or in connection with any computer related system or method.

In an alternative embodiment, where the remote power monitoring device 20 is implemented in hardware, the remote power monitoring system 100 can be implemented in the same way as described above with regard to the remote power monitoring system 80 (FIG. 2A).

In the illustrated example, of the cycle agent 120 computes characteristics of the converted digital data. The active agent 140 of controls all non-power monitoring management. The upload agent 180 enables the remote monitoring device 20 to upload data to be in service device 11–13. The display agent 220 enables the service device 11 to acquire a real-time data for display. The download agent 260 enables the remote monitoring device 20 to download additional software or software changes. The setup agent 300 enables modification of the system parameters for remote monitoring device 20 by a service representative. The transmit agent 340 provides for the transmission of data capture from power system device 7 and computed by remote monitoring device 20 to service device 11–13. The other agent 380 provides for execution of the install agent of 420 and the data acquisition agent 460. The data acquisition agent 1320 provides in for the operation of the current status agent 520, history agent 560, waveform agent 620, established communication link process 680 and NP graph agent 720.

FIG. 3A is a flow chart illustrating an example of the operation of the remote power monitoring system 100 of the present invention on the remote monitoring device 20, as shown in FIGS. 1, 2B and 2C. The remote power monitoring system 100 controls the remote powering device 20. The remote power of monitoring system 100 enables a service technician to acquire data measurements and computational values for a power system device 7.

First at step 101, the remote power monitoring system 100 is initialized. This initialization includes the startup routines and processes embedded in the BIOS of the remote monitoring device 20. The initialization also includes the establishment of data values for particular data structures utilized in the remote monitoring device 20 and remote power monitoring system 100.

At step 102, the remote power monitoring system 100 takes the sample data measurements from the power system device 7. At step 301, these data measurements are converted to digital data. At step 104, it is determined if the signal being measured is at 10 the end of the cycle. If it is determined at step 104 that the signal being measured is not at the end of the cycle, then the remote monitoring system 100 waits a predetermined amount of time at step 105. After waiting a predetermined amount of time at step 105, the remote monitoring system 100 returns to repeat steps 102 through 104. However, if it is determined to step 104 that the signal being measured is at the end of the cycle, then there the cycle data agent is performed at step 106. Of the cycle data agent is herein in defined in further detail with regard to FIG. 3

At step 107, memory area for storing of the digital data signals acquired at step 103 is reset. This allows the next cycle of data to be captured. At step 111, is determined if the service device activity detected. It is determined at step 111 that a service device activity is not detected, then the remote monitoring system 100 proceeds to step 113 to determine if there are more data samples to be captured.

However, if it is determined at step 111 that a service device activity is detected, then the remote monitoring system 100 performs the activity agent at step 112. The activity agent is herein defined in further detail with regard to FIG. 4B.

At step 113 the remote monitoring system 100 determines if more data samples are to be captured. If it is determined at step 113 that there are more data samples to be captured, then the remote monitoring system 100 returns to repeat steps 102 through 113. However, if it is determined to step 113 that there are no more data samples to be captured, then the remote monitoring system 100 exits at step 119.

Figure 3B:
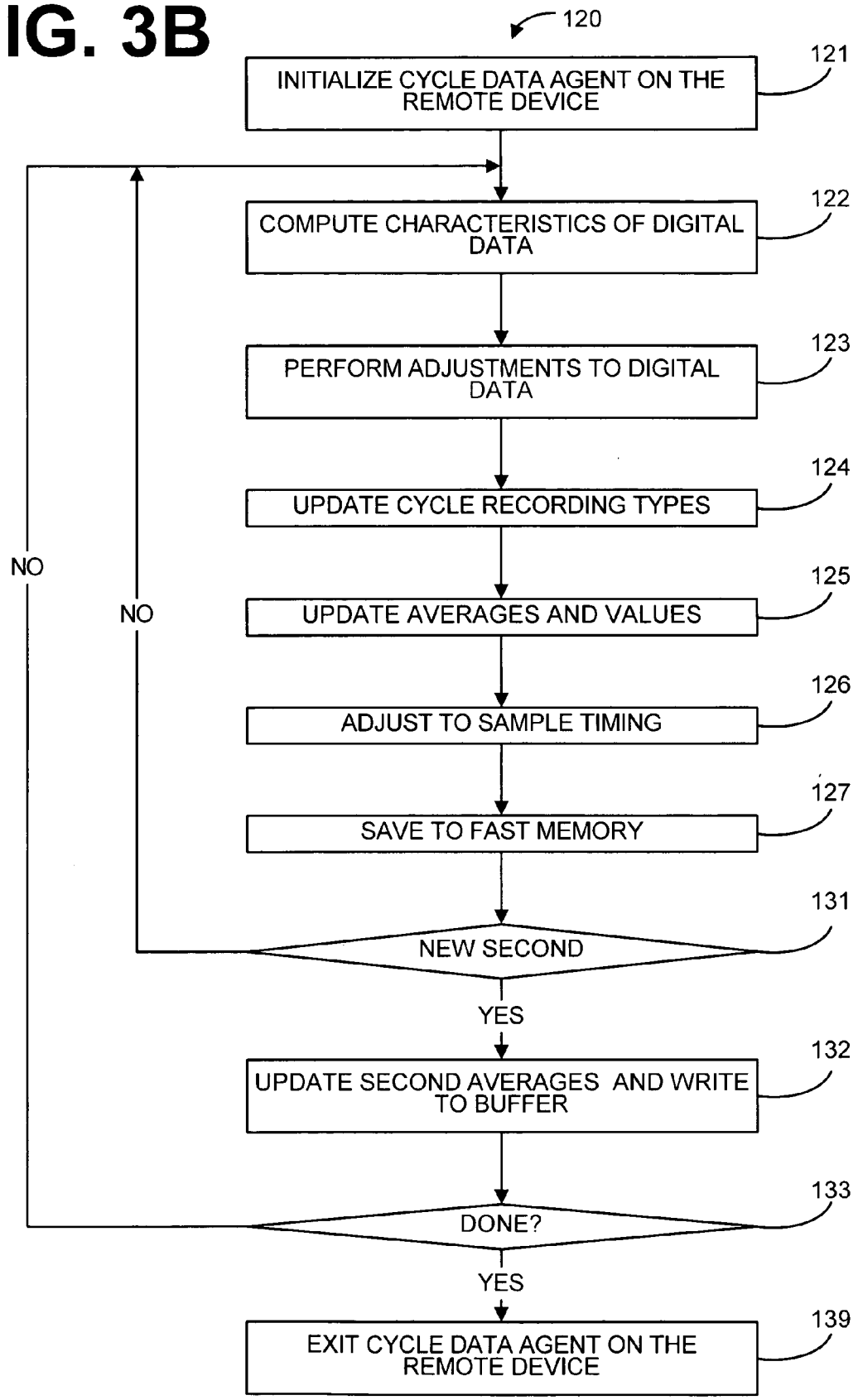
FIG. 3B is a flow chart illustrating an example of the operation of the cycle data agent on the remote monitoring device used in conjunction with the remote power monitoring system of the present invention, as shown in FIGS. 1, 2B, 2C and 3A.

FIG. 3B is a flow chart illustrating an example of the operation of the cycle data agent 120 on the remote monitoring device 20 used in conjunction with the remote power monitoring system 100 of the present invention, as shown in FIGS. 1, 2B, 2C and 3A. The cycle data agent 120 acquires the data measurements from power system device 7 and computes characteristics and of that measured data.

First at step 121, the cycle data agent 120 is initialized. This initialization includes the startup routines and processes embedded in the BIOS of the remote monitoring device 20. The initialization also includes the establishment of data values for particular data structures utilized in the cycle data agent 120. At step 122, characteristics of the digital data are then computed. These characteristics include, but are not limited to, for single and multiple phases (PMS voltage and current, real power, apparent power, harmonics, phase angle, reactive power, power factor, displaced power factor, total harmonic distortion, total power quantities, total real and reactive and apparent power, total power factors, phase angles, the cycle histograms, cycle event changes, flicker, abnormal voltages and power outages).

At step 123, any adjustments necessary to the digital data is performed. Adjustments include gain and offset corrections, as well as frequency-dependent harmonic correction factors. At step 124, the cycle recording types are updated, including RMS voltage and current, real, reactive and apparent power, power factor, displacement power factor, phase angle, harmonic magnitudes and phases, and total harmonic distortion.

At step 125, the averages and values for the signal being measured are updated. At step 126 in the adjustments necessary to the sample timing are made. At step 127, all the computed of cycle data is saved to fast memory. At step 131, it is determined if the cycle is on a new second. If it is determined to step 131 that a cycle for a new second has not occurred, then the cycle data agent 120 returns to repeat steps 122 through 131.

However, if it is determined that a new second is started, then the cycle data agent 120 then updates the second averages and write these values to a buffer at step 132. At step 133, the cycle data agent 120 determines if there are more cycles to be processed. If it is determined at step 133 that there are more cycles to be processed, then the cycle data agent 120 returns to repeat steps 122 through 133. However, if it is determined that there are no more cycles to be processed the cycle data agent 120 then exits at step 139.

Figure 4A:
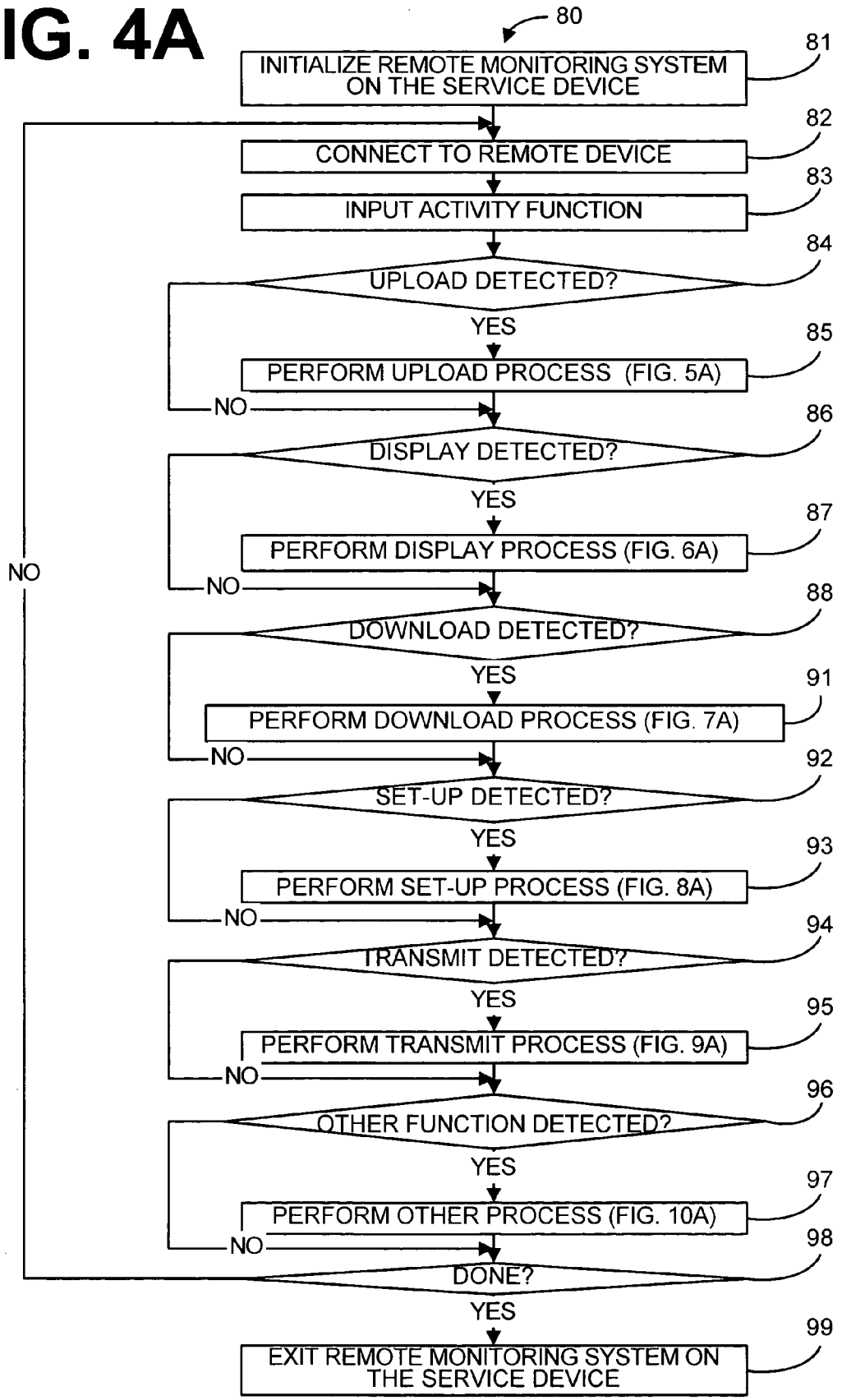
FIG. 4A is a flow chart illustrating an example of the operation of the remote power monitoring system of the present invention on the service device, as shown in FIGS. 1 and 2A.

FIG. 4A is a flow chart illustrating an example of the operation of the remote power monitoring system 80 of the present invention on the service device 11, as shown in FIGS. 1 and 2A. The remote power monitoring system 80 running on service device 11 enables a user access to measured and computed data power from system device 7.

First at step 81, the remote power monitoring system 80 is initialized. This initialization includes the startup routines and processes embedded in the BIOS of the service device 11. The initialization also includes the establishment of data values for particular data structures utilized in the remote power monitoring system 80. At step 82, the service device 11 connects to the remote monitoring device 20. The activity function is then enabled for input by a user at step 83.

At step 84, it is determined if an upload activity is detected. If it determined at step 84 that an upload activity is not detected, then the remote monitoring system 80 proceeds to step 86. However, if it is determined at step 84 that an upload activity is detected, then the remote monitoring system 80 on the service device 11 performs the upload process at step 85. The upload processes herein defined in further detail with regard to FIG. 5A.

At step 86, it is determined if a display activity is detected. If it determined at step 86 that a display activity is not detected, then the remote monitoring system 80 proceeds to step 88. However, if it is determined at step 86 that a display activity is detected, then the remote monitoring system 80 performs the display process at step 87. The display processes herein defined in further detail with regard to FIG. 6A.

At step 88, it is determined if a download activity is detected. If it determined at step 88 that a download activity is not detected, then the remote monitoring system 80 proceeds to step 92. However, if it is determined at step 88 that a download activity is detected, then the remote monitoring system 80 performs the download process at step 91. The download processes herein defined in further detail with regard to FIG. 7A.

At step 92, it is determined if a setup activity is detected. If it determined at step 92 that a setup activity is not detected, then the remote monitoring system 80 proceeds to step 94. However, if it is determined at step 92 that a setup activity is detected, then the remote monitoring system 80 performs the setup process at step 93. The setup processes herein defined in further detail with regard to FIG. 8A.

At step 94, it is determined if a transmit activity is detected. If it determined at step 94 that a transmit activity is not detected, then the remote monitoring system 80 proceeds to step 96. However, if it is determined at step 94 that a transmit activity is detected, then the remote monitoring system 80 performs the transmit process at step 95. The transmit processes herein defined in further detail with regard to FIG. 9A.

At step 96, it is determined if another activity is detected. If it determined at step 96 that another activity is not detected, then the remote monitoring system 80 proceeds to step 98. However, if it is determined at step 96 that another activity is detected, then the remote monitoring system 80 performs the other process at step 97. The other process herein defined in further detail with regard to FIG. 17A.

At step 98, it is determined if there are more activities to be processed. If it is determined that there are more activities to be processed, the remote monitoring system 80 returns to repeat steps 82 through 98. However, if it is determined at step 98 that there are no more activities to be processed, then the remote monitoring system 80 exits at step 99.

Figure 4B:
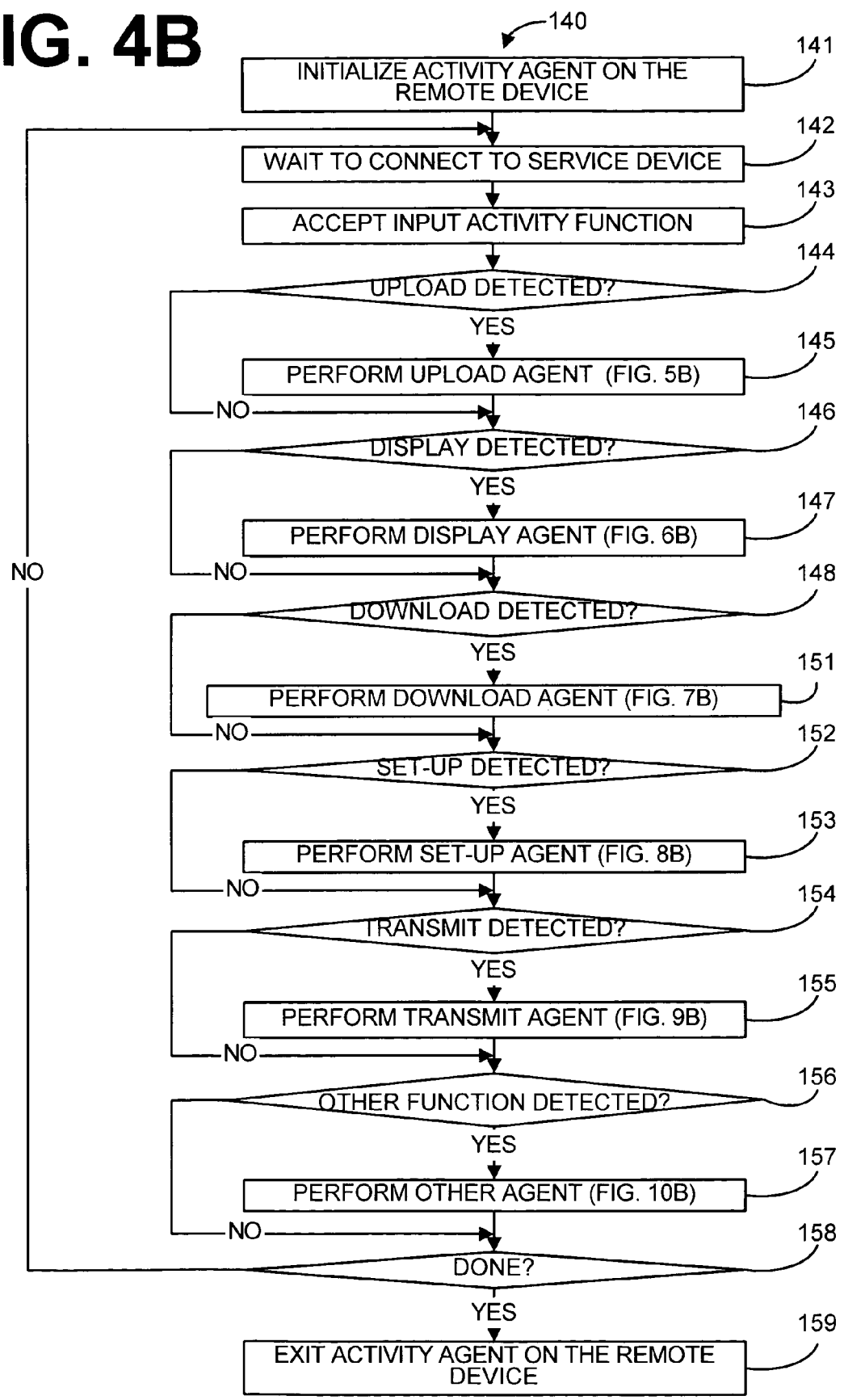
FIG. 4B is a flow chart illustrating an example of the operation of the activity agent on the remote monitoring device used in conjunction with the remote power monitoring system of the present invention, as shown in FIGS. 2B, 2C, 3A, 3B, and 4A.

FIG. 4B is a flow chart illustrating an example of the operation of the activity agent 140 on the remote monitoring device 20 used in conjunction with the remote power monitoring system 100 of the present invention, as shown in FIGS. 2B, 2C, 3A, 3B, and 4A. The activity agent 140 processes all interaction with the service device 11.

First at step 141, the activity agent 140 is initialized. This initialization includes the startup routines and processes embedded in the BIOS of the remote monitoring device 20. The initialization also includes the establishment of data values for particular data structures utilized in the activity agent 140. At step 142, the activity agent 140 waits for requests to connect to service device 11. After receiving a request to connect to service device 11, the activity agent 140 then accepts the activity function input from the user on service device 11.

At step 144, the activity agent 140 determines if an upload request is detected. If it determined at step 144 that an upload request is not detected, then the activity agent 140 proceeds to step 146. However, if it is determined at step 144 that an upload request is detected, then the activity agent 140 on the service device 11 performs the upload agent at step 85. The upload agent herein defined in further detail with regard to FIG. 5B.

At step 146, it is determined if a display request is detected. If it determined at step 146 that a display request is not detected, then the activity agent 140 proceeds to step 148. However, if it is determined at step 146 that a display request is detected, then the activity agent 140 performs the display agent at step 147. The display agent herein defined in further detail with regard to FIG. 6B.

At step 148, it is determined if a download request is detected. If it determined at step 148 that a download request is not detected, then the activity agent 140 proceeds to step 152. However, if it is determined at step 148 that a download request is detected, then the activity agent 140 performs the download agent at step 151. The download agent herein defined in further detail with regard to FIG. 7B.

At step 152, it is determined if a setup request is detected. If it determined at step 152 that a setup request is not detected, then the activity agent 140 proceeds to step 154. However, if it is determined at step 152 that a setup request is detected, then the activity agent 140 performs the setup splay agent at step 153. The setup agent herein defined in further detail with regard to FIG. 8A.

At step 154, it is determined if a transmit request is detected. If it determined at step 154 that a transmit request is not detected, then the activity agent 140 proceeds to step 156. However, if it is determined at step 154 that a transmit request is detected, then the activity agent 140 performs the transmit agent at step 155. The transmit agent herein defined in further detail with regard to FIG. 9B.

At step 156, it is determined if another function request is detected. If it determined at step 156 that another function request is not detected, then the activity agent 140 proceeds to step 158. However, if it is determined at step 156 that another function request is detected, then the activity agent 140 performs the other agent at step 157. The transmit agent herein defined in further detail with regard to FIG. 17A.

At step 158, it is determined if there are more activities to be processed. If it is determined that there are more activities to be processed, the activity agent 140 returns to repeat steps 82 through 157. However, if it is determined at step 157 that there are no more activities to be processed, then the activity agent 140 exits at step 159.

FIG. 5A is a flow chart illustrating an example of the operation of the upload process 160 utilized by the remote monitoring system 80 of the present invention, as shown in FIGS. 2A, 3A and 4A. The upload process 160 enables the remote monitoring device 20 to upload data to the service device 11–13.

First at step 161, the upload process 160 is initialized. This initialization includes the startup routines and processes embedded in the BIOS of the service device 11. The initialization also includes the establishment of data values for particular data structures utilized in the upload process 160.

At step 162, the upload process 160 attempts to connect to the remote monitoring device 20. At step 163, it is determined if the upload process 160 has successfully connected to the remote monitoring device 20. If it is determined at step 163 that a connection to the remote monitoring device 20 has not been successfully completed, then the service device 11 returns to repeat steps 162 and 163 provided that the maximum number of attempts has not been exceeded. However, if the maximum number of attempts has been exceeded, then the upload process 160 exits at step 169.

However, if it is determined at step 163 that a connection to the remote monitoring device 20 has been completed, then the upload process 160 enables a service representative to indicate the data items to be uploaded from the remote device at step 164. At step 165, the data items indicated are uploaded from the remote monitoring device 20. At step 166, it is determined if there are more data items to be uploaded. If it is determined that there are more data items to be uploaded, then the upload process 160 returns to repeat steps 164 through 166.

However, if it is determined at step 166 it there are no more data items to be uploaded, the upload process 160 then proceeds to step 167.

At step 167, it is determined if there is a remote device connected to the currently connected remote monitoring device 20, and if the user wants to upload data through the currently connected remote monitoring device 20 to another remote monitoring device 20. If it is determined at step 167 that there is another remote monitoring device 20 connected to the currently connected remote monitoring device 20, and that the user wants to upload data through the currently connected remote monitoring device 20, the other remote monitoring device 20 is then identified at step 168. The upload process 160 returns to repeat steps 161 through 168 for the other remote monitoring device 20. These actions will cause the currently connected remote monitoring device 20 to be utilized as a conduit to another remote monitoring device 20.

However, if it is determined at step 167 that either another remote monitoring device 20 is not an available through the currently connected remote monitoring device 20 or that the user does not wish to access another remote monitoring device 20, then the upload process 160 exits at step 169.

Figure 5B:
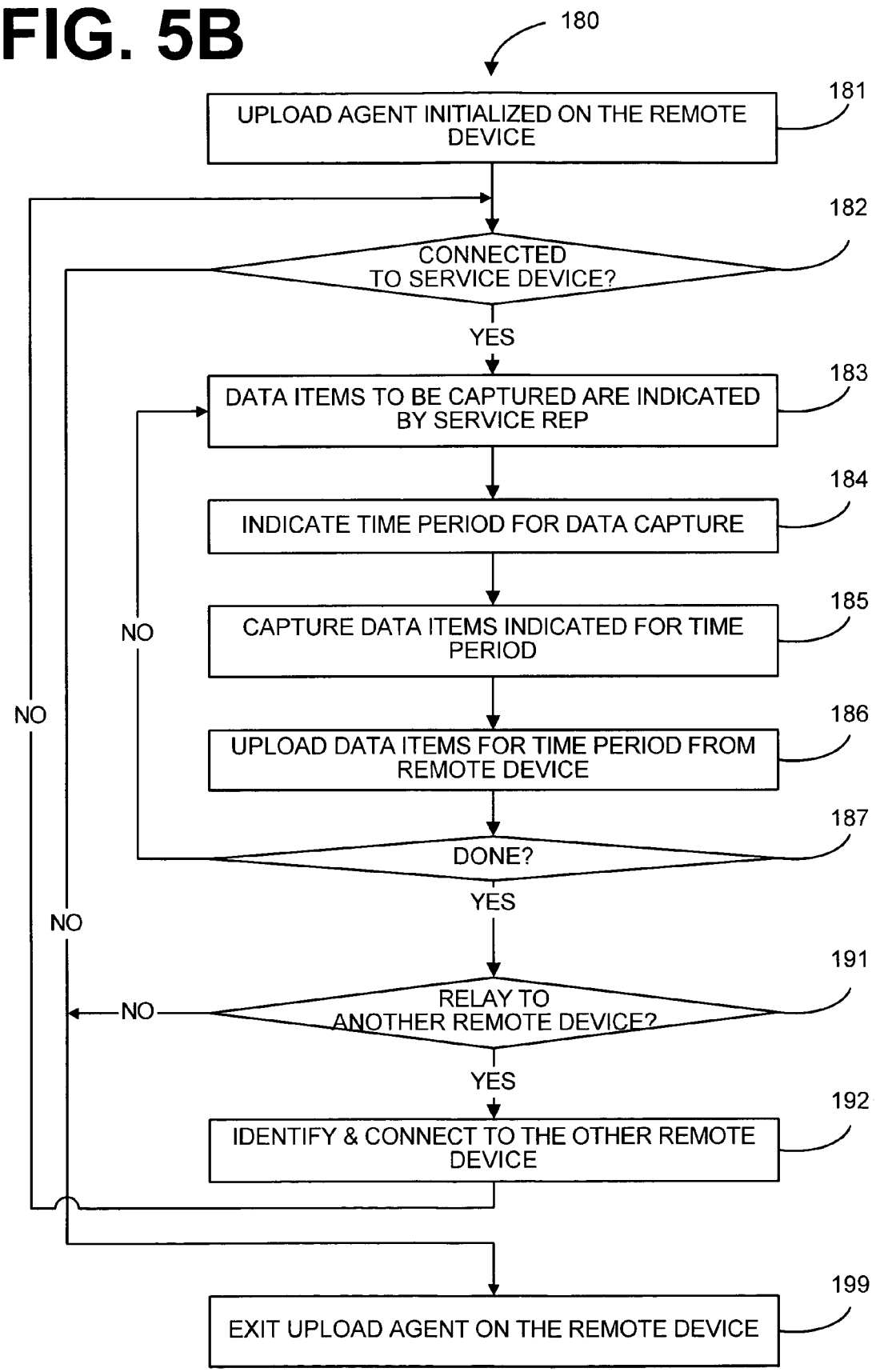
FIG. 5B is a flow chart illustrating an example of the operation of the upload agent utilized in the remote monitoring device and utilized by the remote power monitoring system of the present invention, as shown in FIGS. 2B, 3B, 3C and 4B.

FIG. 5B is a flow chart illustrating an example of the operation of the upload agent 180 utilized in the remote monitoring device 20 and utilized by the remote monitoring system 100 of the present invention, as shown in FIGS. 2B, 3B, 3C and 4B. The upload agent 180 enables the remote monitoring device 20 to upload data to be in service device 11–13.

First at step 181, the upload agent 180 is initialized. This initialization includes the startup routines and processes embedded in the BIOS of the remote monitoring device 20. The initialization also includes the establishment of data values for particular data structures utilized in the upload agent 180. At step 182, the upload agent 180 determines if the remote monitoring device 20 is connected to a service device 11. If it is determined at step 182 that the remote monitoring device 20 is not connected to service device 11, then the upload agent 180 exits at step 199.

However, if it is determined at step 182 that the remote monitoring device 20 is connected to the service device 11, then the upload agent 180 allows the service representative to indicate the data items to be captured. At step 184, the time period for data capture is indicated by the service representative. At step 185, the upload agent 180 then captures the data items indicated for the indicated time period. The data items captured for the indicated time period are then uploaded from the remote monitoring device 20 to the service device 11 at step 186.

At step 187, the upload agent 180 determines if there are more data items to be captured. If it is determined at step 187 that there are more data items to be captured, the upload agent 180 then returns to repeat steps 183 through 187. However, if it is determined at step 187 that there are no additional data items to be captured, then the upload agent 180 proceeds to step 191.

At step 191, it is determined if there is a remote monitoring device 20 connected to the currently connected remote monitoring device 20. The upload agent 180 indicates the remote monitoring devices 20 that are connected to the currently connected remote monitoring device 20. The upload agent 180 then determines if the user wants to upload data through the currently connected remote monitoring device 20 to another remote monitoring device 20 by the user input identifying the other remote device to be connected.

If it is determined at step 191 that the user wants to upload data through the currently connected remote monitoring device 20, the other remote monitoring device 20 is then identified at step 192. The upload process 160 returns to repeat steps 182 through 191 for the other remote monitoring device 20. These actions will cause the currently connected remote monitoring device 20 to be utilized as a conduit to another remote monitoring device 20.

However, if it is determined at step 191 that either another remote monitoring device 20 is not a available through the currently connected to remote monitoring device 20 or that the user does not wish to access another remote monitoring device 20, then the upload process 160 exits at step 199.

FIG. 6A is a flow chart illustrating an example of the operation of the display process 200 on service device 11 and utilized by the remote monitoring system 80 of the present invention, as shown in FIGS. 2A, 3A and 4A. The display process 200 enables the service device 11 to acquire a real-time data from the remote monitoring device 20 for display.

First at step 201, the display process 200 is initialized. This initialization includes the startup routines and processes embedded in the BIOS of the service device 11. The initialization also includes the establishment of data values for particular data structures utilized in the display process 200.

At step 202, the display process 200 attempts to connect to the remote monitoring device 20. At step 203, it is determined if the display process 200 has successfully connected to the remote monitoring device 20. If it is determined at step 203 that a connection to the remote monitoring device 20 has not been successfully completed, then the service device 11 returns to repeat steps 202 and 203, provided that the maximum number of attempts has not been exceeded. However, if the maximum number of attempts has been exceeded, then the display process 200 exits at step 209.

However, if it is determined at step 203 that a connection to the remote monitoring device 20 has been completed, then the display process 200 enables a service representative to indicate the data items to be captured on the remote device for display at step 204. At step 205, the data items indicated are displayed from the remote monitoring device 20. At step 206, it is determined if there are more data items to be displayed. If it is determined that there are more data items to be displayed, then the display process 200 returns to repeat steps 204 through 206. However, if it is determined at step 206 that there are no more data items to be displayed, the display process 200 then proceeds to step 207.

At step 207, it is determined if there are any remote monitoring devices 20 connected to the currently connected remote monitoring device 20, and if the user wants to display data through the currently connected remote monitoring device 20 from another remote monitoring device 20. If it is determined at step 207 that there is another remote monitoring device 20 connected to the currently connected remote monitoring device 20, and that the user wants to display data through the currently connected remote monitoring device 20, then the other remote monitoring device 20 is identified at step 208. The display process 200 returns to repeat steps 200 through 207 for the other remote monitoring device 20. These actions will cause the currently connected remote monitoring device 20 to be utilized as a conduit to another remote monitoring device 20.

However, if it is determined that step 207 that either another remote monitoring device 20 is not a available through the currently connected remote monitoring device 20 or that the user does not wish to access and another remote monitoring device 20, then the display process 200 exits at step 209.

FIG. 6B is a flow chart illustrating an example of the operation of display agent 220 utilized in the remote monitoring device 20 and utilized by the remote monitoring system 100 of the present invention, as shown in FIGS. 2B, 3B, 3C and 4B. The display agent 220 enables the service device 11 to acquire a real-time data for display.

First at step 221, the display agent 220 is initialized. This initialization includes the startup routines and processes embedded in the BIOS of the remote monitoring device 20. The initialization also includes the establishment of data values for particular data structures utilized in the display agent 220. At step 222, the display agent 220 determines if the remote monitoring device 20 is connected to a service device 11. If it is determined at step 222 that the remote monitoring device 20 is not connected to service device 11, then the display agent 220 exits at step 239.

However, if it is determined at step 222 that the remote monitoring device 20 is connected to the service device 11, then the display agent 220 allows the service representative to indicate the data items to be captured. At step 224, the time period for data capture is indicated by the service representative. At step 225, the display agent 220 then captures the data items indicated for the indicated time period. The data items captured for the indicated time period are then uploaded from the remote monitoring device 20 to the service device 11 at step 226.

At step 227, the display agent 220 determines if there are more data items to be captured. If it is determined at step 227 that there are more data items to be captured, the display agent 220 then returns to repeat steps 223 through 227. However, if it is determined at step 227 that there are no additional data items to be captured, then the display agent 220 proceeds to step 231.

At step 231, it is determined if there is a remote monitoring device 20 connected to the currently connected remote monitoring device 20. The display agent 220 indicates the remote monitoring devices 20 that are connected to the currently connected remote monitoring device 20. The display agent 220 then determines if the user wants to display data through the currently connected remote monitoring device 20 to another remote monitoring device 20 by the user input identifying the other remote device to be connected. If it is determined at step 231 that the user wants to display data through the currently connected remote monitoring device 20, the other remote monitoring device 20 is then identified at step 232. The display process 160 returns to repeat steps 222 through 231 for the other remote monitoring device 20. These actions will cause the currently connected remote monitoring device 20 to be utilized as a conduit to another remote monitoring device 20.

However, if it is determined at step 231 that either another remote monitoring device 20 is not a available through the currently connected to remote monitoring device 20 or that the user does not wish to access another remote monitoring device 20, then the display process 160 exits at step 239.

Figure 7A:
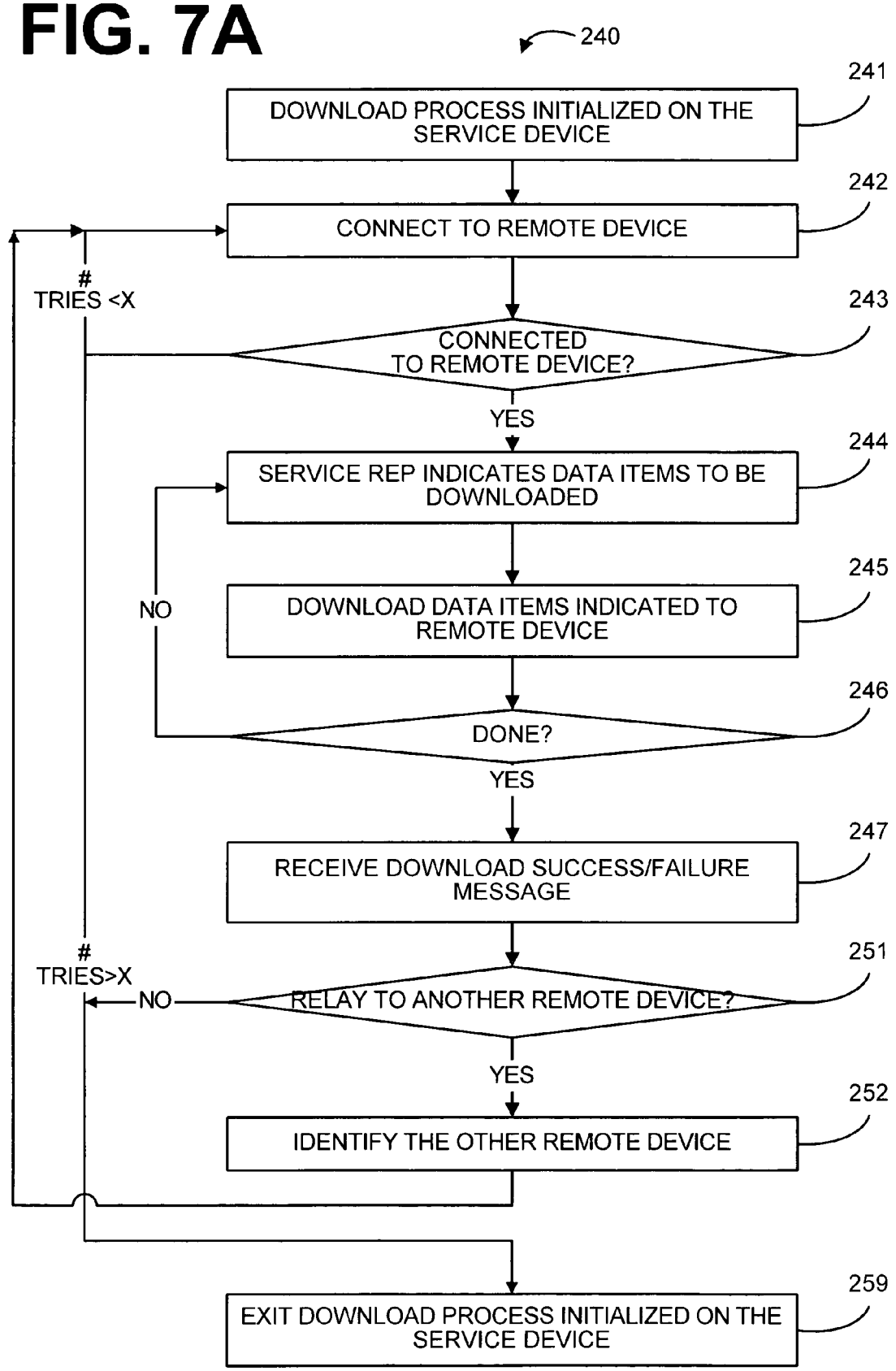
FIG. 7A is a flow chart illustrating an example of the operation of the download process utilized by the remote power monitoring system of the present invention, as shown in FIGS. 2A, 3A and 4A.

FIG. 7A is a flow chart illustrating an example of the operation of the download process 240 on service device 11 and utilized by the remote monitoring system 80 of the present invention, as shown in FIGS. 2A, 3A and 4A. The download agent 260 enables the service device 11 to download additional software or software changes to the remote monitoring device 20.

First at step 241, the download process 240 is initialized. This initialization includes the startup routines and processes embedded in the BIOS of the service device 11. The initialization also includes the establishment of data values for particular data structures utilized in the download process 240.

At step 242, the download process 240 attempts to connect to the remote monitoring device 20. At step 243, it is determined if the download process 240 has successfully connected to the remote monitoring device 20. If it is determined at step 243 that a connection to the remote monitoring device 20 has not been successfully completed, then the service device 11 returns to repeat steps 242 and 243, provided that the maximum number of attempts has not been exceeded. However, if the maximum number of attempts has been exceeded, then the download process 240 exits at step 259.

However, if it is determined at step 243 that a connection to the remote monitoring device 20 has completed, then the download process 240 then enables a service representative to indicate the data items to be downloaded to the remote device at step 244. At step 245, the data items indicated are downloaded to the remote monitoring device 20. At step 246, it is determined if there are more data items to be downloaded. If it is determined that there are more data items to be downloaded, then the download process 240 returns to repeat steps 244 through 246. However, if it is determined at step 246 that there are no more data items to be downloaded, the download process 240 then proceeds to step 247.

At step 247, it is determined if there is a remote device connected to the currently connected remote monitoring device 20, and if the user wants to download data through the currently connected remote monitoring device 20 to another remote monitoring device 20. If it is determined at step 251 at there is another remote monitoring device 20 connected to the currently connected remote monitoring device 20, and that the user wants to download data through the currently connected remote monitoring device 20, then the other remote monitoring device 20 is identified at step 252. The download process 240 returns to repeat steps 241 through 251 for the other remote monitoring device 20. These actions will cause the currently connected remote monitoring device 20 to be utilized as a conduit to another remote monitoring device 20.

However, if it is determined at step 251 that either another remote monitoring device 20 is not a available through the currently connected to remote monitoring device 20 or that the user does not wish to access and another remote monitoring device 20, then the download process 240 exits at step 259.

Figure 7B:
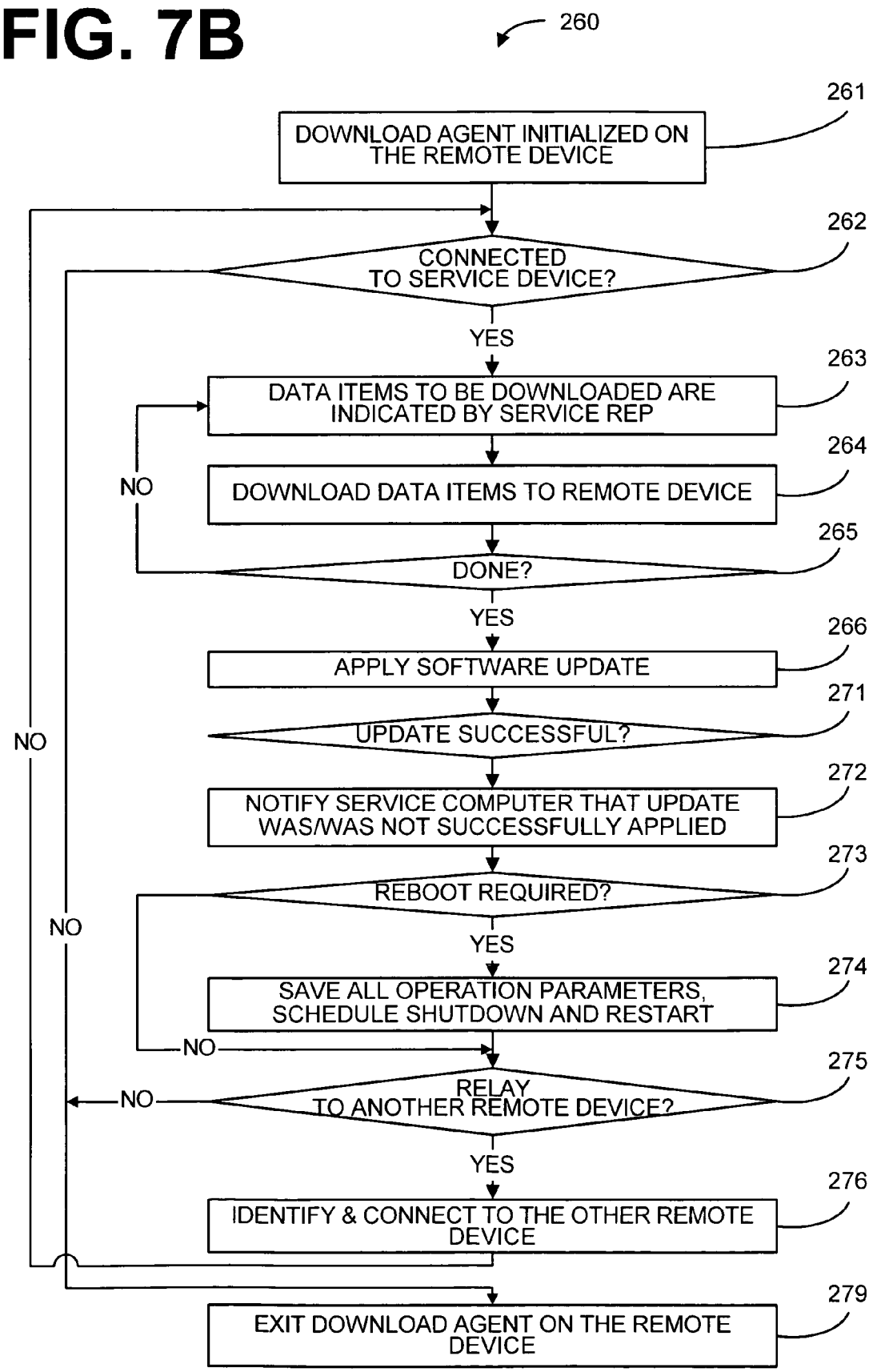
FIG. 7B is a flow chart illustrating an example of the operation of the download agent utilized in the remote monitoring device and utilized by the remote power monitoring system of the present invention, as shown in FIGS. 2B, 3B, 3C and 4B.

FIG. 7B is a flow chart illustrating an example of the operation of the download agent 260 utilized in the remote monitoring device 20 and utilized by the remote monitoring system 100 of the present invention, as shown in FIGS. 2B, 3B, 3C and 4B. The download agent 260 enables the remote monitoring device 20 to download additional software or software changes.

First at step 261, the download agent 260 is initialized. This initialization includes the startup routines and processes embedded in the BIOS of the remote monitoring device 20. The initialization also includes the establishment of data values for particular data structures utilized in the download agent 260. At step 262, the download agent 260 determines if the remote monitoring device 20 is connected to a service device 11. If it is determined at step 262 that the remote monitoring device 20 is not connected to service device 11, then the download agent 260 exits at step 279.

However, if it is determined at step 262 that the remote monitoring device 20 is connected to the service device 11, then the download agent 260 allows the service representative to indicate the data items to be downloaded. At step 264, the download agent 260 then downloads the data from the service device 11.

At step 265, the download agent 260 determines if there are more data items to be downloaded. If it is determined at step 265 that there are more data to be downloaded, the download agent 260 then returns to repeat steps 263 through 265. However, if it is determined at step 265 that there is no additional data to be downloaded, then the download agent 260 applies the software update downloaded at step 266. At step 271, download agent 260 then determines if the software update was successfully applied. At step 272, the download agent 260 sends a notification to the service device 11 indicating whether or not the software update received was successfully applied. At step 273, the download agent 260 determines if a reboot is required because of the software update. If it is determined at step 273 that a reboot is not required, then the download agent 260 proceeds to step 275. However, if it is determined at step 273 that a reboot is required, then the download agent 260 saves all operation parameters, schedules the shutdown and restart of the remote monitoring device 20.

At step 271, it is determined if there is a remote monitoring device 20 connected to the currently connected remote monitoring device 20. The download agent 260 indicates the remote monitoring devices 20 that are connected to the currently connected remote monitoring device 20. The download agent 260 then determines if the user wants to download data through the currently connected remote monitoring device 20 to another remote monitoring device 20 by the user input identifying the other remote device to be connected to. If it is determined at step 275 that the user wants to download data through the currently connected remote monitoring device 20, the other remote monitoring device 20 is then identified at step 27. The download agent 260 returns to repeat steps 262 through 275 for the other remote monitoring device 20. These actions will cause the currently connected remote monitoring device 20 to be utilized as a conduit to another remote monitoring device 20.

However, if it is determined at step 275 that either another remote monitoring device 20 is not a available through the currently connected to remote monitoring device 20 or that the user does not wish to access another remote monitoring device 20, then the download agent 260 exits at step 279.

Figure 8A:
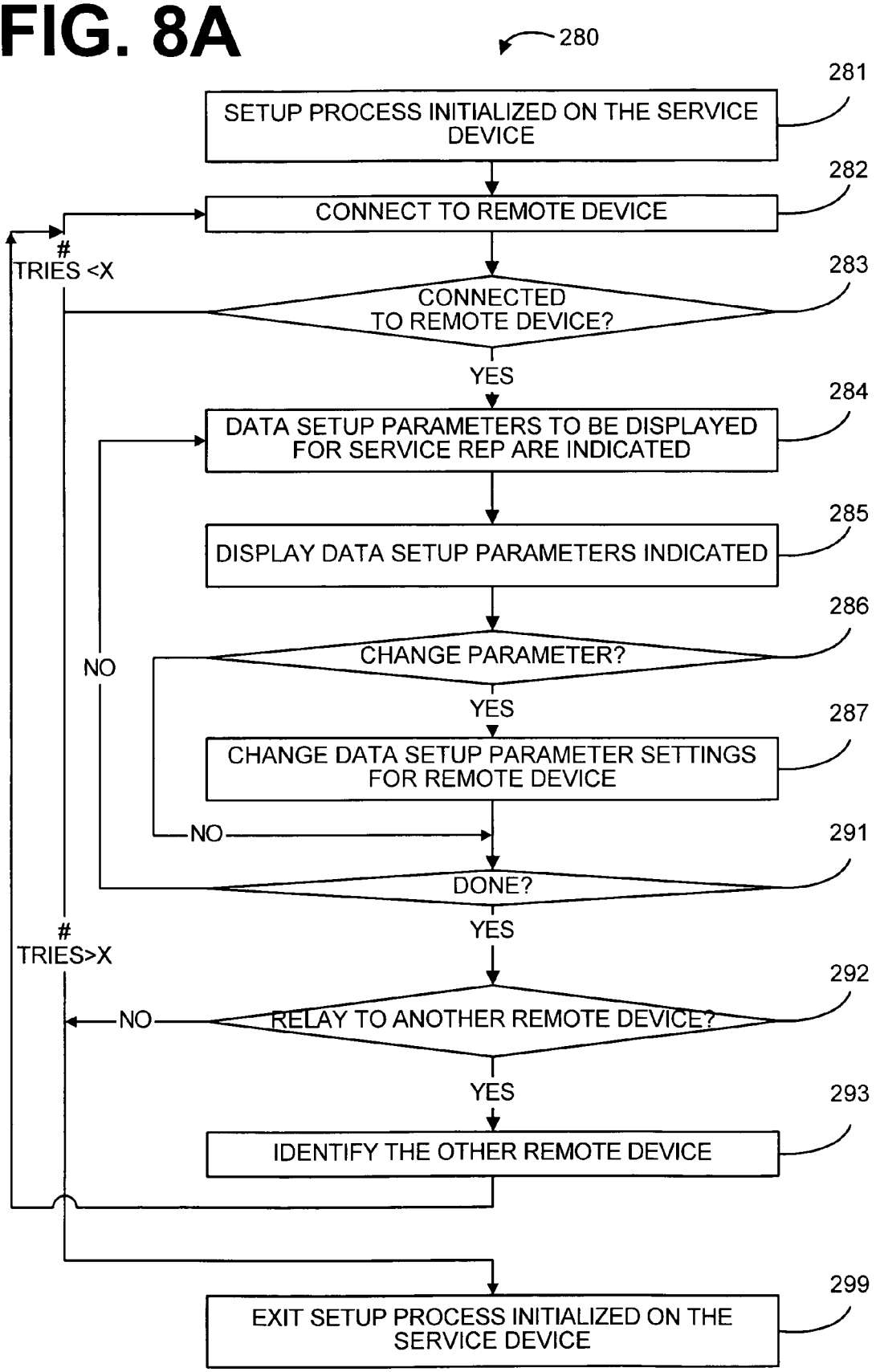
FIG. 8A is a flow chart illustrating an example of the operation of the set-up process utilized by the remote power monitoring system of the present invention, as shown in FIGS. 2A, 3A and 4A.

FIG. 8A is a flow chart illustrating an example of the operation of the setup process 280 on service device 11 and utilized by the remote monitoring system 80 of the present invention, as shown in FIGS. 2A, 3A and 4A. The setup process 280 enables modification of the system parameters for remote monitoring device 20 by a service representative.

First at step 281, the setup process 280 is initialized. This initialization includes the startup routines and processes embedded in the BIOS of the service device 11. The initialization also includes the establishment of data values for particular data structures utilized in the setup process 280.

At step 282, the setup process 280 attempts to connect to the remote monitoring device 20. At step 283, it is determined if the setup process 280 has successfully connected to the remote monitoring device 20. If it is determined at step 283 that a connection to the remote monitoring device 20 has not been successfully completed, then the service device 11 returns to repeat steps 282 and 283, provided that the maximum number of attempts has not been exceeded. However, if the maximum number of attempts has been exceeded, then the setup process 280 exits at step 299.

However, if it is determined at step 283 that a connection to the remote monitoring device 20 has completed, then the setup process 280 then enables a service representative to indicate the data items to be displayed from the remote monitoring device 20 at step 284. At step 285, the data items indicated are displayed from the remote monitoring device 20. At step 286, it is determined if parameters are to be changed. If it is determined at step 286 that parameters are not to be changed, the setup process 280 proceeds to step 291. However, if it is determined at step 286 that a change in parameters is to occur, then the setup process 280 changes the data setup parameter settings in the remote monitoring device 20 at step 287. At step 291, the setup process 280 determines if there are more setup parameters to be changed. If it is determined that there are more parameters to be changed, then the setup process 280 returns to repeat steps 284 through 291. However, if it is determined at step 291 that there are no more data items to be changed, the setup process 280 then proceeds to step 292.

At step 292, it is determined if there is a remote device connected to the currently connected remote monitoring device 20, and if the user wants to setup data through the currently connected remote monitoring device 20 to another remote monitoring device 20. If it is determined at step 292 that there is another remote monitoring device 20 connected to the currently connected remote monitoring device 20, and that the user wants to setup data through the currently connected remote monitoring device 20, then the other remote monitoring device 20 is identified at step 293. The setup process 280 returns to repeat steps 282 through 292 for the other remote monitoring device 20. These actions will cause the currently connected remote monitoring device 20 to be utilized as a conduit to another remote monitoring device 20.

However, if it is determined at step 292 that either another remote monitoring device 20 is not a available through the currently connected to remote monitoring device 20 or that the user does not wish to access another remote monitoring device 20, then the setup process 280 exits at step 299.

Figure 8B:
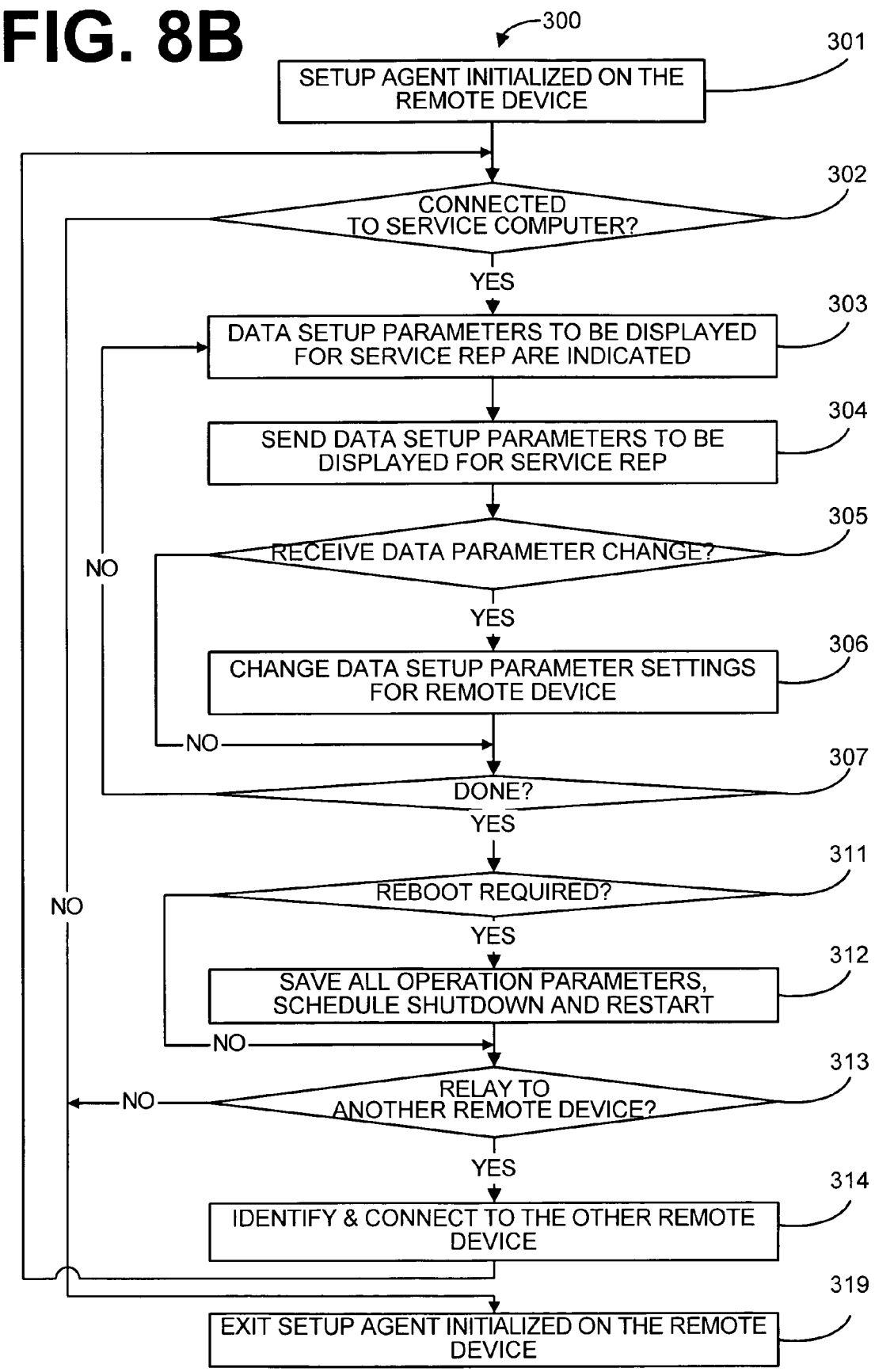
FIG. 8B is a flow chart illustrating an example of the operation of the set-up agent utilized in the remote monitoring device and utilized by the remote power monitoring system of the present invention, as shown in FIGS. 2B, 3B, 3C and 4B.

FIG. 8B is a flow chart illustrating an example of the operation of the setup agent 300 utilized in the remote monitoring device 20 and utilized by the remote monitoring system 100 of the present invention, as shown in FIGS. 2B, 3B, 3C and 4B. The setup agent 300 enables modification of the system parameters in the remote monitoring device 20 by a service representative.

First at step 301, the setup agent 300 is initialized. This initialization includes the startup routines and processes embedded in the BIOS of the remote monitoring device 20. The initialization also includes the establishment of data values for particular data structures utilized in the setup agent 300. At step 302, the setup agent 300 determines if the remote monitoring device 20 is connected to a service device 11. If it is determined at step 302 that the remote monitoring device 20 is not connected to service device 1, then the setup agent 300 exits at step 199.

However, if it is determined at step 302 that the remote monitoring device 20 is connected to the service device 11, then the setup agent 300 allows the service representative to indicate the system parameters to be displayed. At step 304, the setup agent 300 sends the system parameter indicated to the service device 11 at step 304.

At step 305, the setup agent 300 determines if it has received a data parameter change from the service representative on service device 11. If it is determined at step 305 that no data parameter change request is received, then the setup agent 300 proceeds to step 307. However, if it is determined at step 305 that a data parameter change request was received, then the setup agent 300 changes the data setup parameter setting for the remote monitoring device 20 as indicated in the request received.

At step 307, the setup agent 300 determines if there are more parameter change requests. If it is determined at step 307 that there are no parameter change requests, then the setup agent 300 proceeds to step 311. However, if it is determined at step 307 that there are more parameter change requests, the setup agent 300 then returns to repeat steps 303 through 307.

At step 311, the setup agent 300 determines if a system reboot is required do due to a data parameter change. If it is determined at step 311 that no system reboot is required, then the setup agent 300 proceeds to step 313. However, if it is determined at step 311 that a system reboot is required, the setup agent 300 saves all operational parameters and then schedules a system shut down/restart at step 312.

At step 313, it is determined if there is a remote monitoring device 20 connected to the currently connected remote monitoring device 20. The setup agent 300 indicates the remote monitoring devices 20 that are connected to the currently connected remote monitoring device 20. The setup agent 300 then determines if the user wants to setup data through the currently connected remote monitoring device 20 to another remote monitoring device 20 by the user input identifying the other remote device to be connected to. If it is determined at step 313 that the user wants to setup data through the currently connected remote monitoring device 20, the other remote monitoring device 20 is then identified at step 314. The setup process 160 returns to repeat steps 302 through 313 for the other remote monitoring device 20. These actions will cause the currently connected remote monitoring device 20 to be utilized as a conduit to another remote monitoring device 20.

However, if it is determined at step 313 that either another remote monitoring device 20 is not available through the currently connected remote monitoring device 20 or that the user does not wish to access another remote monitoring device 20, then the setup process 160 exits at step 319.

FIG. 9A is a flow chart illustrating an example of the operation of the transmit process 320 on service device 11 and utilized by the remote monitoring system 80 of the present invention, as shown in FIGS. 2A, 3A and 4A. The transmit agent 340 provides for the transmission of data captured from power system device 7 and computed by remote monitoring device 20 to service device 11.

First at step 321, the transmit process 320 is initialized. This initialization includes the startup routines and processes embedded in the BIOS of the service device 11. The initialization also includes the establishment of data values for particular data structures utilized in the transmit process 320.

At step 322, the transmit process 320 attempts to connect to the remote monitoring device 20. At step 323, it is determined if the transmit process 320 has successfully connected to the remote monitoring device 20. If it is determined at step 323 that a connection to the remote monitoring device 20 has not been successfully completed, then the service device 11 returns to repeat steps 322 and 323 provided that the maximum number of attempts has not been exceeded. However, if the maximum number of attempts has been exceeded, then the transmit process 320 exits at step 339. However, if it is determined at step 323 that a connection to the remote monitoring device 20 has been completed, then the transmit process 320 receives a data transmission from the remote device at step 324.

At step 325, it is determined if the data transmission is due to an error or security report. If it is determined that the data transmission is not due to an error or security report, then the transmit process 320 proceeds to step 331. However, if it is determined that said 325 that the data transmission is due to an error or security report, then the transmit process 320 provides a remote connection to the remote monitoring device 20 in an attempt to diagnose the error at step 326.

At step 331, the transmit process 320 acquires the remote monitoring device 20 unit and environmental data. At step 332, the transmit process determines if a notification of local personnel is required.

If it is determined at step 332 that notification of local personnel is not required, then the transmit process 320 proceeds to step 334. However, if it is determined at step 332 that notification of local personnel is required, then the transmit process 327 sends a message to local personnel notifying them of the problem. The recipients of this message can be but are not limited to, local technician, police, fire, power linemen, security, upper management, a remote monitoring service company, equipment manufacturer or support personnel, and the like. The message may utilize any number of current techniques, including but not limited to e-mail, voice mail, SMS messaging, fax, pre-recorded messages, and the like.

At step 334, the transmit process 320 determines if there more messages to be received. If it is determined at step 334 that there are more messages to be received, then the transmit process 320 returns to repeat steps 322 through 334. However, if it is determined at step 334 that no additional messages are to be received from remote monitoring device 20, then the transmit process 320 exits at step 339.

FIG. 9B is a flow chart illustrating an example of the operation of the transmit agent 340 utilized in the remote monitoring device 20 and utilized by the remote monitoring system 100 of the present invention, as shown in FIGS. 2B, 3B, 3C and 4B. The transmit agent 340 provides for the transmission of data captured from power system device 7 to service device 11.

First at step 341, the transmit agent 340 is initialized. This initialization includes the startup routines and processes embedded in the BIOS of the remote monitoring device 20. The initialization also includes the establishment of data values for particular data structures utilized in the transmit agent 340. At step 342, the transmit agent 340 attempts to connect to a service device 11 through communication link. As stated previously, there are a number of communication links that can be utilized to perform this task. These links include, but are not limited to, Bluetooth, WiFi, cellular, optical, satellite, RF, POTS, Ethernet, LAN, WAN, magnetic induction, coax, RS-485, INCOM, SCADA or the like.

At step 343, the transmit agent 340 determines if the remote monitoring device 20 is connected to a service device 11. If it is determined at step 343 that the remote monitoring device 20 is not connected to service device 11, then the transmit agent 340 proceeds to step 352. However, if it is determined at step 343 that the remote monitoring device 20 is connected to the service device 11, then the transmit agent 340 captures the current state of the remote monitoring device 20, at step 344.

At step 345, the environmental data for the remote monitoring device 20 is captured. This environmental data includes but is not limited to temperature, humidity, security factors, and the like. At step 344, the time period for data captured is indicated for the service representative. At step 345, the transmit agent 340 then transmits the data captured from the remote monitoring device 20 to the service device 11 at step 347.

At step 351, the transmit agent 340 determines if there are more data transmissions to be sent. If it is determined to step 351 that there are more data transmissions to be sent, the transmit agent 340 then returns to repeat steps 344 through 351. However, if it is determined at step 351 that there are no additional data transmissions to be sent, then the transmit agent 340 exits at step 359.

At step 352, it is determined if there is a remote monitoring device 20 connected to the currently connected remote monitoring device 20. The transmit agent 340 then determines if it is possible to transmit data through another remote monitoring device 20 to a service device 11. If it is determined at step 352 that it is possible to transmit data through another remote monitoring device 20, then the other remote monitoring device 20 is identified and connected, at step 353. The transmit agent 340 returns to repeat steps 342 through 351 using the connection through the other remote monitoring device 20. These actions will cause the other remote monitoring device 20 to be utilized as a conduit for this remote monitoring device 20. However, if it is determined at step 352 that another remote monitoring device 20 is not available, then the transmit agent 340 exits at step 359.

Figure 10A:
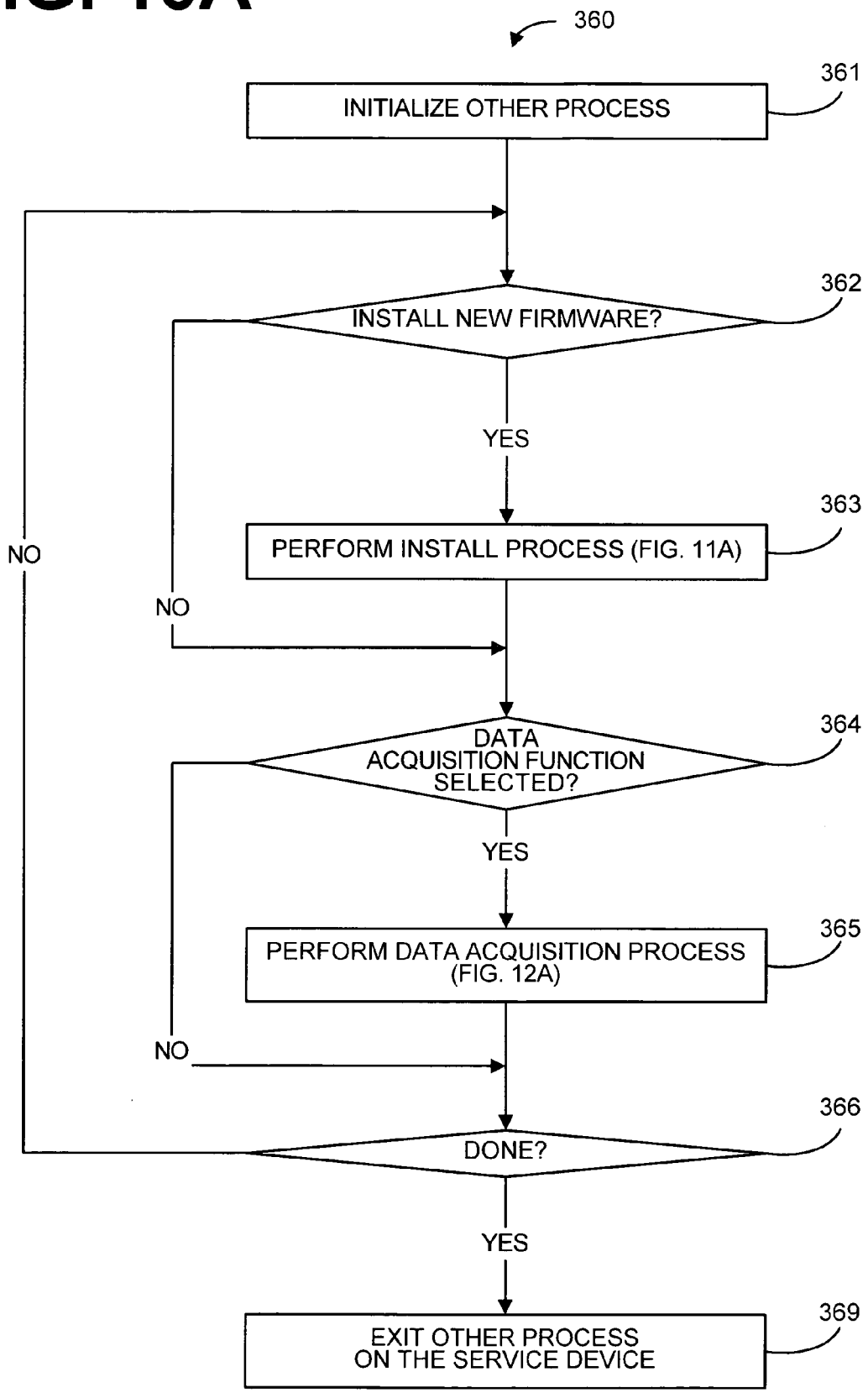
FIG. 10A is a flow chart illustrating an example of the operation of the other process utilized by the remote power monitoring system of the present invention, as shown in FIGS. 2A, 3A and 4A.

FIG. 10A is a flow chart illustrating an example of the operation of the other process 360 utilized by the remote power monitoring system 80 of the present invention, as shown in FIGS. 2A, 3A and 4A. The other process 360 enables the service device 11 to perform functions installed on a service device 11 and the remote device 20. The functions described in other process 360 may be incorporated into remote monitoring system 80 (FIG. 4A) on the service device 11, instead of installed later.

First at step 361, the other process 360 is initialized. This initialization includes the startup routines and processes embedded in the BIOS of the service device 11. The initialization also includes the establishment of data values for particular data structures utilized in the other process 360.

At step 362, it is determined if new firmware or software is to be added. If it is determined at step 362 that new firmware or software is not to be added, then the other process 360 skips to step 364. The new firmware or software being added, such as, but not limited to, new additional functions, corrections to existing functions, software upgrades or patches. However, if it is determined at step 362 that new firmware or software is to be added, the install process is performed at step 363. The install processes herein defined in further detail with regard to FIG. 11A.

At step 364, it is determined if the data acquisition function is selected. If it is determined at step 364 that the data acquisition function is not selected, then the other process 360 then proceeds to step 366. However, if it is determined at step 364 that the data acquisition function is selected, then the other process 360 performs the data acquisition function at step 365. The data acquisition function is herein defined in further detail with regard to FIG. 12A.

At step 366, the other process 360 determined that there is more processing to be done. If it is determined that more processing is to be done, then the other process 360 then returns to repeat steps 362 through 366. However, if it is determined in step 366 that there is no more processing to be performed, then the other process 360 exits at step 369.

Figure 10B:
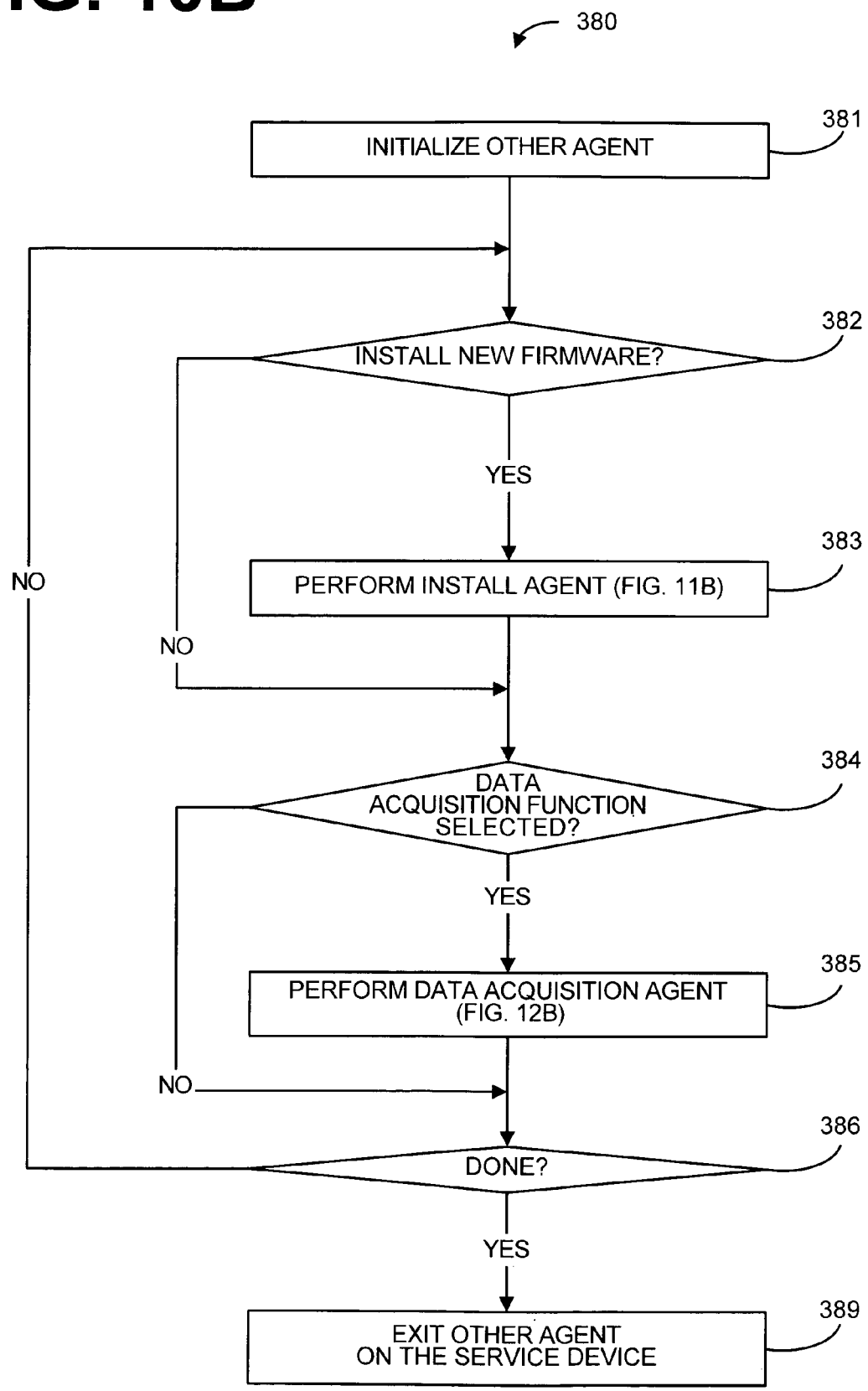
FIG. 10B is a flow chart illustrating an example of the operation of the other agent utilized in the remote monitoring device and utilized by the remote power monitoring system of the present invention, as shown in FIGS. 2B, 3B, 3C and 4B.

FIG. 10B is a flow chart illustrating an example of the operation of the other agent 380 utilized in the remote monitoring device 20 and utilized by the remote power monitoring system 100 of the present invention, as shown in FIGS. 2B, 3B, 3C and 4B. The other agent 380 enables the remote device 20 to perform functions installed after installation or install software patches. The functions described in other agent 380 may be incorporated into remote monitoring 100 (FIG. 4B) on the remote device 20, instead of installed later.

First at step 381, the other agent 380 is initialized. This initialization includes the startup routines and processes embedded in the BIOS of the remote monitoring device 20. The initialization also includes the establishment of data values for particular data structures utilized in the other agent 380.

At step 382, it is determined if new firmware or software is to be added. If it is determined at step 362 that new firmware or software is not to be added, then the other agent 380 skips to step 384. However, if it is determined at step 382 that new firmware or software is to be added, the install agent is performed at step 383. The new firmware or software being added, such as new additional functions, corrections to existing functions, software upgrades or patches. The install agent is herein defined in further detail with regard to FIG. 11B.

At step 384, it is determined if the data acquisition function is selected. If it is determined at step 384 that the data acquisition function is not selected, then the other agent 380 then proceeds to step 386. However, if it is determined at step 384 that the data acquisition function is selected, then the other agent 380 performs the data acquisition function at step 385. The data acquisition function is herein defined in further detail with regard to FIG. 12B.

At step 386, the other agent 380 determined that there is more processing to be done. If it is determined that more processing is to be done, then the other agent 380 then returns to repeat steps 382 through 386. However, if it is determined in step 386 that there is no more processing to be performed, then the other agent 380 exits at step 389.

Figure 11A:
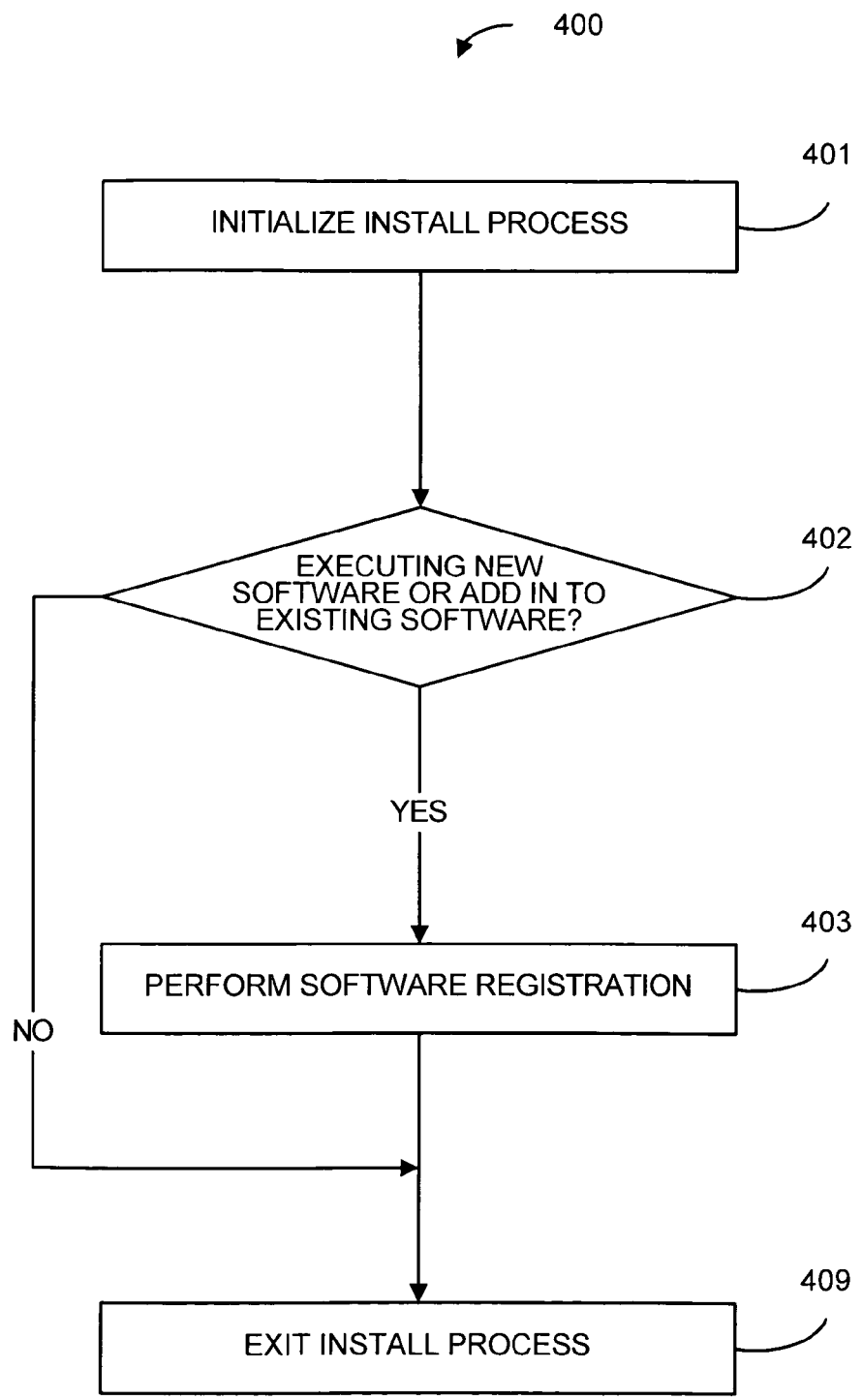
FIG. 11A is a flow chart illustrating an example of the operation of the install process utilized by the remote power monitoring system of the present invention, as shown in FIGS. 2A, 3A and 4A.

FIG. 11A is a flow chart illustrating an example of the operation of the install process 400 utilized by the remote power monitoring system 80 of the present invention, as shown in FIGS. 2A, 3A and 4A. The install process 400 enables the installation of new software to the service device 11. The new firmware or software being added can be for new additional functions, corrections to existing functions, software upgrades or patches.

First at step 401, the install process 400 is initialized. This initialization includes the startup routines and processes embedded in the BIOS of the service device 11. The initialization also includes the establishment of data values for particular data structures utilized in the install process 400.

At step 402, the install process 400 determines if it is executing new or add-in software. If it is determined at step 402 that the service new software, then the install process 400 proceeds to step 409 and exits. However, if it is determined that the service device 11 is executing new software, the install process 400 performs software registration at step 403. After performing the software registration at step 403, the install process 400 then exits at step 409.

Figure 11B:
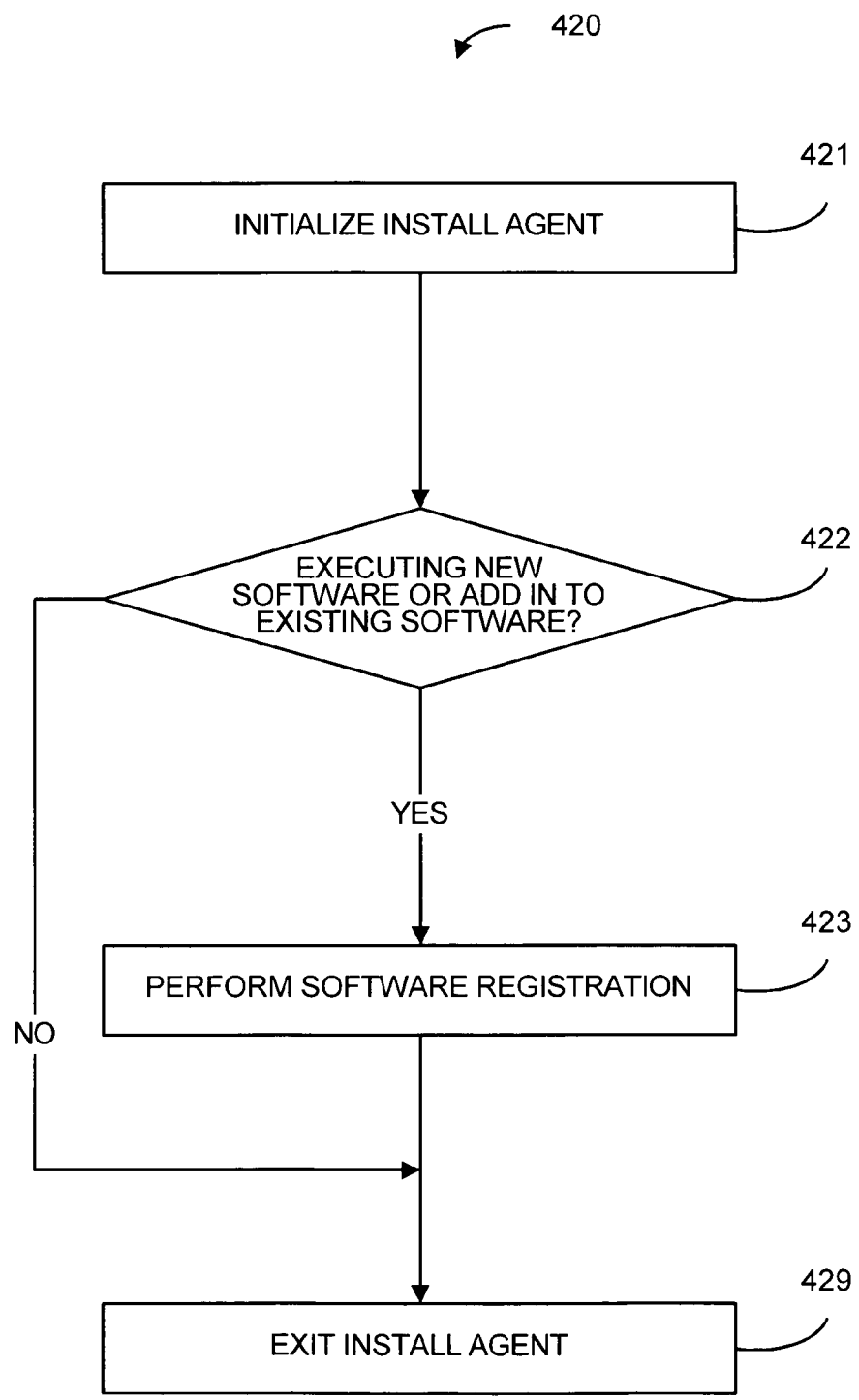
FIG. 11B is a flow chart illustrating an example of the operation of the install agent utilized in the remote monitoring device and utilized by the remote power monitoring system of the present invention, as shown in FIGS. 2B, 3B, 3C and 4B.

FIG. 11B is a flow chart illustrating an example of the operation of the install agent 420 utilized in the remote monitoring device 20 and utilized by the remote power monitoring system 100 of the present invention, as shown in FIGS. 2B, 3B, 3C and 4B. The install agent 420 enables the installation of new software to the remote monitoring device 20.

First at step 421, the install agent 420 is initialized. This initialization includes the startup routines and processes embedded in the BIOS of the remote monitoring device 20. The initialization also includes the establishment of data values for particular data structures utilized in the install agent 420.

At step 422, the install agent 420 determines if it is executing new or add-in software. If it is determined at step 42 that the service device is not executing new software, then the install agent 420 proceeds to step 429 and exits. However, if it is determined that the remote monitoring device 20 is executing new software, then the install agent 420 performs software registration at step 423. After performing the software registration at step 423, the install agent 420 then exits at step 429.

Figure 12A:
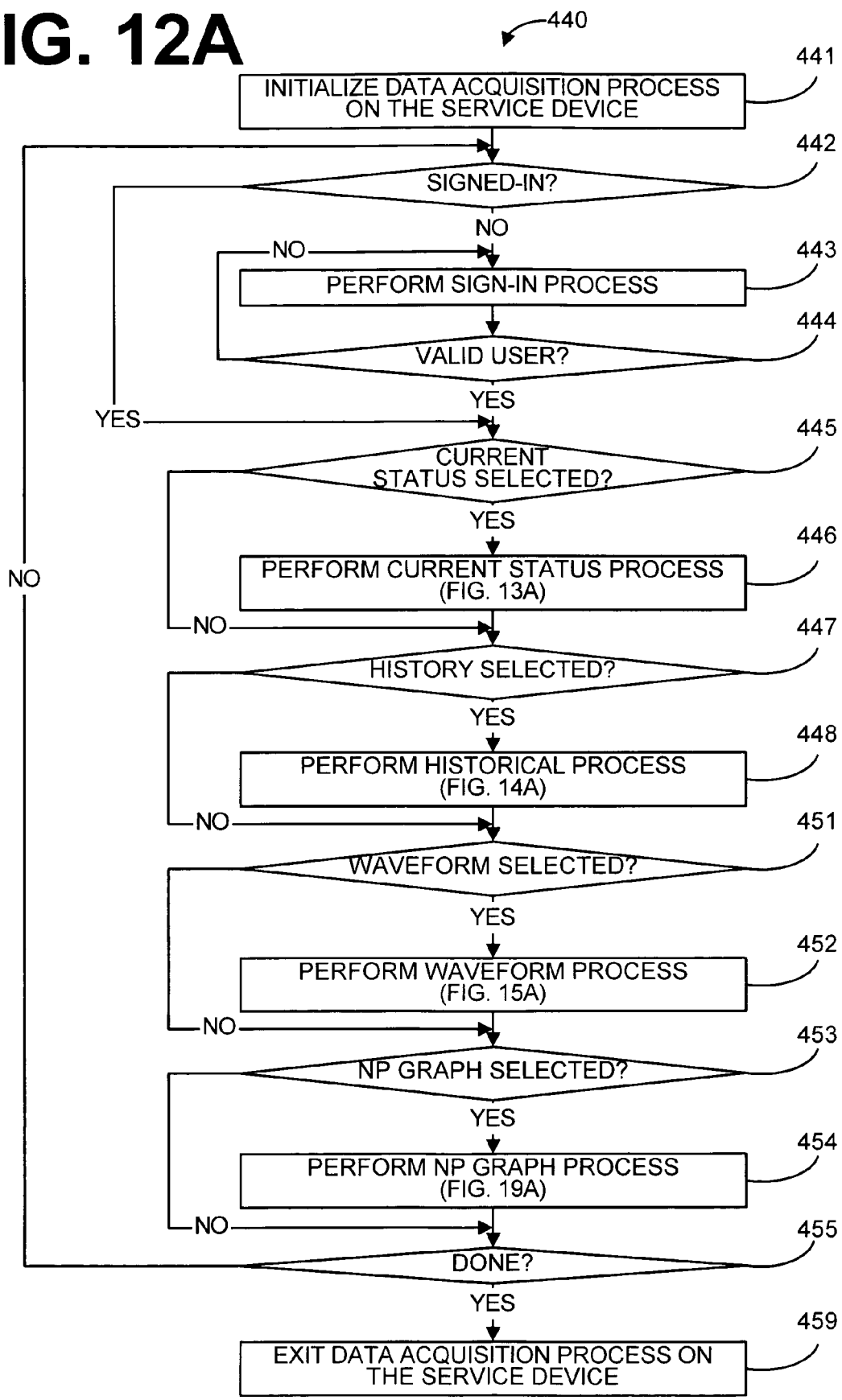
FIG. 12A is a flow chart illustrating an example of the operation of the data acquisition agent utilized by the remote power monitoring system of the present invention, as shown in FIGS. 2A, 3A and 4A.

FIG. 12A is a flow chart illustrating an example of the operation of the data acquisition process 440 utilized by the remote power monitoring system 80 of the present invention, as shown in FIGS. 2A, 3A and 4A. The data acquisition process 440 enables the performance of the current status, history, waveform and network power graphing processes on the service device 11. The data acquisition process 440 acquires data from the power device 7 utilizing the remote monitoring system of the present invention. This data is then available for analysis of other functions in either the server 11 or remote access device 20.

First at step 441, the data acquisition process 440 is initialized. This initialization includes the startup routines and processes embedded in the BIOS of the service device 11. The initialization also includes the establishment of data values for particular data structures utilized in the data acquisition process 440.

At step 442, then data acquisition process 440 determines if the user is signed into the service device 11. It is determined at step 442 that the user is signed-in, then the data acquisition process 440 proceeds to step 445. However, if it is determined at step 442 that the user is not signed-in into the service device 11, then the service device 11 performs the user sign-in process at step 443. At step 444, it is determined if the user signing-in is a valid user. If it is determined at step 444 that the user is a valid user, then the data acquisition process 440 proceeds to step 445.

However, if is determined at step 444 that the user is not a valid user, then the data acquisition process 440 returns to repeat step 443 and 444.

At step 445, it is determined if the user has selected to display the current status. If it is determined in step 445 that the user has not selected to display the current status, then the data acquisition process 440 proceeds to step 447. However, if it is determined that the user has elected to display the current status, then the data acquisition process 440 performs the current status process at step 446. The current status process is herein defined in further detail with regard to FIG. 13A.

At step 447, it is determined if the user has selected to display the historical status. If it is determined to step 447 that the user has not selected to display the historical status, then the data acquisition process 440 proceeds to step 451. However, if it is determined that the user has elected to display the historical status, the data acquisition process 440 performs the historical process at step 448. The historical process is herein defined in further detail with regard to FIG. 14A.

At step 451, it is determined if the user has elected to display waveforms. If is determined at step 451 that the user has not elected to display waveforms, then the data acquisition process 440 proceeds to step 453. However, if it is determined that the user has elected to display waveforms, then the data acquisition process 440 performs the waveform process at step 452. The waveform process is herein defined in further detail with regard to FIG. 15A.

At step 453, it is determined if the user has elected to display the NP graph. If it is determined at step 453 that the user has not elected to display the NP graph, then the data acquisition process 440 proceeds to step 455. However, if it is determined that the user has elected to display the NP graph, then the data acquisition process 440 performs the NP graph process at step 454. The NP graph process is herein defined in further detail with regard to FIG. 19A.

At step 455, the data acquisition process 440 determines if there is more processing to be performed. If it is determined at step 455 that there is more processing to be performed, then the data acquisition process 440 returns to repeat steps 442 through 455. However, if it is determined to step 455 that there are no more steps to be performed, then the data acquisition process 440 exits at step 459.

Figure 12B:
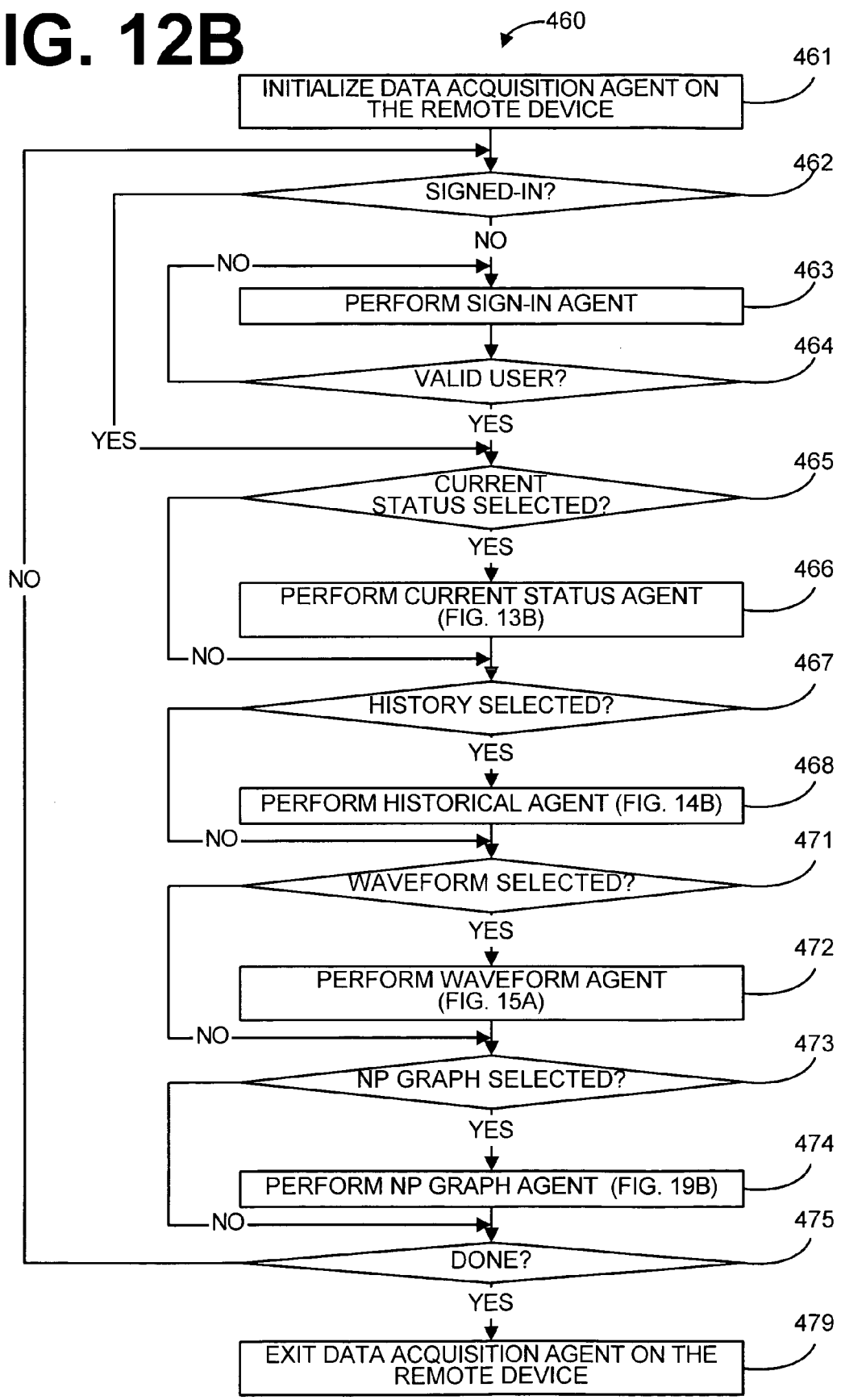
FIG. 12B is a flow chart illustrating an example of the operation of the data acquisition agent utilized in the remote monitoring device and utilized by the remote power monitoring system of the present invention, as shown in FIGS. 2B, 3B, 3C and 4B.

FIG. 12B is a flow chart illustrating an example of the operation of the data acquisition agent 460 utilized in the remote monitoring device 20 and utilized by the remote power monitoring system 100 of the present invention, as shown in FIGS. 2B, 3B, 3C and 4B. The data acquisition agent 460 provides security and access to power device 7 specific information. The data acquisition agent 460 also enables the performance of power device 7 analysis including, but not limited to, the current status, history, waveform and network power graphing processes on the remote device 20.

First at step 461, the data acquisition agent 460 is initialized. This initialization includes the startup routines and processes embedded in the BIOS of the remote monitoring device 20. The initialization also includes the establishment of data values for particular data structures utilized in the data acquisition agent 460.

At step 462, the data acquisition agent 460 determines if the user of the service device 11 is signed-in. If the user of the service device 11 is signed-in, then the data acquisition agent 460 proceeds to step 465. However, if it is determined at step 462 that the user of the service device 11 is not signed-in, then the data acquisition agent 460 requires the user of the service device 11 to sign-in at step 463. In the preferred embodiment, the employer of the user provides a password key recognizable by the remote monitoring device 20.

At step 464, the remote device 20 determines if the user of the service device 11 is a valid user. If it is determined at step 464 that the user of the service device 11 is not a valid user, then the data acquisition agent 460 returns to repeat step 463 and 464.

At step 465, it is determined if the user has elected to display the current status. If it is determined at step 465 user has not elected to display the current status, then the data acquisition agent 460 proceeds to step 467. However, if it is determined at step 465 that the user has elected to display the current status, then the data acquisition agent 460 performs the current status agent at step 466. The current status agent is herein defined in further detail with regard to FIG. 13B.

At step 467, it is determined if the user has elected to display the historical status. If it is determined to step 467 that the user has not elected to display the historical status, then the data acquisition agent 460 proceeds to step 471. However, if it is determined that the user has elected to display the historical status, the data acquisition agent 460 performs the historical agent at step 468. The historical agent is herein defined in further detail with regard to FIG. 14B.

At step 471, it is determined if the user has elected to display waveforms. If is determined to step 471 that the user has not elected to display waveforms, then the data acquisition agent 460 proceeds to step 473. However, if it is determined that the user has elected to display waveforms then the data acquisition agent 460 performs the waveform agent at step 472. The waveform agent is herein defined in further detail with regard to FIG. 16A.

At step 473, it is determined if the user has elected to display the NP graph. If it is determined at step 473 that the user has not elected to display the NP graph, then the data acquisition agent 460 proceeds to step 475. However, if it is determined that the user has elected to display the NP graph, then the data acquisition agent 460 performed the NP graph process at step 474. The NP graph agent is herein defined in further detail with regard to FIG. 19B.

At step 475, the data acquisition agent 460 determines if there is more processing to be performed. If it is determined at step 475 that there is more processing to be performed, then the data acquisition agent 460 returns to repeat steps 462 through 475. However, if it is determined to step 475 that there are no more steps to be performed, then the data acquisition agent 460 exits at step 479.

Figure 13A:
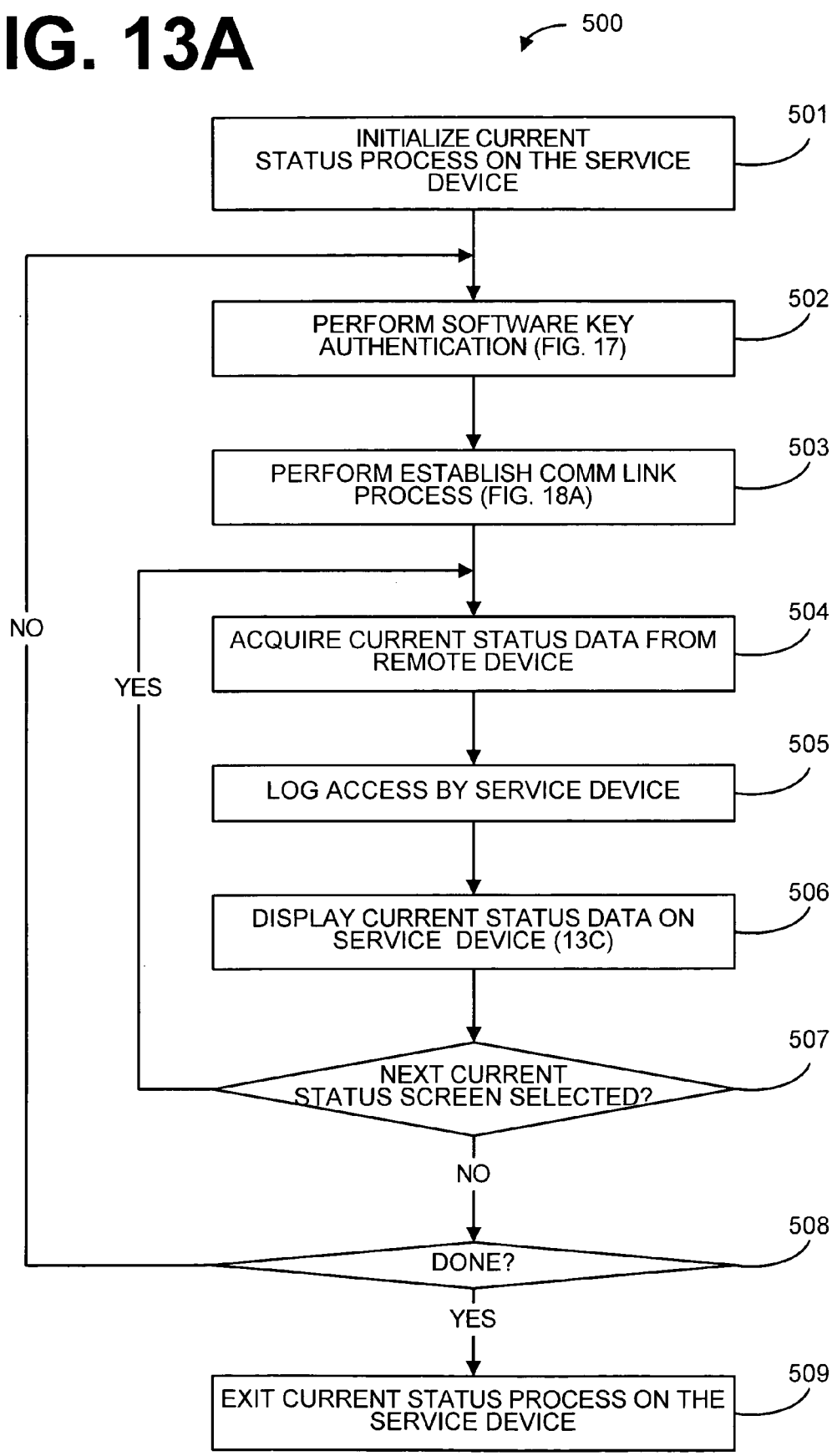
FIG. 13A is a flow chart illustrating an example of the operation of the current status process utilized by the remote power monitoring system of the present invention, as shown in FIGS. 2A, 3A and 4A.

FIG. 13A is a flow chart illustrating an example of the operation of the current status process 500 utilized by the remote power monitoring system 80 of the present invention, as shown in FIGS. 2A, 3A and 4A. The current status process 500 enables a user to obtain current status from the power device 7 that the remote monitoring device 20 is connected to. For example, this function actually enables a user to observe the current operating status of a power device 7 without opening a cabinet to the power device 7. In the illustrated example, the power device 7 is a network protector and therefore the history information illustrated is for a network protector. It is understood that other types of power devices 7 would display other unique types of history data.

First at step 501, the current status process 500 is initialized. This initialization includes the startup routines and processes embedded in the BIOS of the service device 11. The initialization also includes the establishment of data values for particular data structures utilized in the current status process 500.

At step 502, the software key authentication is performed. The software key authentication is herein defined in further detail with regard to FIG. 17. The software key authentication is a security means to prevent unauthorized access to the remote monitoring device 20 by unauthorized personnel.

At step 503, the establish communication link process is performed. The establish communication link process is herein defined in further detail with regard to FIG. 18A. The establish communication link process enables a user to poll for operational remote monitoring devices 20. This polling enables a user to determine which remote monitoring devices 20 are currently available. In the preferred embodiment, the polling indicates each operational remote monitoring device 20 in its group. For example, in a group of three the first remote monitoring device 20 would indicate that it is one of three. If remote monitoring devices 20 for two of three and three of three do not respond, then this indicates to a user that two power devices 7 may not be operational.

After establishing a communication link with a particular power device, the current status process 500 enables a user at step 504 to acquire current status data from the power device connected to the selected remote monitoring device 20. At step 505, the service device 11 logs the access by the user to the current status data. This log is in order to determine which user gained access to particular types of power equipment. In the preferred embodiment, the remote monitoring device 20 records each user and time the remote monitoring device 20 was accessed as well as what information was accessed.

At step 506, the current status data is displayed on the service device 11. An example of a preferred screen display format for the illustrated network protector is shown in FIG. 13C. At step 507, it is determined if additional current status screens are selected. If it is determined to step 507 that additional current status screens are selected, then the current status process 500 returns to repeat steps 504 through 507 for the additional data screens available. However, if it is determined at step 507 that additional current status screens for the currently connected power device are not requested, then the current status process 500 determines if there is more processing or additional power devices at step 508.

If it is determined at step 508 that there is additional current status data to be process for additional power equipment, then the current status process 500 returns to repeat steps 502 through 508. However, if it is determined that there are no more power devices to be process, then the current status process 500 exits at step 509.

Figure 13B:
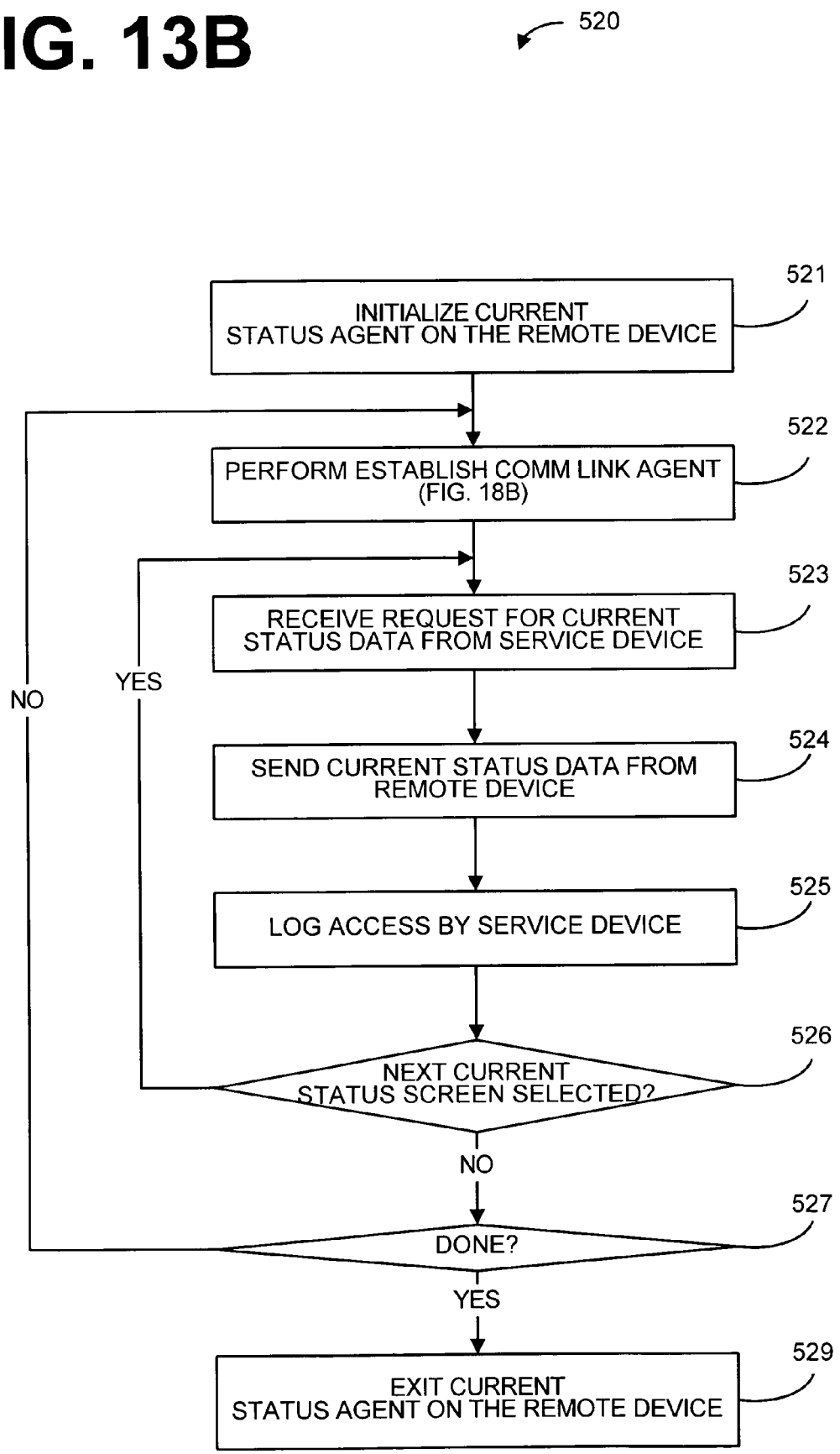
FIG. 13B is a flow chart illustrating an example of the operation of the current status agent utilized in the remote monitoring device and utilized by the remote power monitoring system of the present invention, as shown in FIGS. 2B, 3B, 3C and 4B.
Figure 13C:
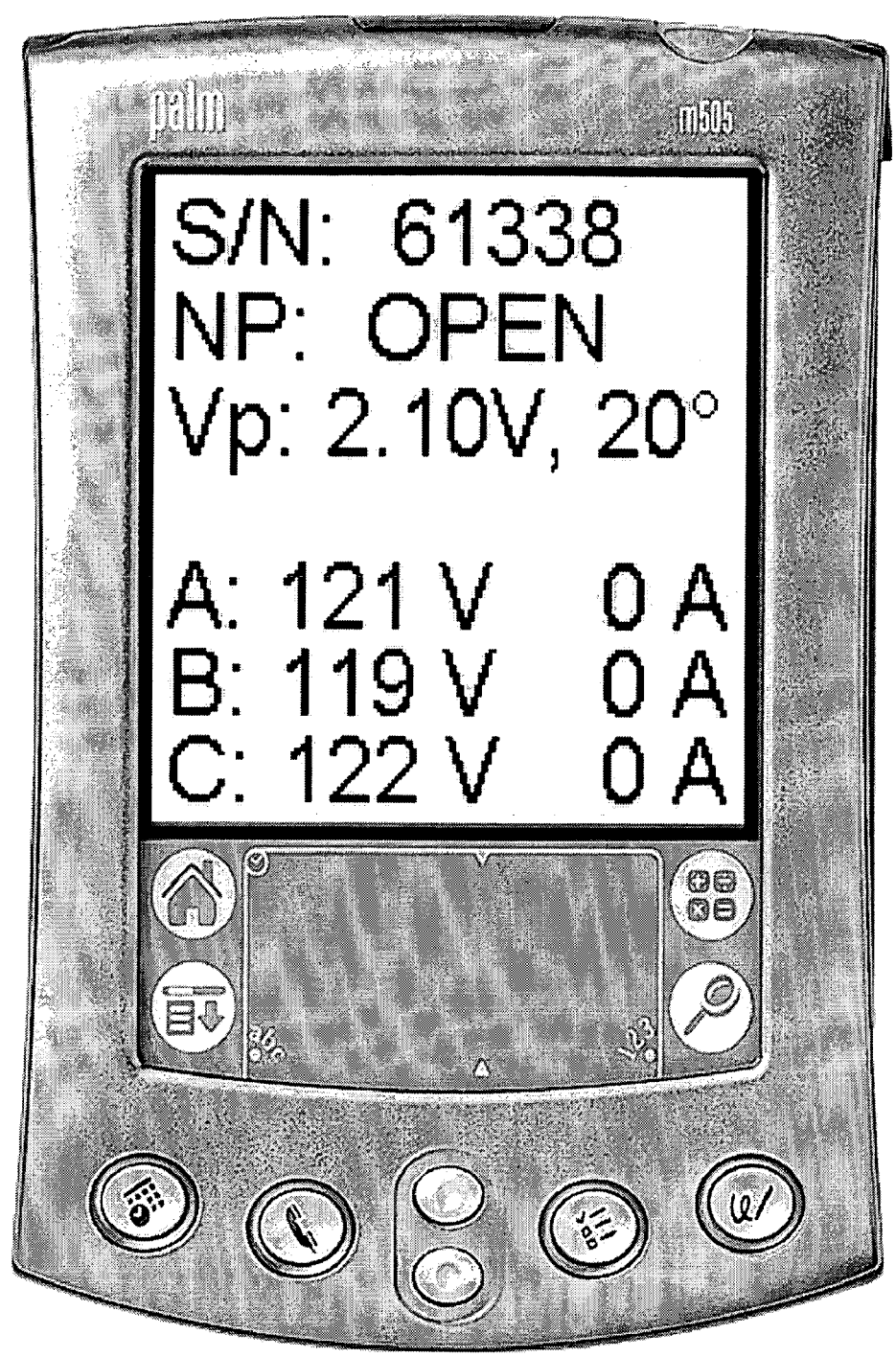
FIG. 13C is an example of current status information presented on a PDA that was received from the current status process utilized by the remote power monitoring system of the present invention, as shown in FIGS. 13A and 13B.

FIG. 13B is a flow chart illustrating an example of the operation of the current status agent 520 utilized in the remote monitoring device 20 and utilized by the remote power monitoring system 100 of the present invention, as shown in FIGS. 2B, 3B, 3C and 4B. The current status process 520 enables a user to obtain current status from the power device that the remote monitoring device 20 is connected to.

First at step 461, the current status agent 520 is initialized. This initialization includes the startup routines and processes embedded in the BIOS of the remote monitoring device 20. The initialization also includes the establishment of data values for particular data structures utilized in the current status agent 520.

At step 522, the establish communication link agent is performed. The establish communication link agent is herein defined in further detail with regard to FIG. 18B. The establish communication link agent enables a user to poll for operational remote monitoring devices 20.

After the establishing a communication link with the particular power device, the current status agent 520 enables a user to acquire current status data from the power device connected to the selected remote monitoring device 20. At step 523, the current status agent 520 receives a request for current status data from the service device 11. This request can be received electrically, optically, magnetically or via radio frequency as defined above.

At step 524, the current status agent 520 then sends a request for the current status data from the network protector through the remote monitoring device 20 to the service device 11. At step 525, the remote monitoring device 20 logs the access by the user to the current status data. This log is in order to determine which user gained access to specific power equipment at what time in addition to the information accessed.

At step 526, it is determined if additional current status is selected. If it is determined to step 56 that additional current status data are to be selected, then the current status agent 520 returns to repeat steps 523 through 526 for the additional data available. However, if it is determined at step 526 that additional current status data from the currently connected power device is not requested, then the current status agent 520 determines if there is more processing at step 527.

If it is determined at step 527 that there is additional current status data to be process, then the current status agent 520 returns to repeat steps 522 through 527. However, if it is determined that there are no more power data to be processed, then the current status agent 520 at exits at step 529.

Figure 14A:
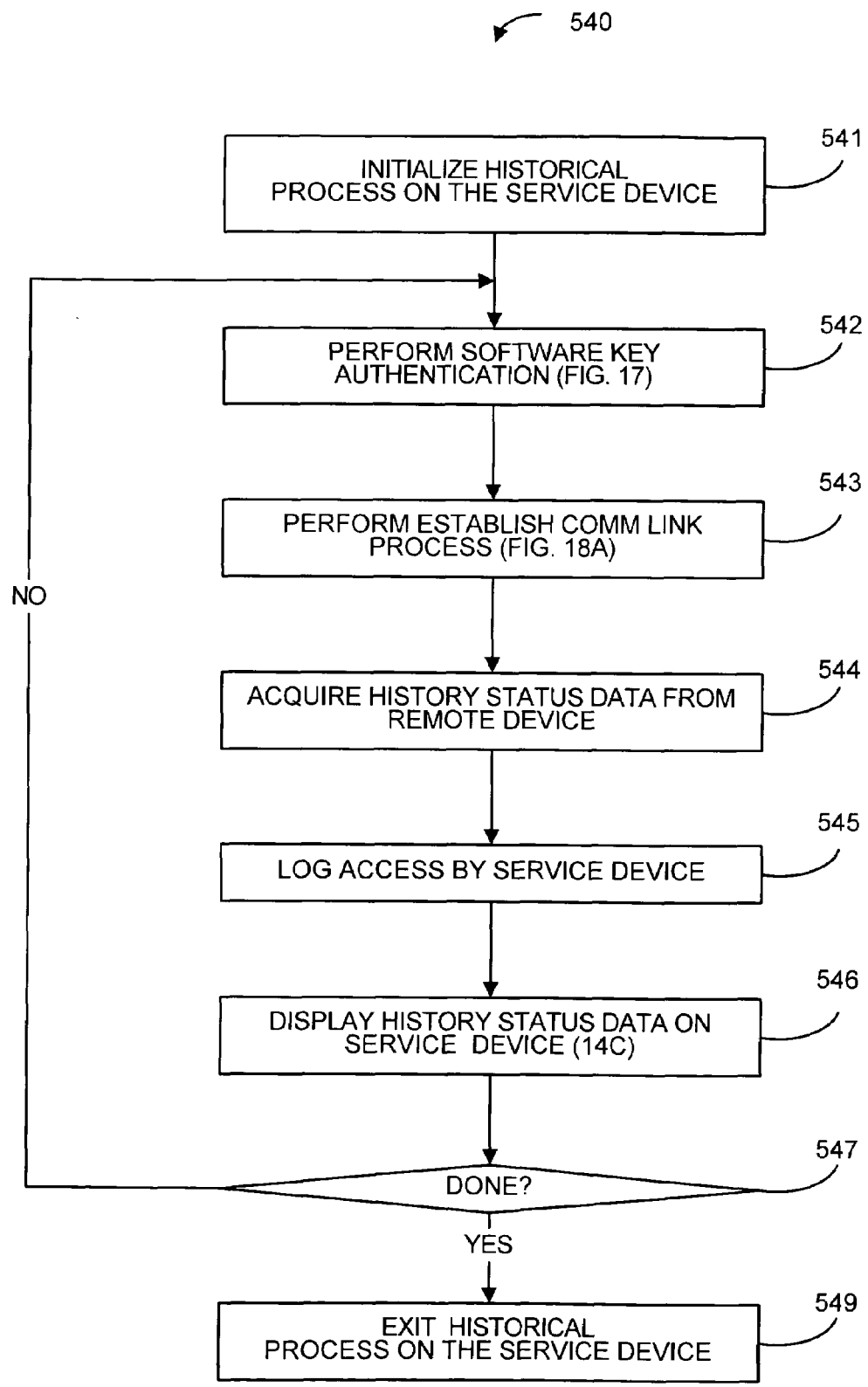
FIG. 14A is a flow chart illustrating an example of the operation of the historical process utilized by the remote power monitoring system of the present invention, as shown in FIGS. 2A, 3A and 4A.

FIG. 14A is a flow chart illustrating an example of the operation of the historical process 540 utilized by the remote power monitoring system 80 of the present invention, as shown in FIGS. 2A, 3A and 4A. The historical process 540 enables a user to obtain historical status data from the power device 7 that the remote monitoring device 20 is connected. In the illustrated example, the power device 7 is a network protector and therefore the history information illustrated is for a network protector. It is understood that other types of power devices 7 would display other unique types of history data.

First at step 541, the historical process 540 is initialized. This initialization includes the startup routines and processes embedded in the BIOS of the service device 11. The initialization also includes the establishment of data values for particular data structures utilized in the historical process 540.

At step 542, the software key authentication is performed. The software key authentication is herein defined in further detail with regard to FIG. 17. The software key authentication is a security means to prevent unauthorized access to the remote monitoring device 20 by unauthorized personnel.

At step 543, the establish communication link process is performed. The establish communication link process is herein defined in further detail with regard to FIG. 18A. The establish communication link process enables a user to poll for operational remote monitoring devices 20.

After establishing a communication link with a particular power device, the historical process 540 enables a user at step 544 to acquire historical status data from the power device connected to the selected remote monitoring device 20. At step 545, the service device 11 logs the access by the user to the historical status data. This log is used in order to determine which user gained access to the power device 7 at which time. In addition, the type of information access is also logged.

At step 546, the historical status data is displayed on the service device 11. An example of screen display format is illustrated at FIG. 14C. At step 547, if it is determined that there is additional historical status data to be process for additional power devices 7, then the historical process 540 returns to repeat steps 542 through 547. However, if it is determined that is additional historical status data to be processed then the historical process 540 exits at step 549.

Figure 14B:
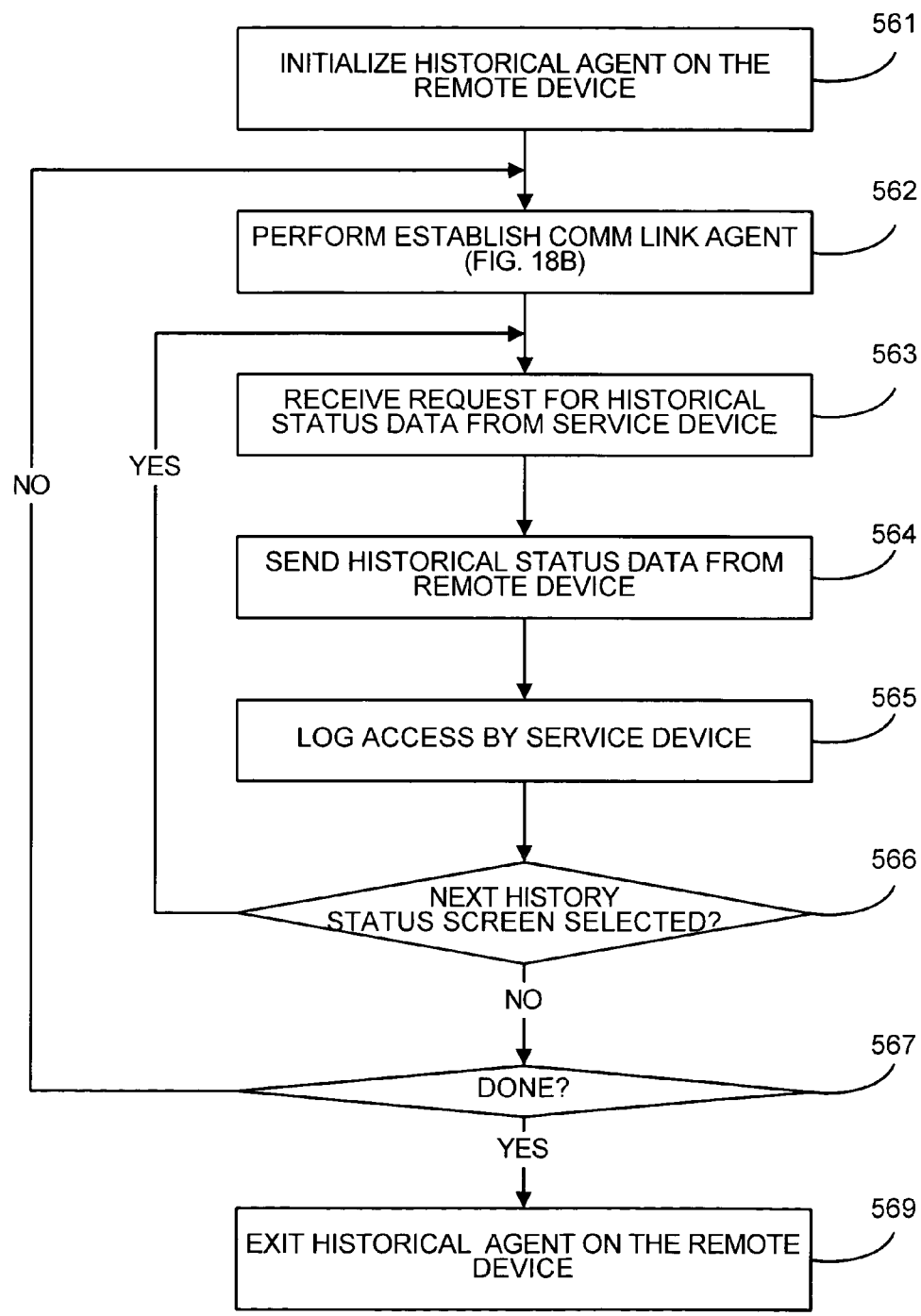
FIG. 14B is a flow chart illustrating an example of the operation of the historical agent utilized in the remote monitoring device and utilized by the remote power monitoring system of the present invention, as shown in FIGS. 2B, 3B, 3C and 4B.
Figure 14C:
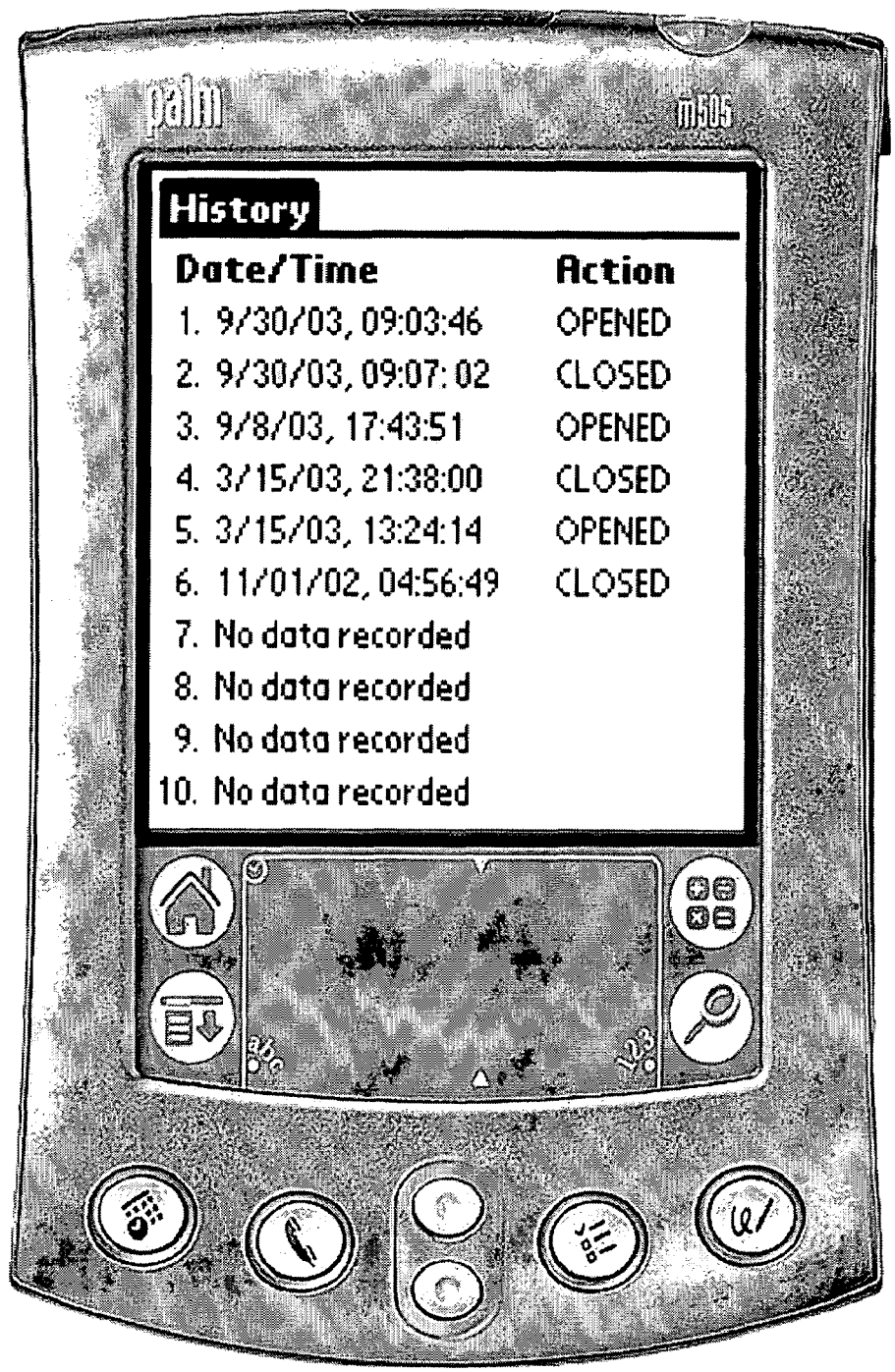
FIG. 14C is an example of historical status information presented on a PDA that was received from the historical process utilized by the remote power monitoring system of the present invention, as shown in FIGS. 14A and 14B.

FIG. 14B is a flow chart illustrating an example of the operation of the historical agent 560 utilized in the remote monitoring device 20 and utilized by the remote power monitoring system 100 of the present invention, as shown in FIGS. 2B, 3B, 3C and 4B. The historical agent 560 enables a user to obtain historical status from the power device 7 to which the remote monitoring device 20 is connected.

First at step 561, the historical agent 560 is initialized. This initialization includes the startup routines and processes embedded in the BIOS of the remote monitoring device 20. The initialization also includes the establishment of data values for particular data structures utilized in the historical agent 560.

At step 562, the establish communication link agent is performed. The establish communication link agent is herein defined in further detail with regard to FIG. 18B. The establish communication link agent enables a user to poll for operational remote monitoring devices 20.

After the establishing a communication link with the particular power device 7, the historical agent 560 enables a user to acquire historical status data from the power device connected to the selected remote monitoring device 20. At step 563, the historical agent 560 receives a request for historical status data from the service device 11. This request can be received electrically, optically, magnetically or via radio frequency as defined above.

At step 564, the historical agent 560 sends a request for the historical status data from the connected power device through the remote monitoring device 20 to the service device 11. At step 565, the remote monitoring device 20 logs the access by the user to the historical status data. This log is used in order to determine which user gained access to the power device 7 at which time. In addition, the type of information access is also logged.

At step 566, it is determined if additional historical status is selected. If it is determined to step 566 that additional historical status data is selected, then the historical agent 560 returns to repeat steps 563 through 566 for the additional data available. However, if it is determined at step 566 that additional historical status data from the currently connected power device is not selected, then the historical agent 560 determines if more processing is to occur at step 567.

If it is determined at step 567 that there is additional historical status data to be processed, then the historical agent 560 returns to repeat steps 562 through 567. However, if it is determined that there are no more power data to be processed, then the historical agent 560 exits at step 569.

In an alternative embodiment, the operational status of the power device 7 can be determined by analyzing the currents status and historical data. The current status and historical data can be stored on the remote monitoring device 20, a connected remote monitoring device 20 or database 14 (FIG. 1). The operational status of the power device 7 can be determined by evaluating the current status and historical data for the following factors: if the power device 7 has experienced conditions outside of its environmental limits; has failed to operate in accordance with the set points of the power device 7; or if the device is approaching its operational life limits. These operational life limits for the exemplary network protector include, but not limited to, a predetermined trip cycle number, the voltage and the current having passedthrough the device, temperature and humidity conditions and their duration and the like.

Figure 15A:
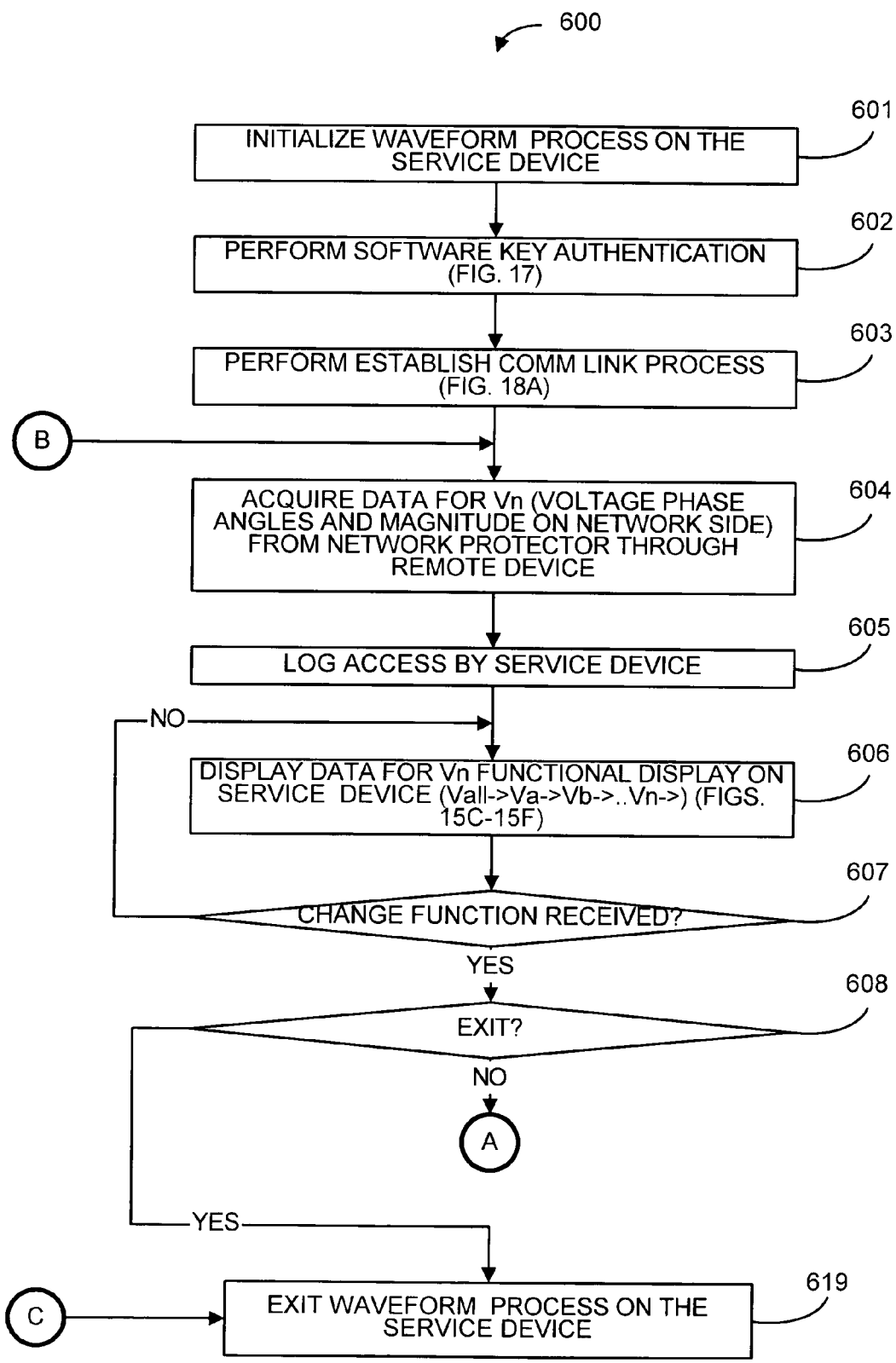
FIGS. 15A and 15B are flow charts illustrating an example of the operation of the waveform process utilized by the remote power monitoring system of the present invention, as shown in FIGS. 2A, 3A and 4A.
Figure 15B:
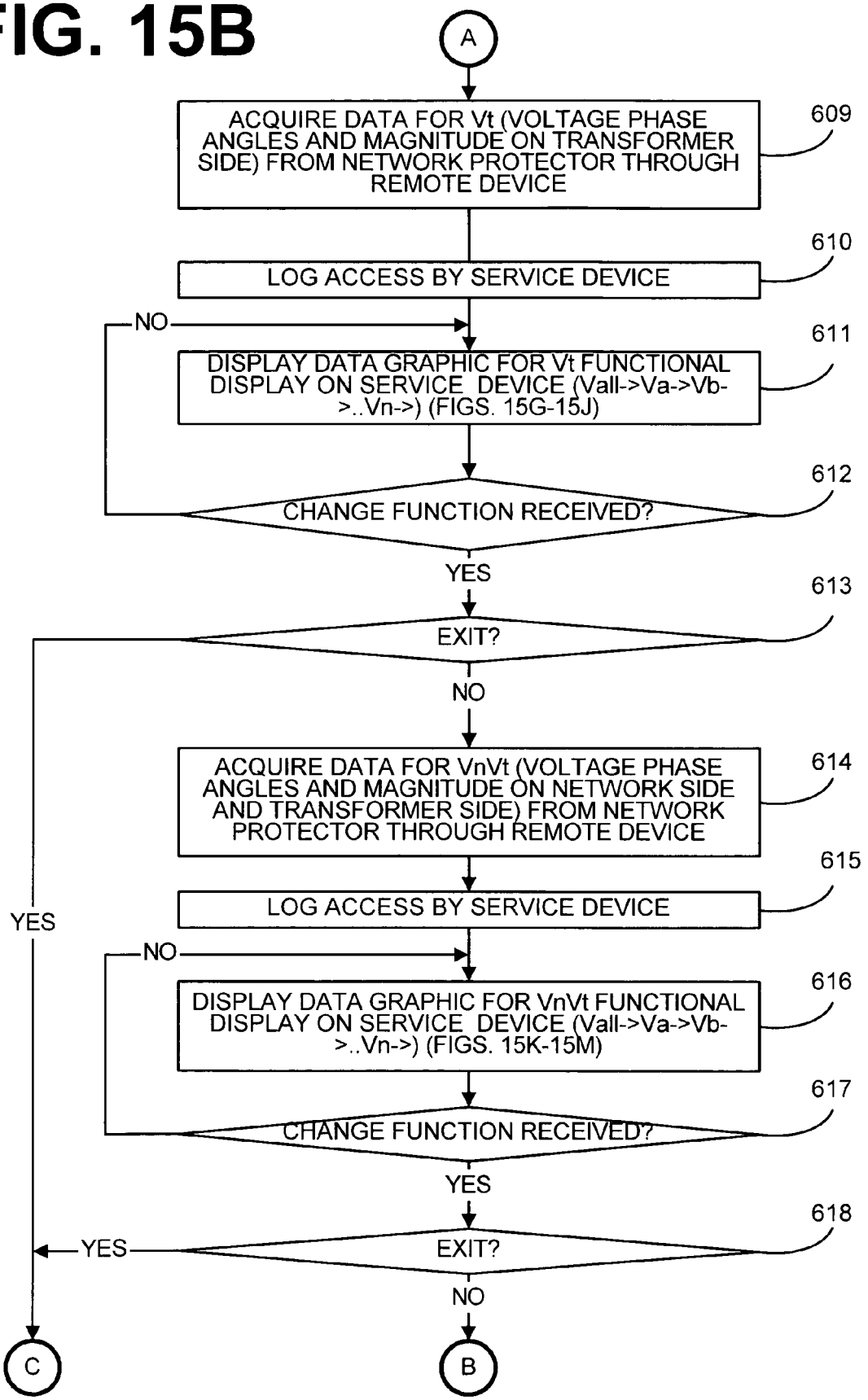
Figure 15C:
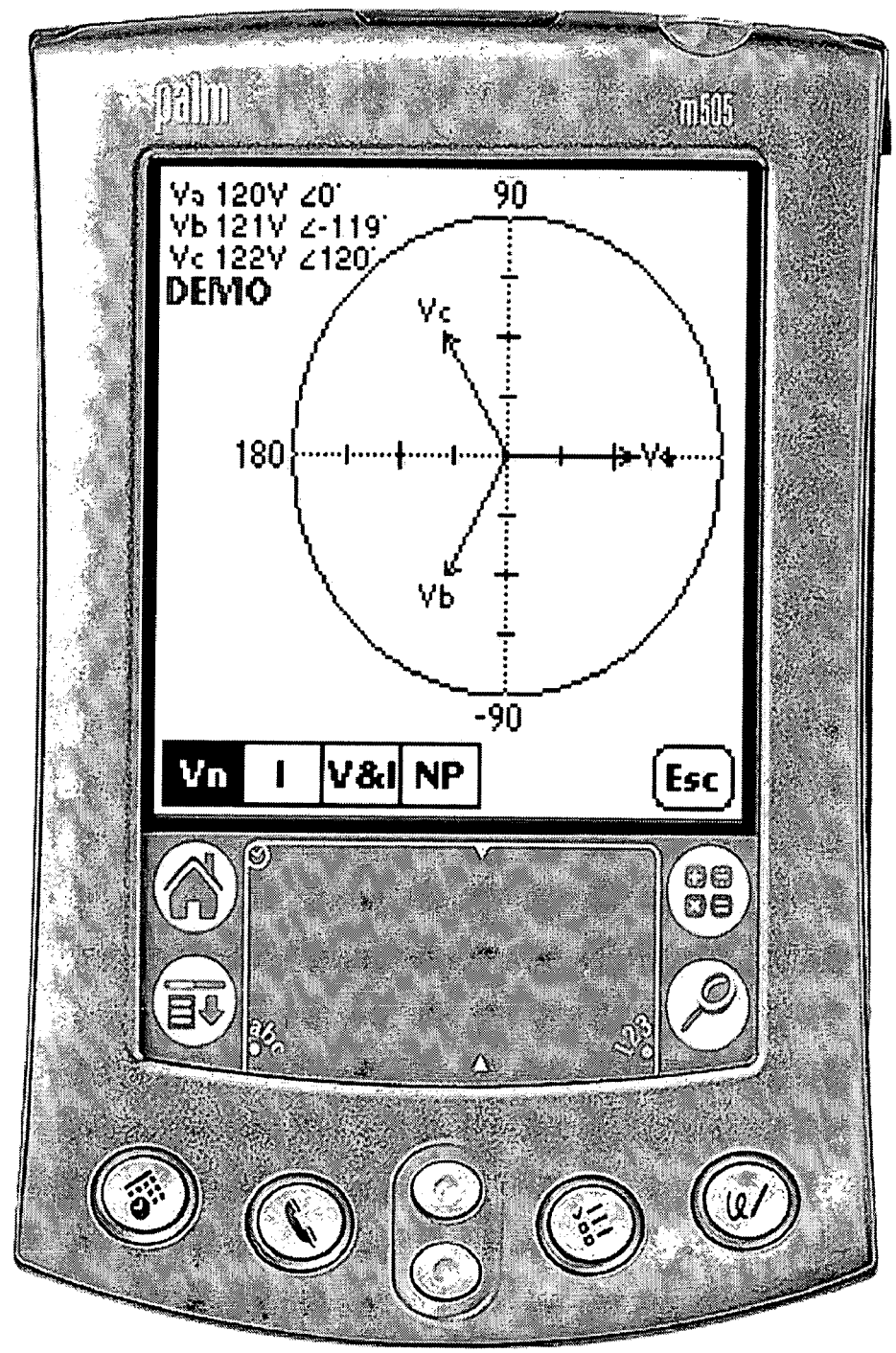
FIGS. 15C through 15M are examples of waveform information presented on a PDA that was received from the waveform process utilized by the remote power monitoring system of the present invention, as shown in FIGS. 15A and 15B.
Figure 15D:
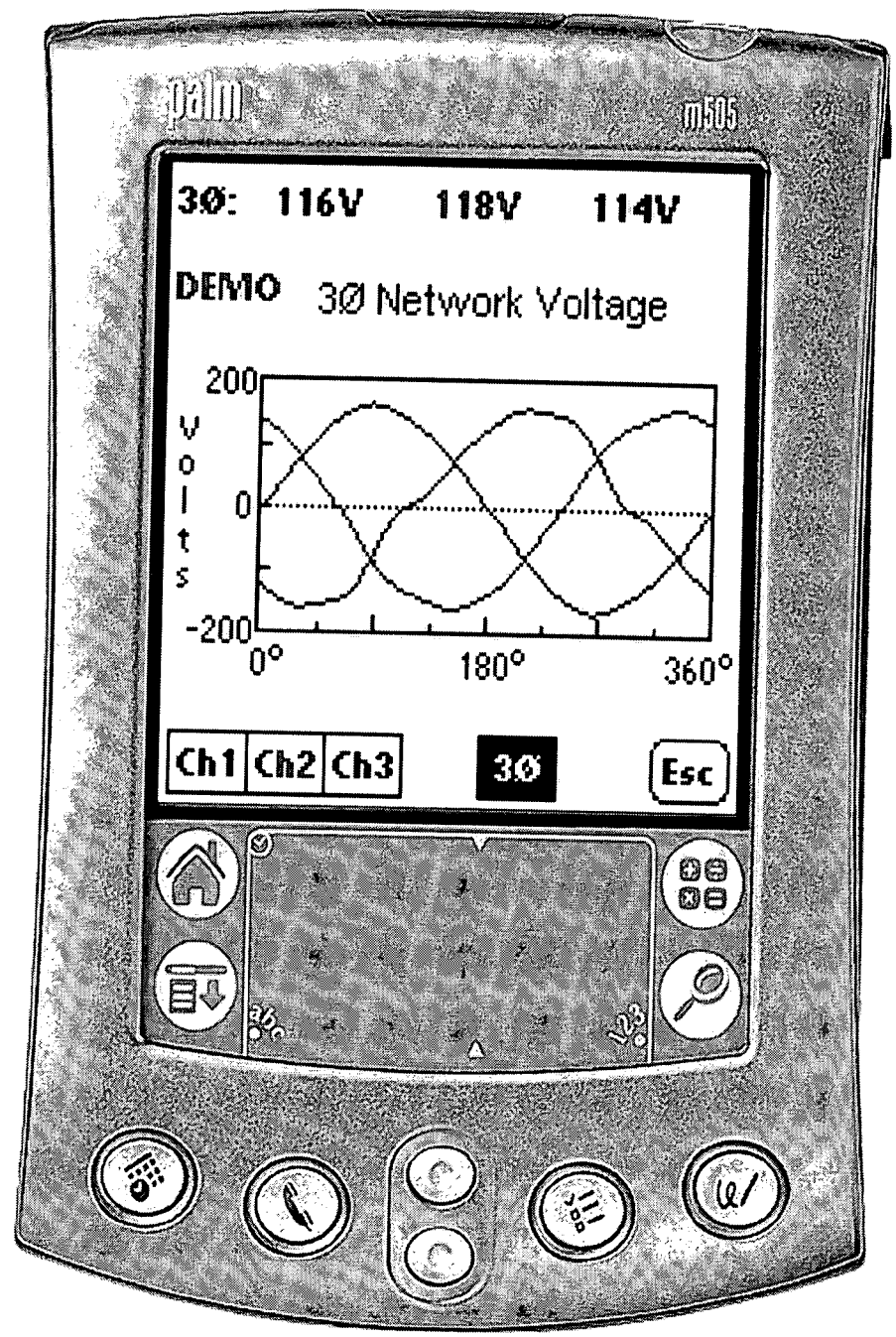
Figure 15E:
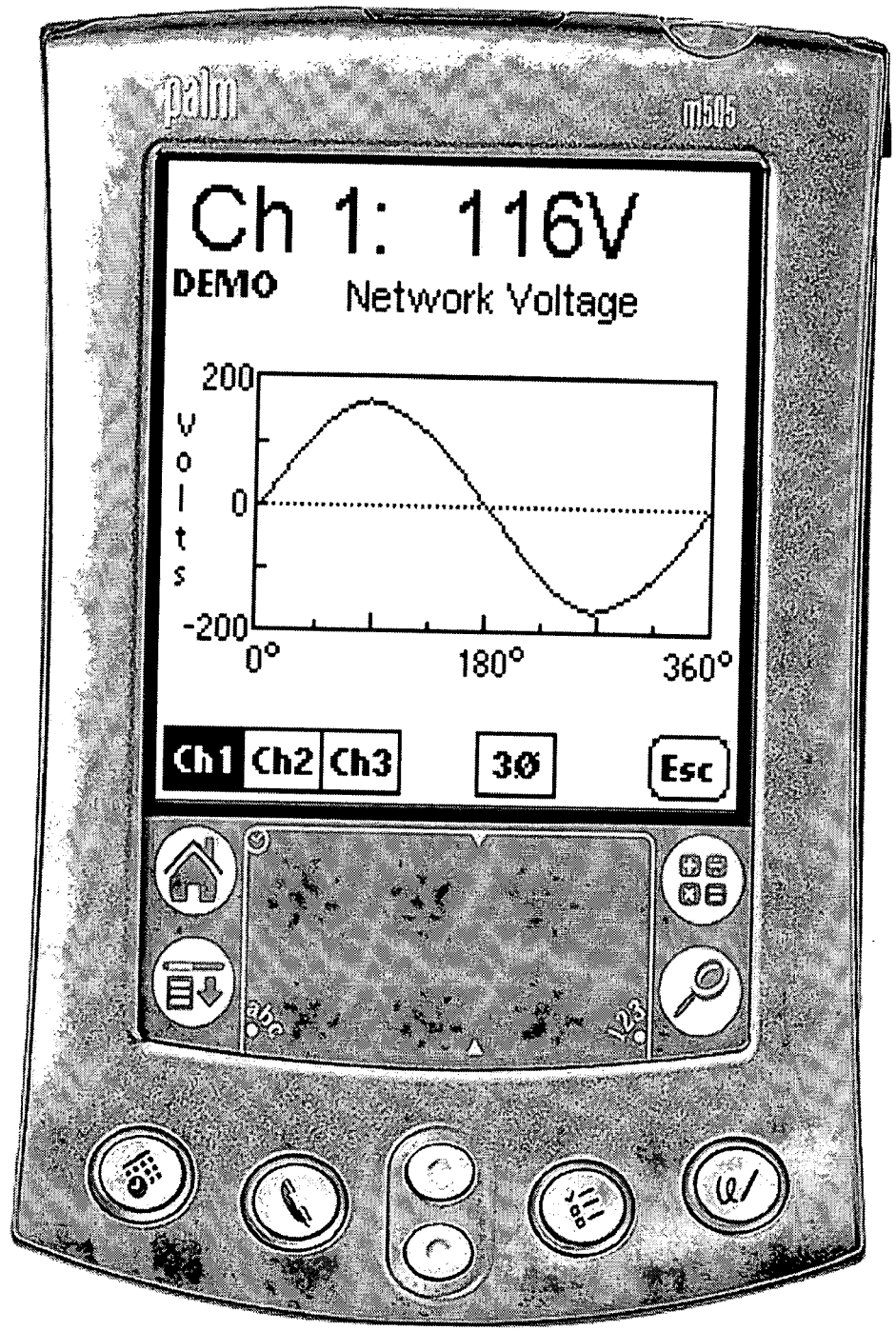
Figure 15F:
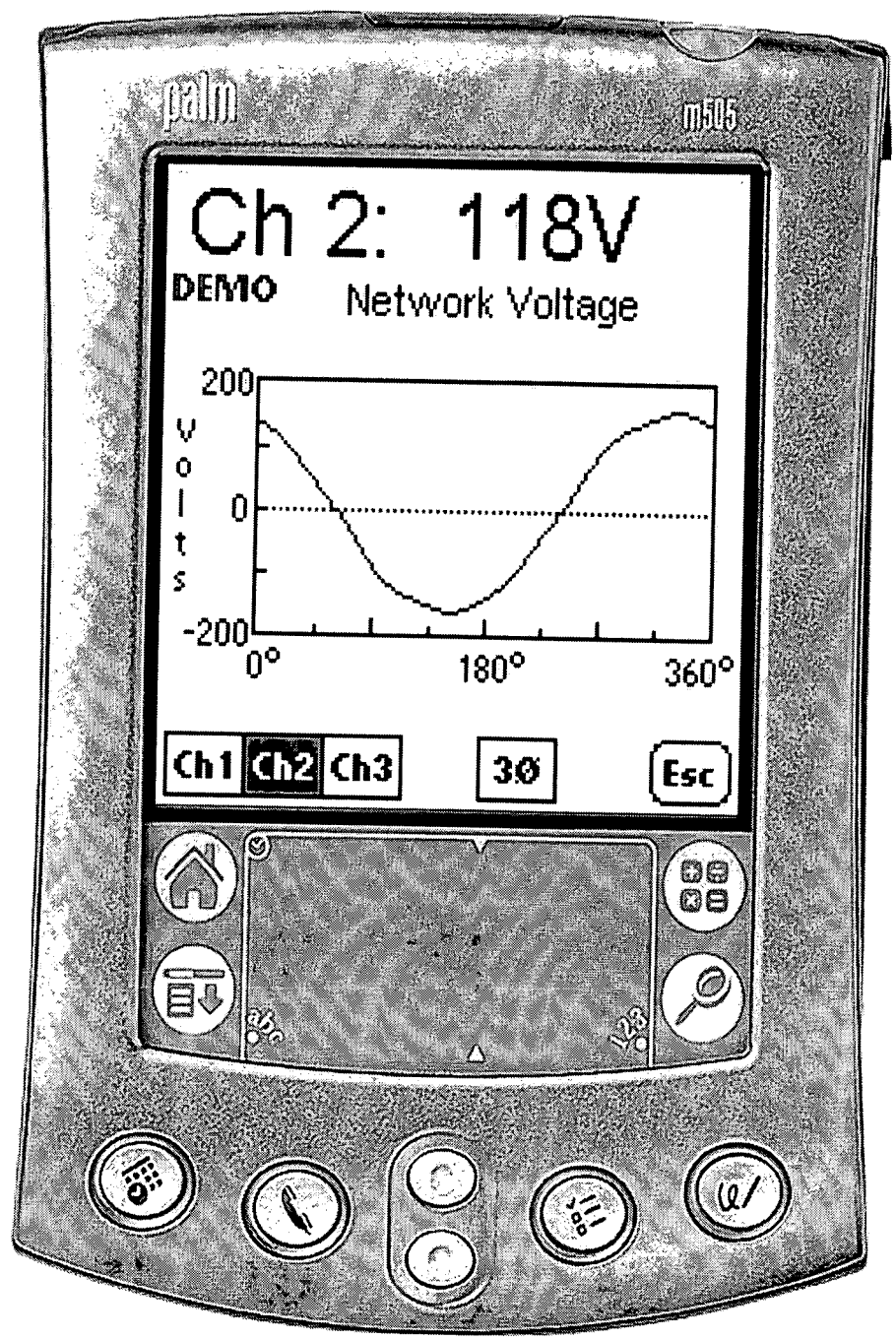
Figure 15G:
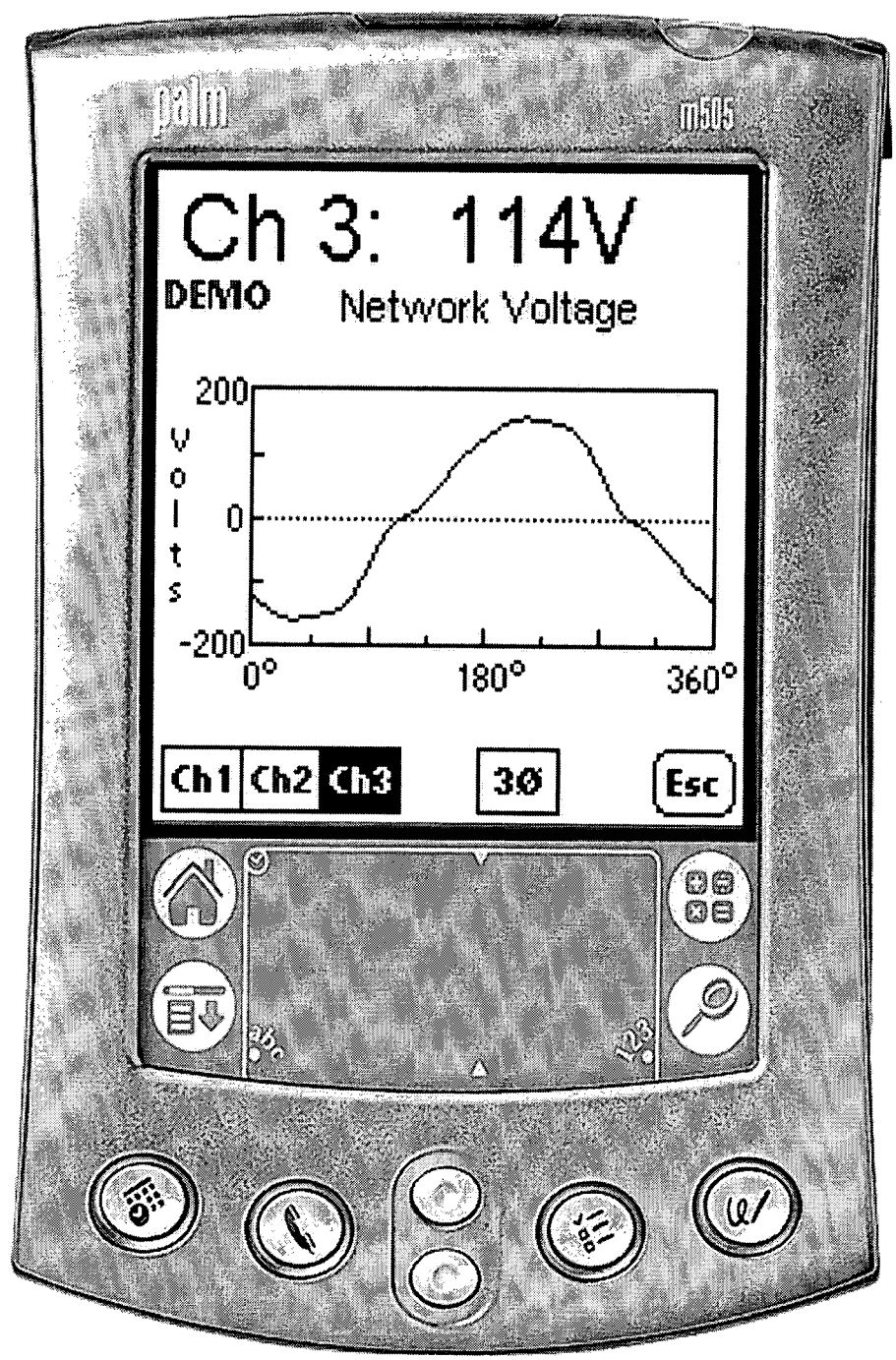
Figure 15H:
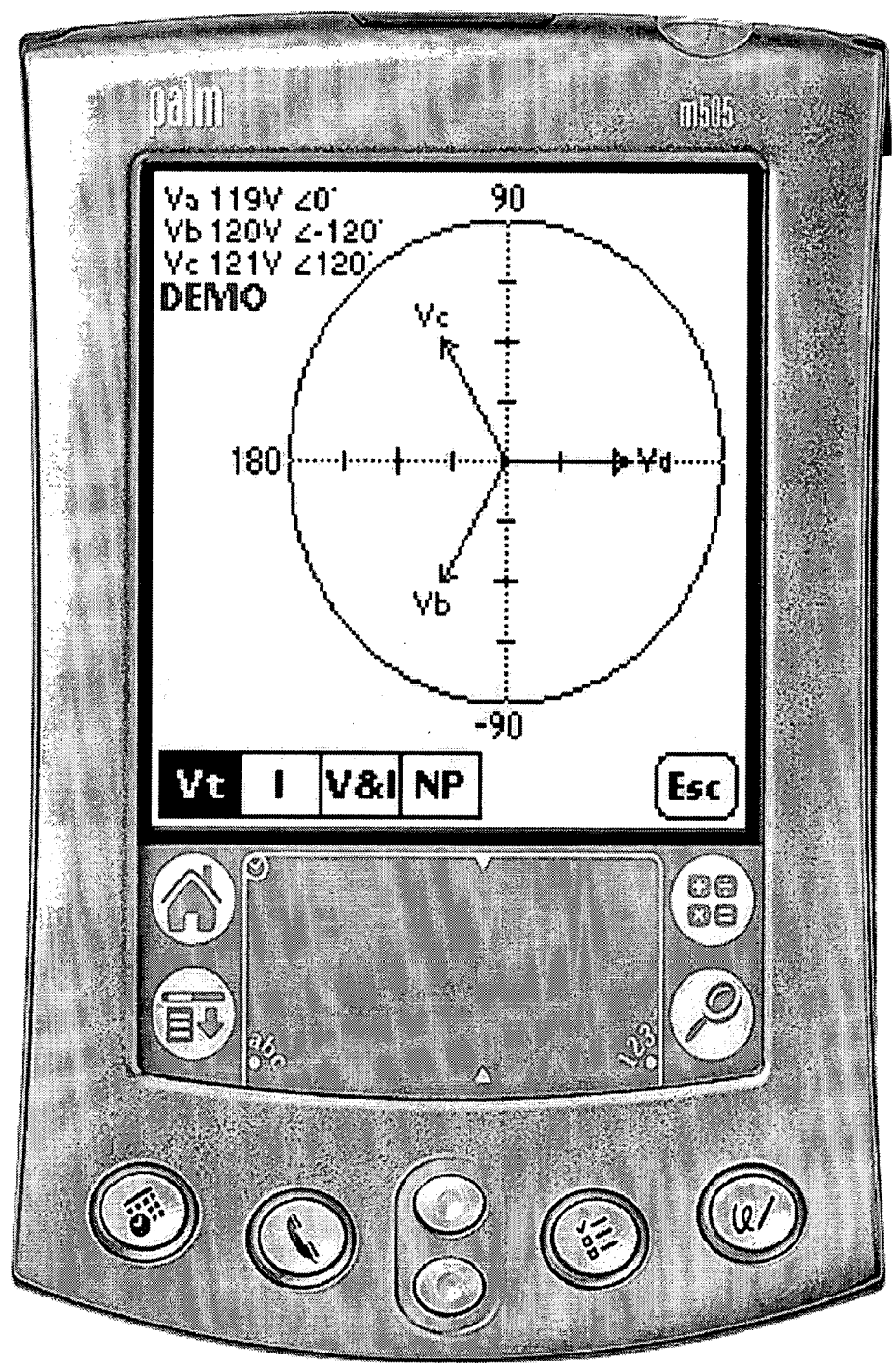
Figure 15I:
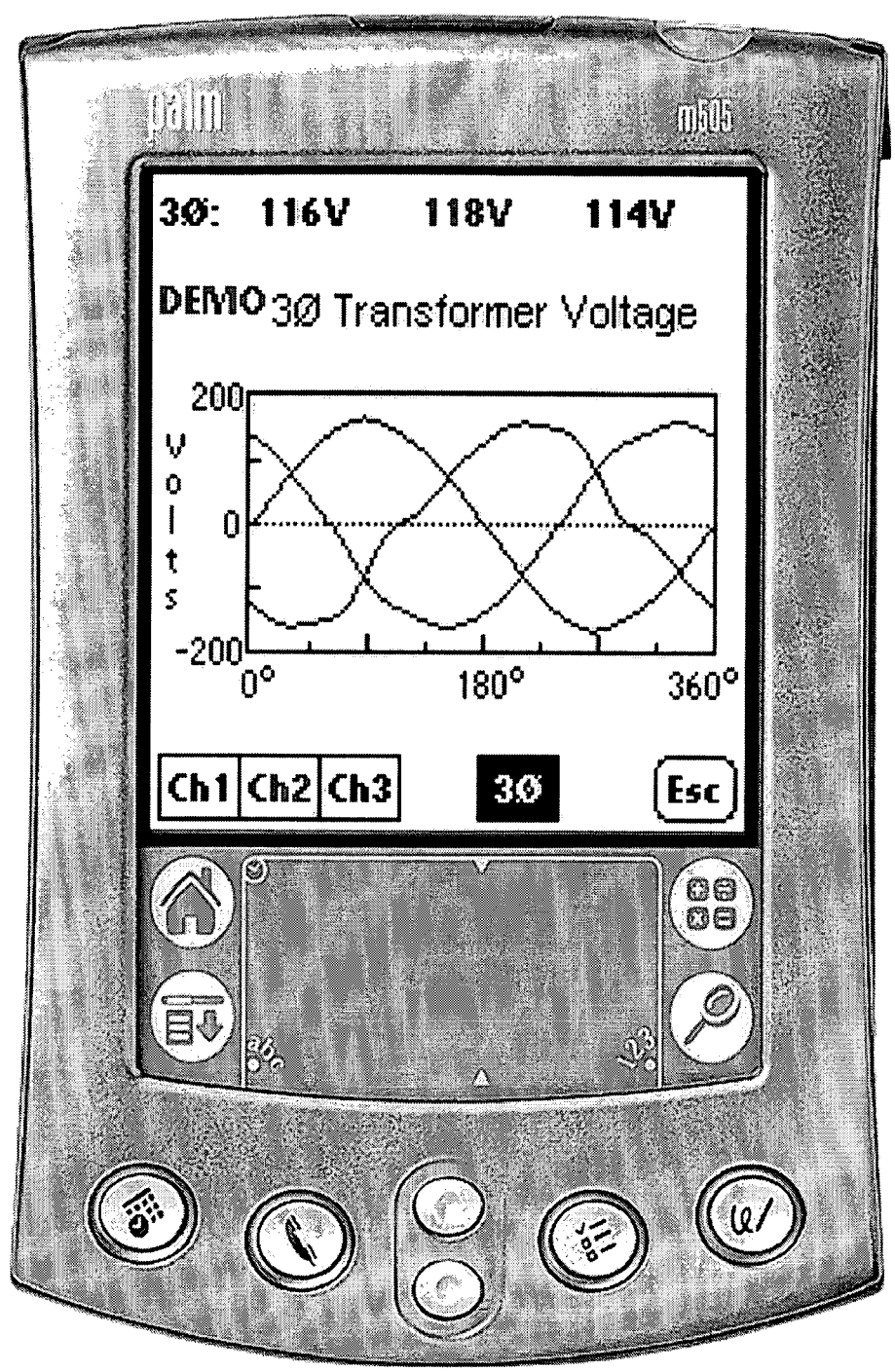
Figure 15J:
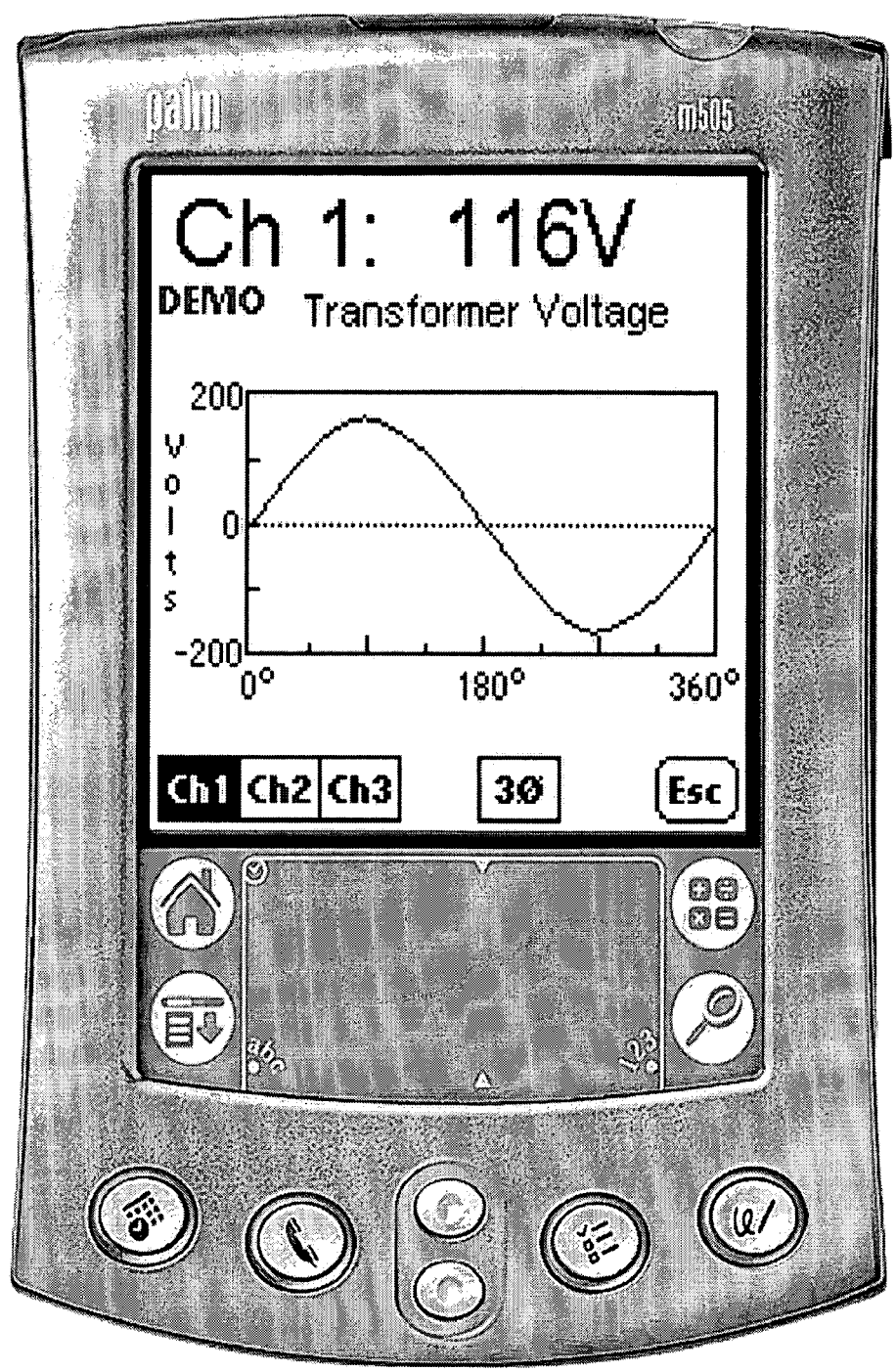
Figure 15K:
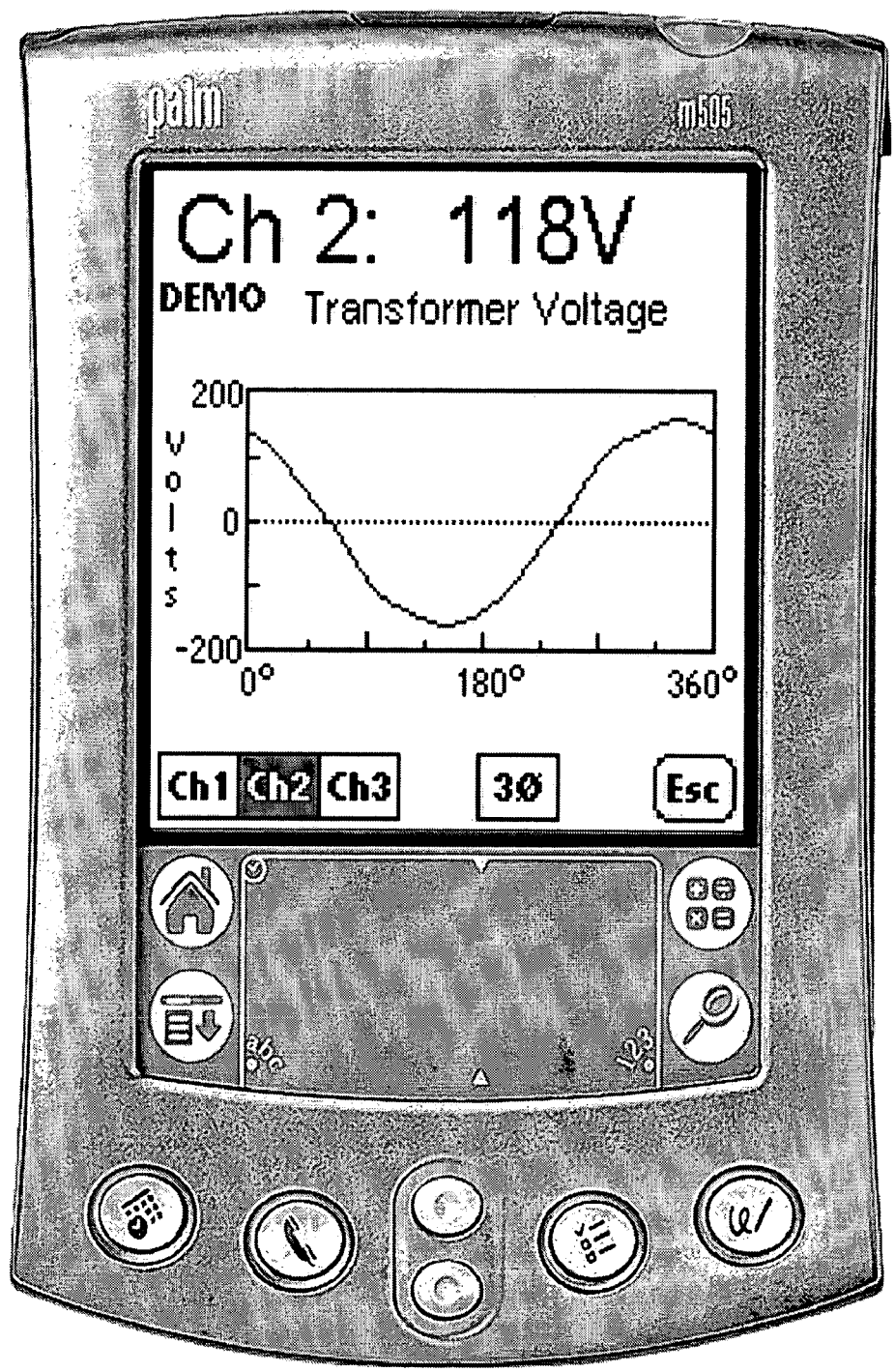
Figure 15L:
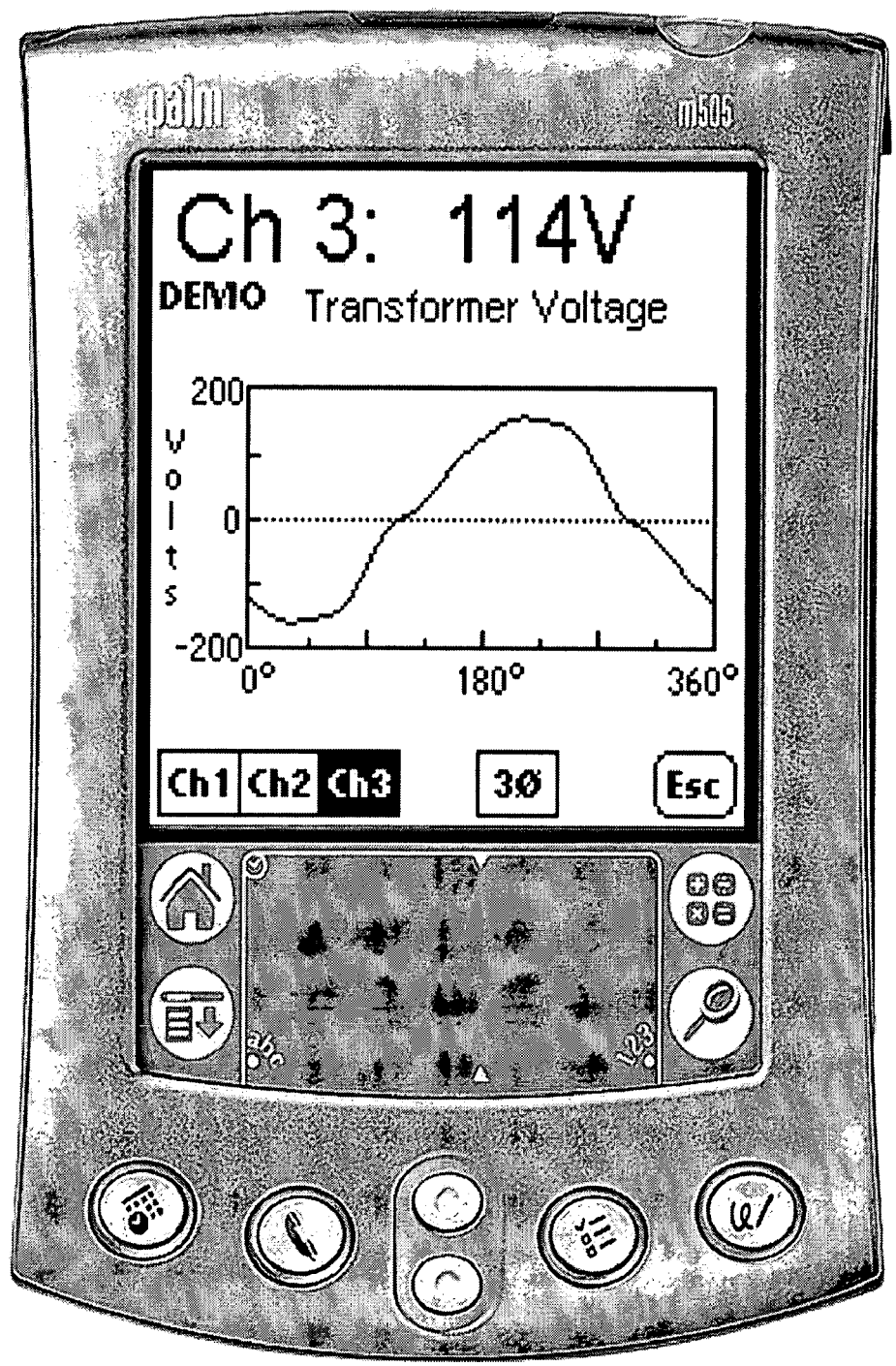

FIGS. 15A and 15B are flow charts illustrating an example of the operation of the waveform process 600 utilized by the remote power monitoring system 80 of the present invention, as shown in FIGS. 2A, 3A and 4A. The waveform process 600 enables a user to display many different types of waveforms or selected types of data. In the illustrated example, screenshots of network protector waveforms for the voltages at the network level, voltages at the transformer level and combined voltages of the network and transformer levelsllustrated in FIGS. 15C-15M. It is understood that other types of waveforms may be captured and analyzed for other power devices 7.

First at step 601, the waveform process 600 is initialized. This initialization includes the startup routines and processes embedded in the BIOS of the service device 11. The initialization also includes the establishment of data values for particular data structures utilized in the waveform process 600.

At step 602, the software key authentication is performed. The software key authentication is herein defined in further detail with regard to FIG. 17. The software key authentication is provided as a security means to prevent unauthorized access to the remote monitoring device 20 by unauthorized personnel.

At step 603, the establish communication link process is performed. The establish communication link process is herein defined in further detail with regard to FIG. 18A. The establish communication link process enables a user to poll for operational remote monitoring devices 20.

At step 604, the waveform process 600 then acquires data for the voltages on the network side of the power device 7 for the selected remote monitoring device 20. The network voltages may include both the phase angle and magnitude on the network side. This data is acquired from the power device 7 (i.e. the illustrated example is a network protector) through the remote device 20.

At step 605, the waveform process 600 then logs the access by the service device 11 to the network voltage data.

Figure 15M:
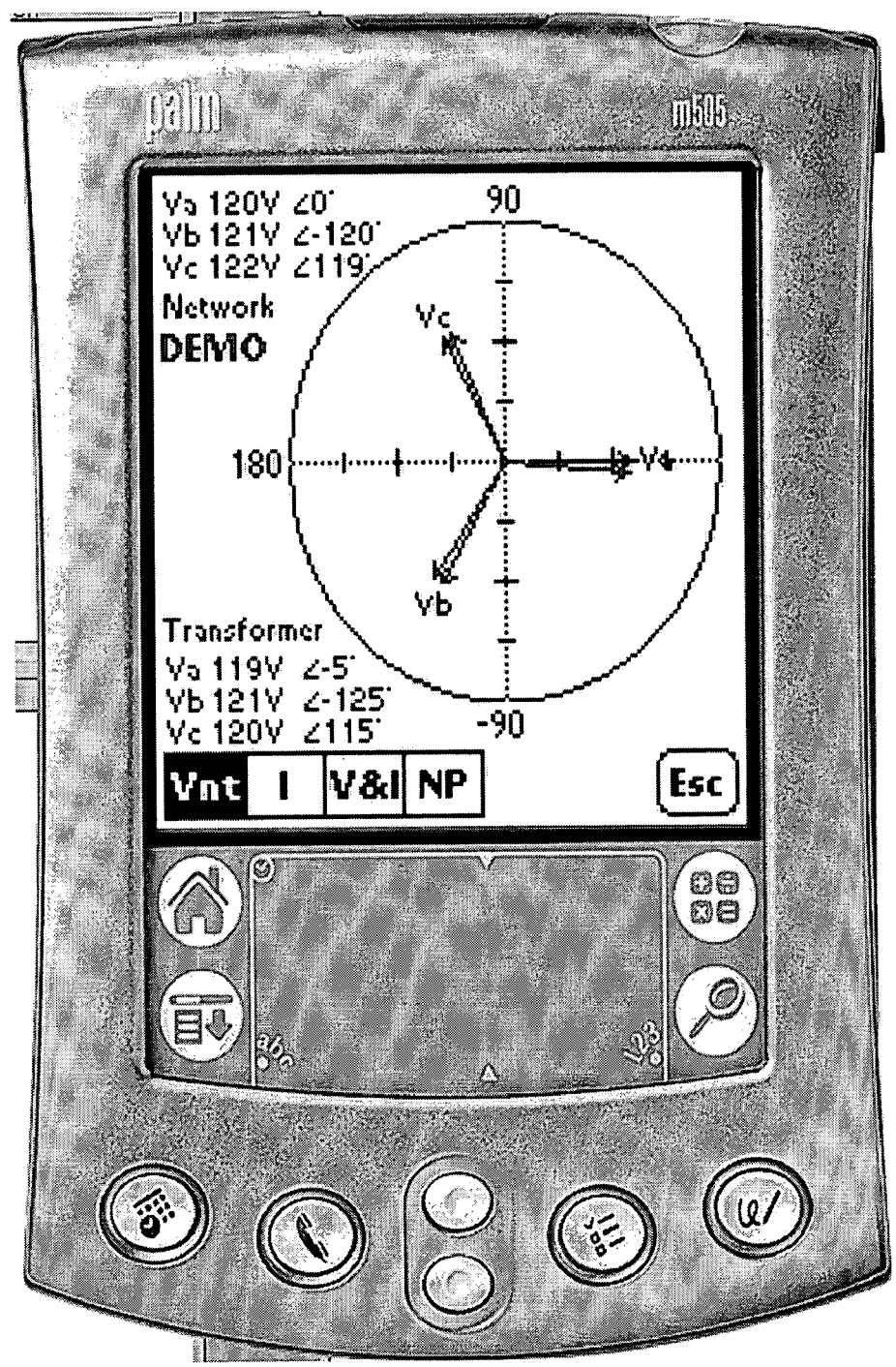

At step 606, the waveform process 600 displays the network voltage data on the service device 11. Examples of displays available are illustrated in FIGS. 15C through 15M. Preferably, these network and transformer voltages are displayed in sequential order in FIGS. 15C–15M, however, other schemes are considered. The network voltages are displayed in sequential order in FIGS. 15C–15G. The transformer voltages are displayed in sequential order in FIGS. 15H–15L. FIG. 15M illustrates a combination of the network and transformer voltages superimposed on the same graph.

At step 607, it is determined if a change function is received. If it is determined at step 607 that a change function was not received, the waveform process 600 then returns to repeat step 606 and display other network side voltages.

However, if it is determined at step 607 that a change function was received, the waveform process 600 determines if the function received is an exit function at step 608.

If it is determined at step 608 that the function received was an exit request, then the waveform process 600 exits at step 619. However, if it is determined at step 608 that an exit request was not received, then the waveform process 600 proceeds to step 609 to acquire data for the voltage on the transformer side of the network protector. This voltage data on the transformer side includes both the phase angle and/or magnitude. This data is acquired from the network protector through the remote device 20.

At step 610, the waveform process 600 logs the access by the service device 11 to the transformer voltage data. At step 611, the waveform process 600 displays the transformer voltage data on the service device 11. Examples of displays vailable are illustrated in FIGS. 15H through 15L.

At step 612, it is determined if a change function is received. If it is determined at step 612 that a change function was not received, then the waveform process 600 then returns to repeat step 611 and display other transformer side voltages. However, if it is determined at step 611 that a change function was received, the waveform process 600 determines if the function received is an exit function at step 613.

If it is determined at step 613 that the function received was an exit request, then the waveform process 600 exits at step 619. However, if it is determined at step 613 that an exit request was not received, then the waveform process 600 then proceeds to step 614 to acquire data for the voltage on the network and transformer side of the network protector. This voltage data on the network and transformer side includes both the phase angle and magnitude. This data is acquired from the network protector through the remote device 20.

At step 615, the waveform process 600 logs the access by the service device I to the network and transformer voltage data. At step 616, the waveform process 600 displays the network and transformer voltage data on the service device 11. FIG. 15M illustrates a combination of the network and transformer voltages superimposed on the same graph.

At step 617, it is determined if a change function is received. If it is determined at step 617 that a change function was not received, then the waveform process 600 then returns to repeat step 616 and display other network and/or transformer side voltages. However, if it is determined at step 617 that a change function was received, the waveform process 600 determines if the function received is an exit function at step 618.

If it is determined at step 618 that the function received was an exit request, then the waveform process 600 exits at step 619. However, if it is determined at step 618 that an exit request was not received, then the waveform process 600 then proceeds to step 604 to acquire data for the voltage on the network side of the network protector.

Figure 16A:
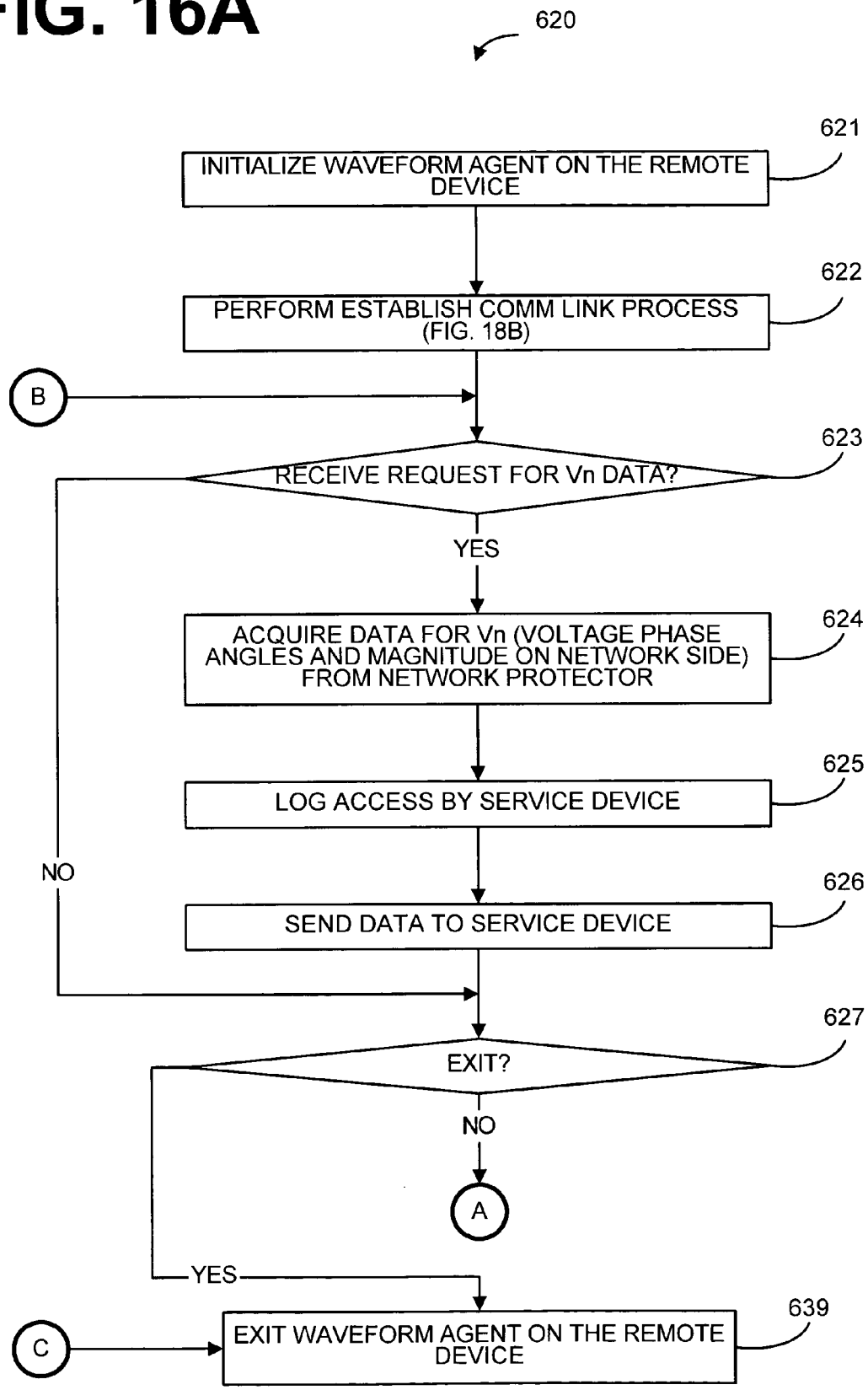
FIGS. 16A and 16B are flow charts illustrating an example of the operation of the waveform agent utilized in the remote monitoring device and utilized by the remote power monitoring system of the present invention, as shown in FIGS. 2B, 3B, 3C and 4B.
Figure 16B:
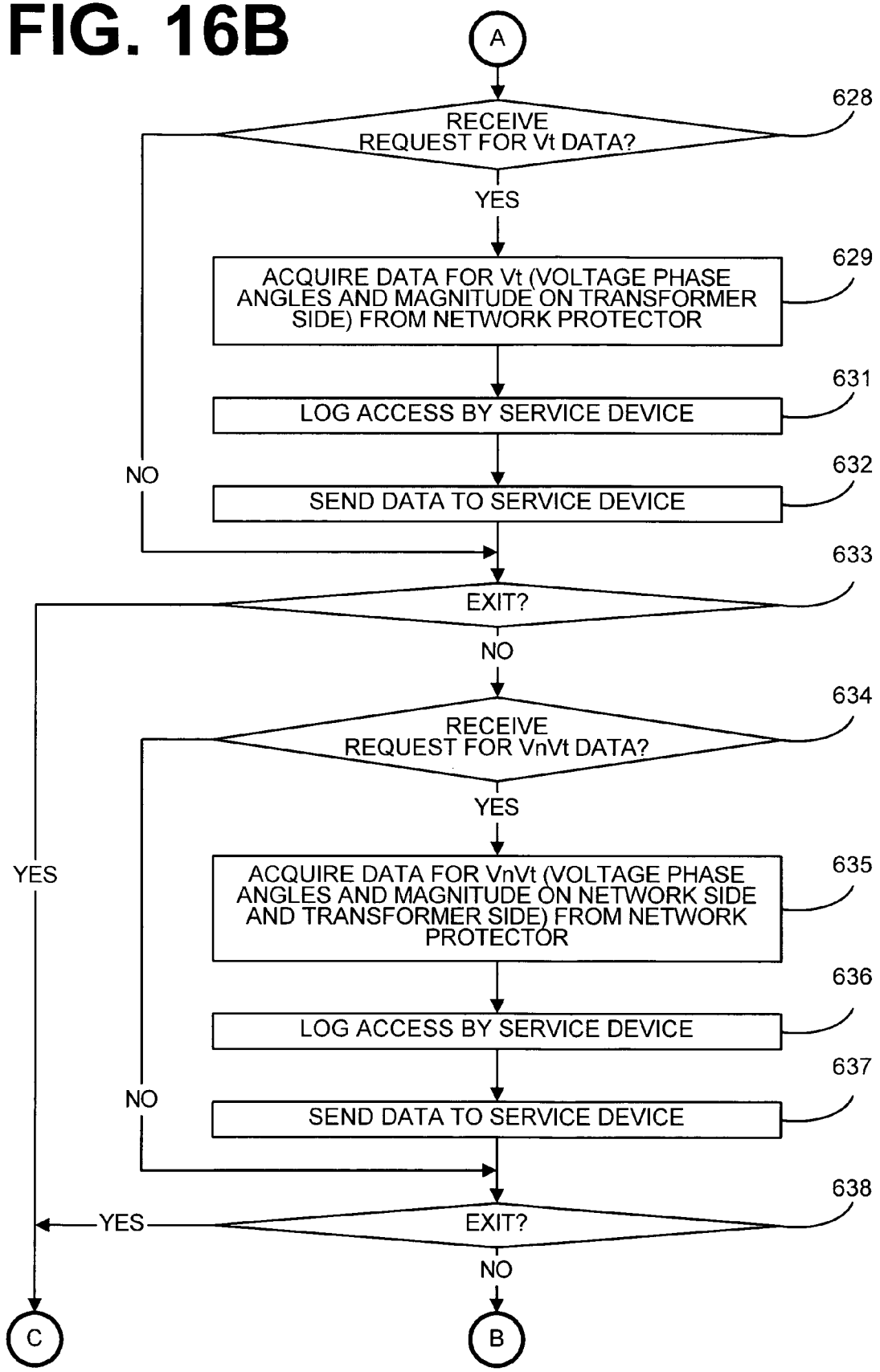

FIGS. 16A and 16B are flow charts illustrating an example of the operation of the waveform agent 620 utilized in the remote monitoring device 20 by the remote power monitoring system 100 of the present invention, as shown in FIGS. 2B, 3B, 3C and 4B. Waveform agent 620 receives requests from the waveform process 600 on the service device 11 for different types of waveform information for connected power devices 7.

First at step 621, the waveform agent 620 is initialized. This initialization includes the startup routines and processes embedded in the BIOS of the remote monitoring device 20. The initialization also includes the establishment of data values for particular data structures utilized in the waveform agent 620.

At step 622, the establish communication link agent is performed. The establish communication link agent is herein defined in further detail with regard to FIG. 18B. The establish communication link agent enables a user to poll for operational remote monitoring devices 20.

At step 623, the waveform agent 620 then acquires data for the voltages on the network side of the selected power device for the service device 11. In the illustrated example, the power device 7 is a network protector. The network voltages include both the phase angle and magnitude on the network side.

At step 625, the waveform agent 620 logs the access by the service device 11 to the network voltage data. At step 626, the waveform agent 620 sends the network voltage data to the service device 11. As stated previously, there are a number of communication links that can be utilized to perform this task. These links include, but are not limited to, Bluetooth, WiFi, cellular, optical, satellite, RF, POTS, Ethernet, LAN, WAN, magnetic induction, coax, RS-485, INCOM, SCADA or the like.

At step 627, it is determined if the function received is an exit function. If it is determined at step 627 that the function received was an exit request, then the waveform agent 620 exits at step 639. However, if it is determined at step 627 that an exit requests was not received, then the waveform agent 620 determines if it received a request for voltages on the transformer side of the network protector at step 628. If it is determined at step 628 that a request for transformer side voltages was not received, then the waveform agent 620 proceeds to step 633. However, if it is determined that a request for transformer side voltages was received then the waveform agent 620 acquires data for the voltage on the transformer side of the network protector. This voltage data on the transformer side includes both the phase angle and magnitude.

At step 631, the waveform agent 620 logs the access to the transformer voltage data by the service device 11. At step 632, the waveform agent 620 sends the transformer voltage data to the service device 11. As stated previously, there are a number of communication links that can be utilized to perform this task. These links include, but are not limited to, Bluetooth, WiFi, cellular, optical, satellite, RF, POTS, Ethernet, LAN, WAN, magnetic induction, coax, RS-485, INCOM, SCADA or the like.

At step 633, it is determined if the function received is an exit function. If it is determined at step 633 that the function received was an exit request, then the waveform agent 620 exits at step 639. However, if it is determined at step 633 that an exit requests was not received, then the waveform agent 620 determines if it received a request for voltages on the network and transformer side of the network protector at step 634.

If it is determined at step 634 that a request for transformer side voltages was not received, then the waveform agent 620 proceeds to step 638. However, if it is determined that a request for transformer side voltages was received then the waveform agent 620 acquires data for the voltage on the transformer side of the network protector. This voltage data on the network and transformer side includes both the phase angle and magnitude. At step 636, the waveform agent 620 logs the access by the service device 11 to the network and transformer voltage data. At step 636, the waveform agent 620 sends the network and transformer voltage data to the service device 11.

At step 638, it is determined if the exit function was received. If it is determined at step 638 that the function received was an exit request, then the waveform agent 620 exits at step 639. However, if it is determined at step 638 that an exit request was not received, then the waveform agent 620 then proceeds to step 623 to acquire data for the voltage on the network side of the network protector.

Figure 17:
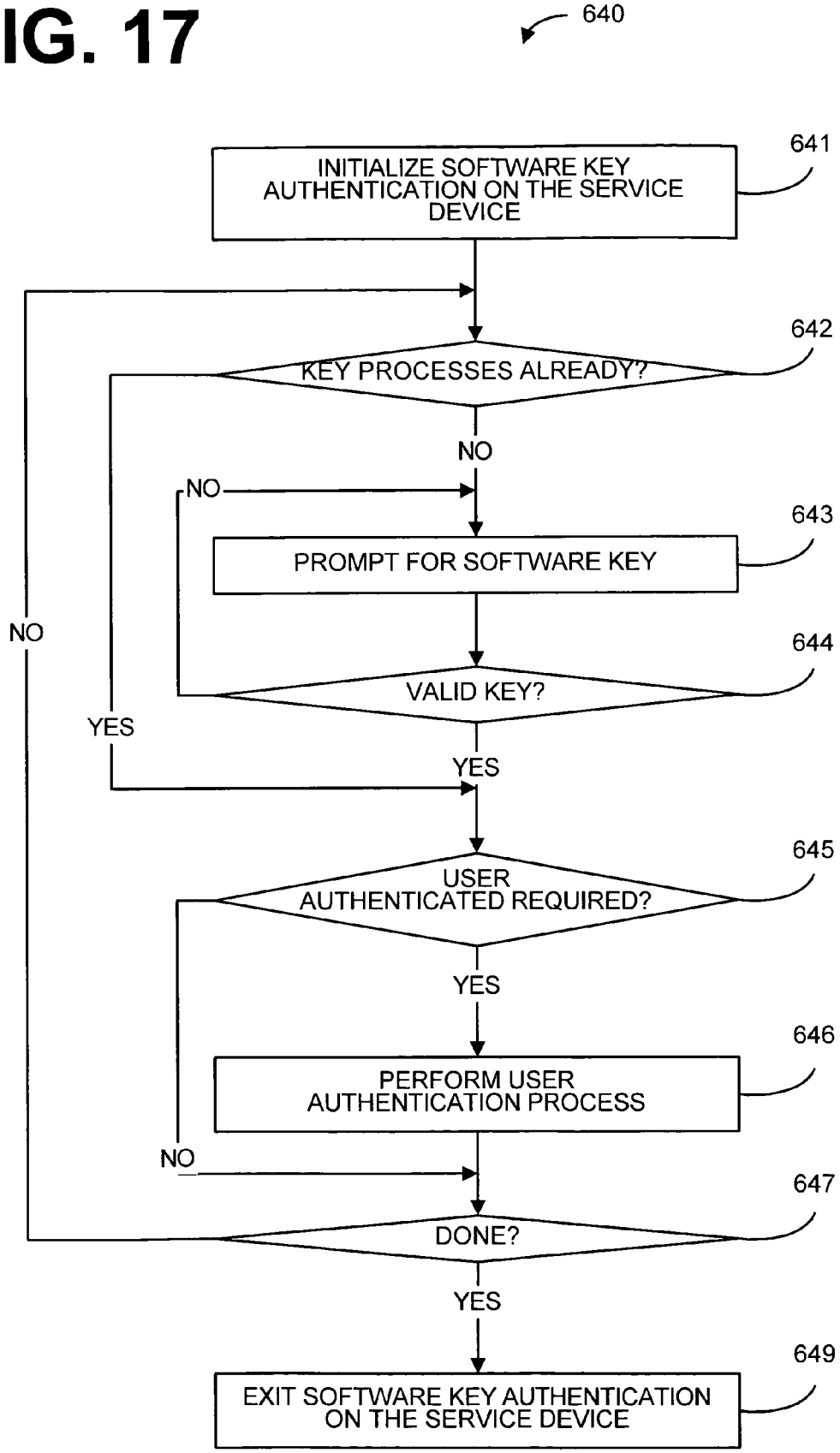
FIG. 17 is a flow chart illustrating an example of the operation of the software key authentication process utilized by the remote power monitoring system of the present invention, as shown in FIGS. 2A, 3A and 4A.

FIG. 17 is a flow chart illustrating an example of the operation of the software key authentication process 640 utilized by the remote power monitoring system of the present invention, as shown in FIGS. 2A, 3A and 4A. The software key authentication process 640 enables the service device 11 to determine if an authentication key has already been processed for access to the software. The software key authentication process 640 also allows user authentication as well.

First at step 641, the software key authentication process 640 is initialized. This initialization includes the startup routines and processes embedded in the BIOS of the service device 11. The initialization also includes the establishment of data values for particular data structures utilized in the software key authentication process 640.

At step 642, it is determined if the software key has already been processed. If it is determined at step 642 that the software key has already been processed, then the software key authentication process 640 proceeds to step 645. However, if it is determined at step 642 that the software key has not been processed, then the software key authentication process 640 prompts the user for a software key at step 643.

At step 644, the software key authentication process 640 determines if the user input a valid software key. If it is determined at step 644 that the user did not input a valid software key, then the software key authentication process 640 returns to repeat step 643. However if it is determined at step 644 that a valid key was processed then the software key authentication process 640 determines if user authentication is required at step 645.

If it is determined at step 645 that the user authentication is not required, the software key authentication process 640 proceeds to step 647. However, if it is determined that user authentication is required, then the user authentication is performed to step 646. This authentication process may include but is not limited to, password authentication, thumbprint of authentication, ID card, other biological authentication means, or other forms of inputting data into a computer system. In the preferred embodiment, the employer of the user provides a password key recognizable by the remote monitoring device 20.

At step 647, the software key authentication process 640 determines if there is more authentication to be performed. If it is determined at step 647 that additional authentication is required, then the software key authentication process 640 returns to repeat step 642 through 647. However, if it is determined at step 647 that no additional authentication is required, then the software key authentication process exits at step 649.

Figure 18A:
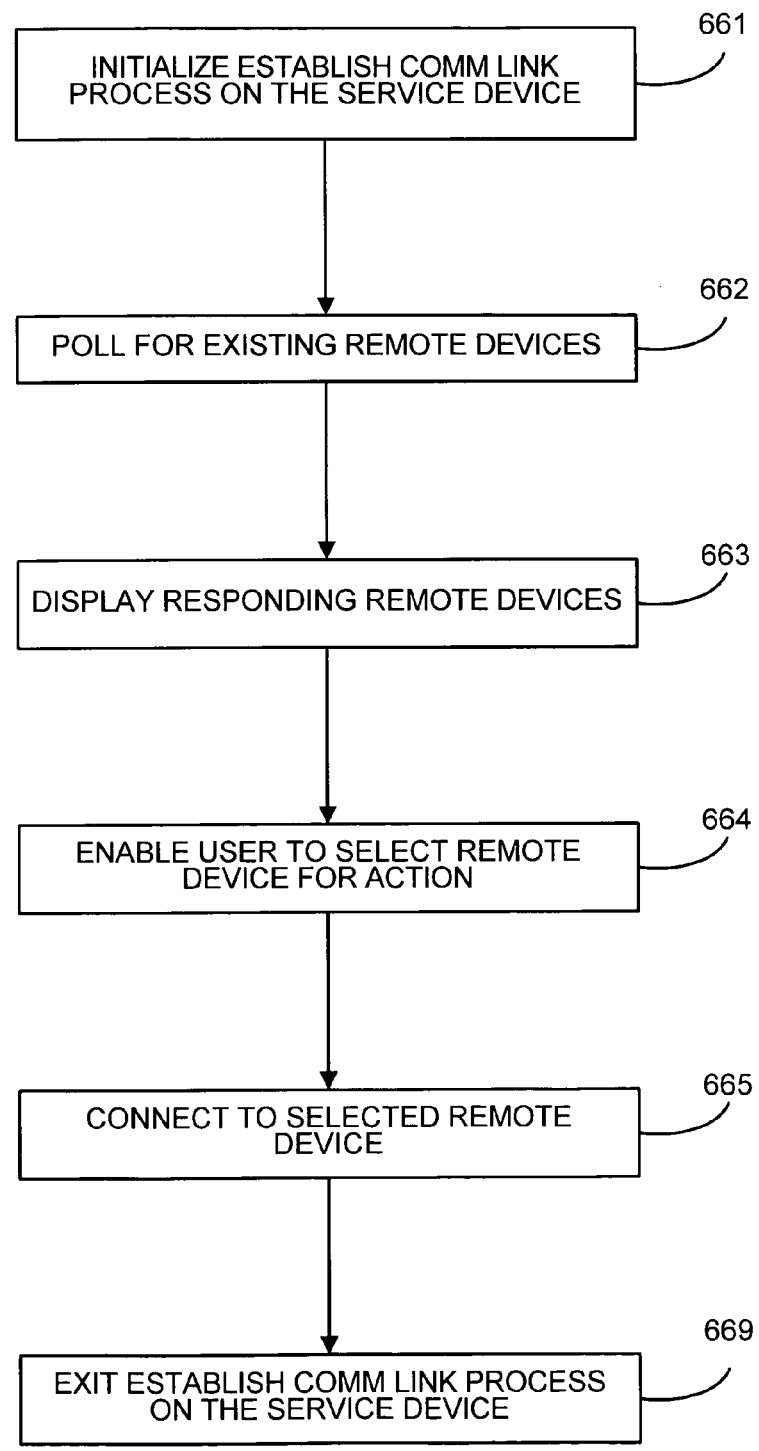
FIG. 18A is a flow chart illustrating an example of the operation of the establish communication link to process utilized by the remote power monitoring system of the present invention, as shown in FIGS. 2A, 3A and 4A.

FIG. 18A is a flow chart illustrating an example of the operation of the establish communication link process 660 utilized by the remote power monitoring system 80 of the present invention, as shown in FIGS. 2A, 3A and 4A. The establish communication link process 660 enables a user to determine which remote monitoring devices 20 are within communication range and then enables the user to select a particular remote devices 20. In the preferred embodiment, a list of remote monitoring devices 20 within range are listed on service device 11. The user then can then select the desired remote monitoring device 20 in which to connect.

First at step 661, the establish communication link process 660 is initialized. This initialization includes the startup routines and processes embedded in the BIOS of the service device 11. The initialization also includes the establishment of data values for particular data structures utilized in the establish communication link process 660.

At step 662, the establish communication link process 660 polls for existing remote devices 20. This polling will enable any operating remote devices 20 to respond if it is within communication range. The remote devices 20 responding to the poll are then displayed on the service device 11 at step 663. This is to notify the user of which remote devices 20 are currently operating and available.

At step 664, the user is prompted to select a particular remote devices 20 in which to connect. At step 665, the service device connects to the selected remote device 20. The establish communication link process 660 then exits at step 669.

Figure 18B:
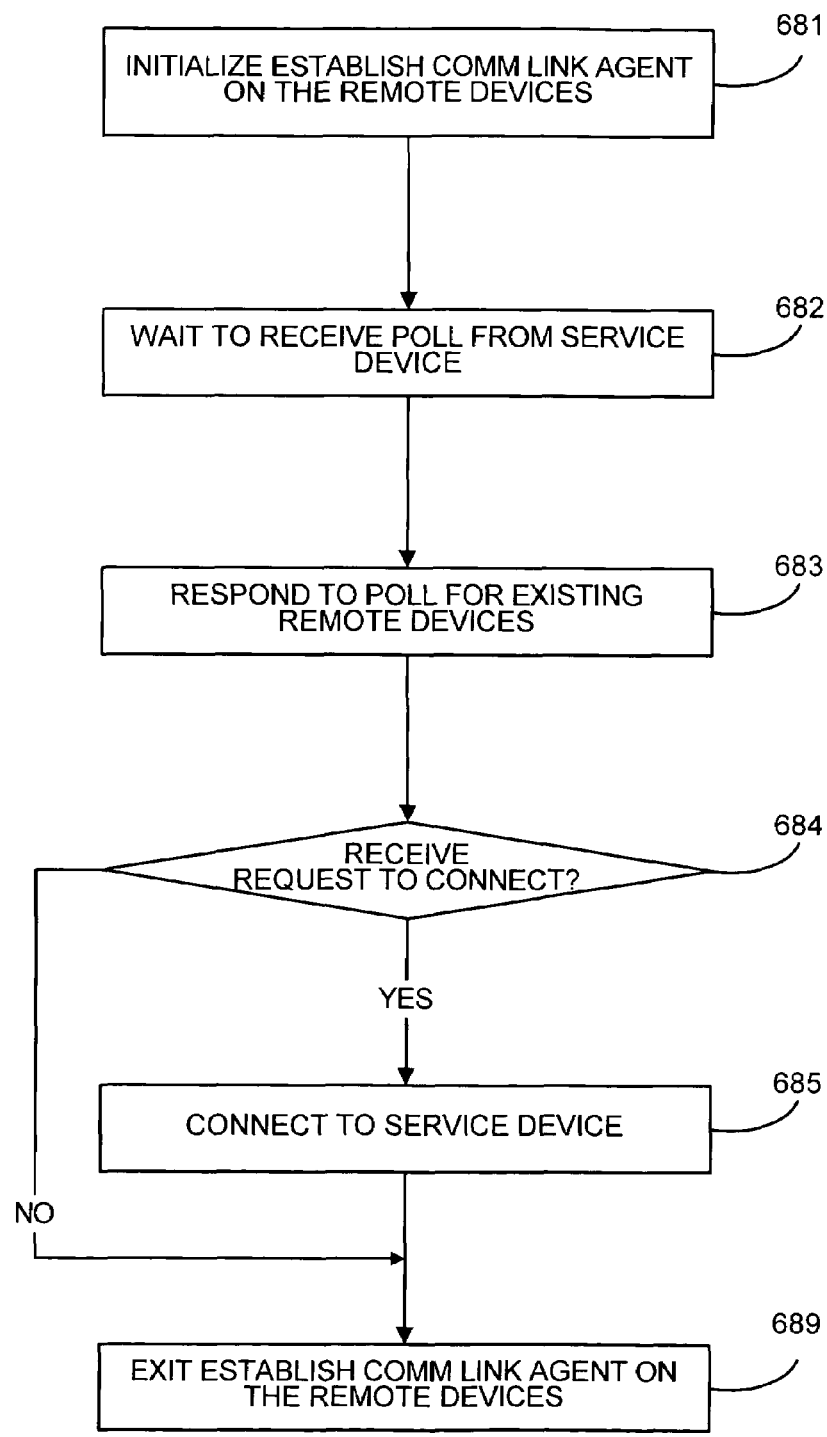
FIG. 18B is a flow chart illustrating an example of the operation of the establish communication link agent utilized in the remote monitoring device and utilized by the remote power monitoring system of the present invention, as shown in FIGS. 2B, 3B, 3C and 4B.

FIG. 18B is a flow chart illustrating an example of the operation of the establish communication link agent utilized in the remote monitoring device and utilized by the remote power monitoring system of the present invention, as shown in FIGS. 2B, 3B, 3C and 4B. The establish communication link agent 680 resides on the remote device 20 and waits to be activated by receiving a polling message from a service device 11.

First at step 681, the establish communication link agent 680 is initialized. This initialization includes the startup routines and processes embedded in the BIOS of the remote monitoring device 20. The initialization also includes the establishment of data values for particular data structures utilized in the establish communication link agent 680.

At step 682, the establish communication link agent 680 waits to receive a poll communication. The poll communication will prompted the remote device 20 to send an identification message to the service device 11. At step 683, the establish communication link agent 680 responds to a poll for existing remote devices 20.

At step 684, it is determined if the particular remote monitoring device 20 received a request to connect. If it is determined at step 684 that a request to connect has not been received within a reasonable time period, then the establish communication link agent 680 exits at step 669. However, if it is determined within a reasonable time that a request to connect was received, then the establish communication link agent 680 connects to the service device 11 at step 685 and exits at step 669.

Figure 19A:
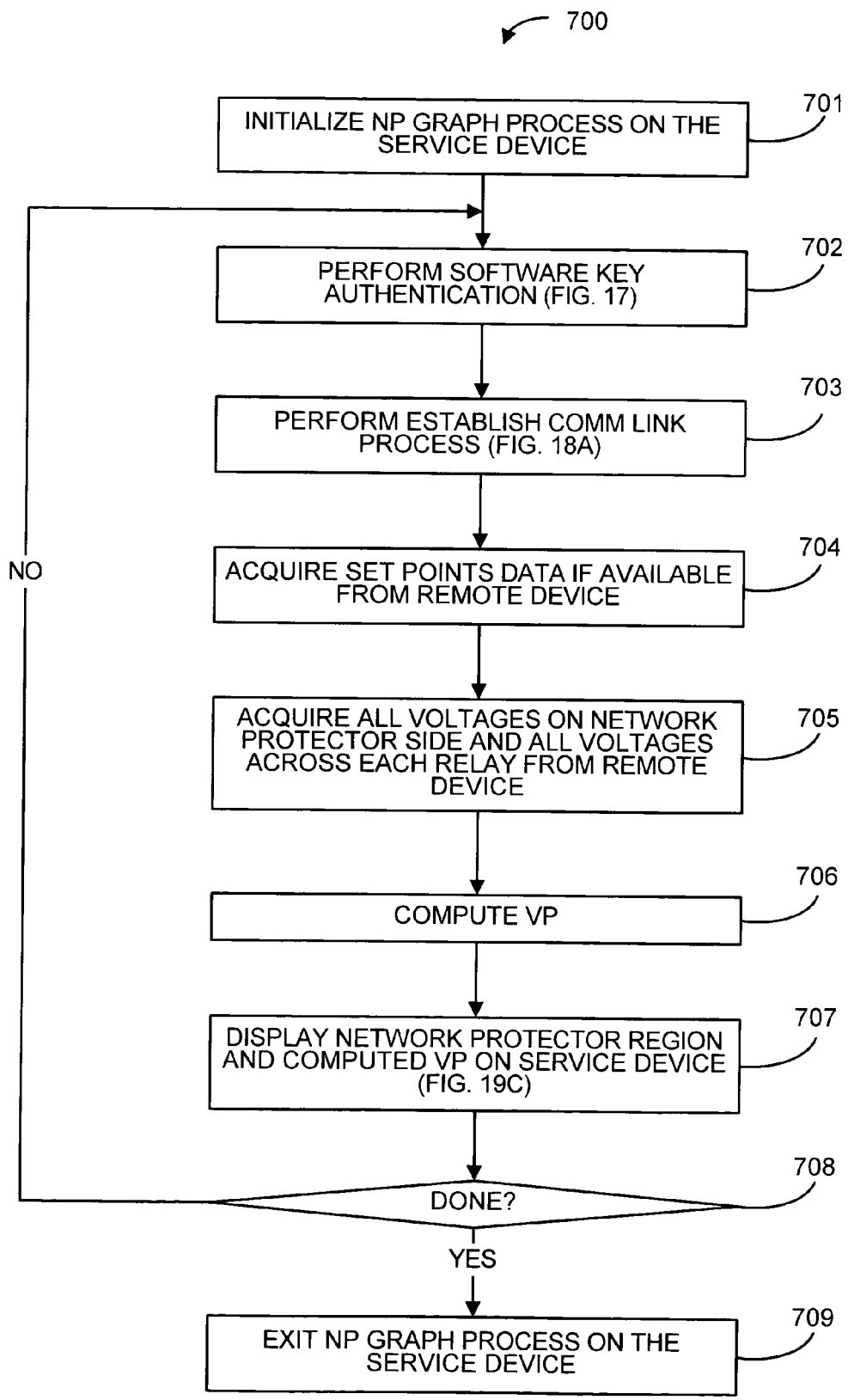
FIG. 19A is a flow chart illustrating an example of the operation of the NP graph process utilized by the remote power monitoring system of the present invention, as shown in FIGS. 2A, 3A and 4A.

FIG. 19A is a flow chart illustrating an example of the operation of the NP graph process 700 utilized by the remote power monitoring system 80 of the present invention, as shown in FIGS. 2A, 3A and 4A. In the flow chart illustrating example of the NP graph process 700, network protector information is utilized in the graphing function. It is understood that other types of information from other power devices 7 may be analyzed by displaying different types of information. The example is for illustration purposes only.

The NP graph process 700 enables a user to visualize whether or not the illustrated power device network protector is operating within a preferred range as defined by the power distribution system devices parameters which may be extracted from the device itself or as user predetermined factors. The power distribution system devices parameters include, but are not limited to, operational setpoints, current or voltage limits, the phase angle limits, temperature and or other environmental variables.

First at step 321, NP graph process 700 is initialized. This initialization includes the startup routines and processes embedded in the BIOS of the service device 11. The initialization also includes the establishment of data values for particular data structures utilized in the NP graph process 700.

At step 702, the software key authentication is performed. The software key authentication is defined further detail with regard to FIG. 17. The software key authentication is a security means to prevent unauthorized access to the remote monitoring device 20 by unauthorized personnel.

At step 703, the establish communication link process is performed. The establish communication link process is further detail with regard to FIG. 18A. The establish communication link process enables a user to poll for operational remote monitoring devices 20.

At step 704, the NP graph process 700 acquires set point data from the illustrated network protector if available. The set point data is used in creating a graphical image to the user to determine if the network protector is operating within a preferred range as defined by the power distribution system devices parameters which may be extracted from the device itself or as user predetermined factors. At step 705, all the voltages on the network protector side and voltages across each relay are acquired from the remote device 20.

At step 706, Vp factor is computed or acquired from the network protector device 7. This is the positive-sequence difference voltage, which is the positive sequence voltage on one side of a device minus the positive sequence voltage on the other side (for example, the transformer and network sides of a network protector) in accordance with industry standards. The phase angle of Vp is the phase angle of the difference voltage with respect to the network phase angle.

Figure 19C:
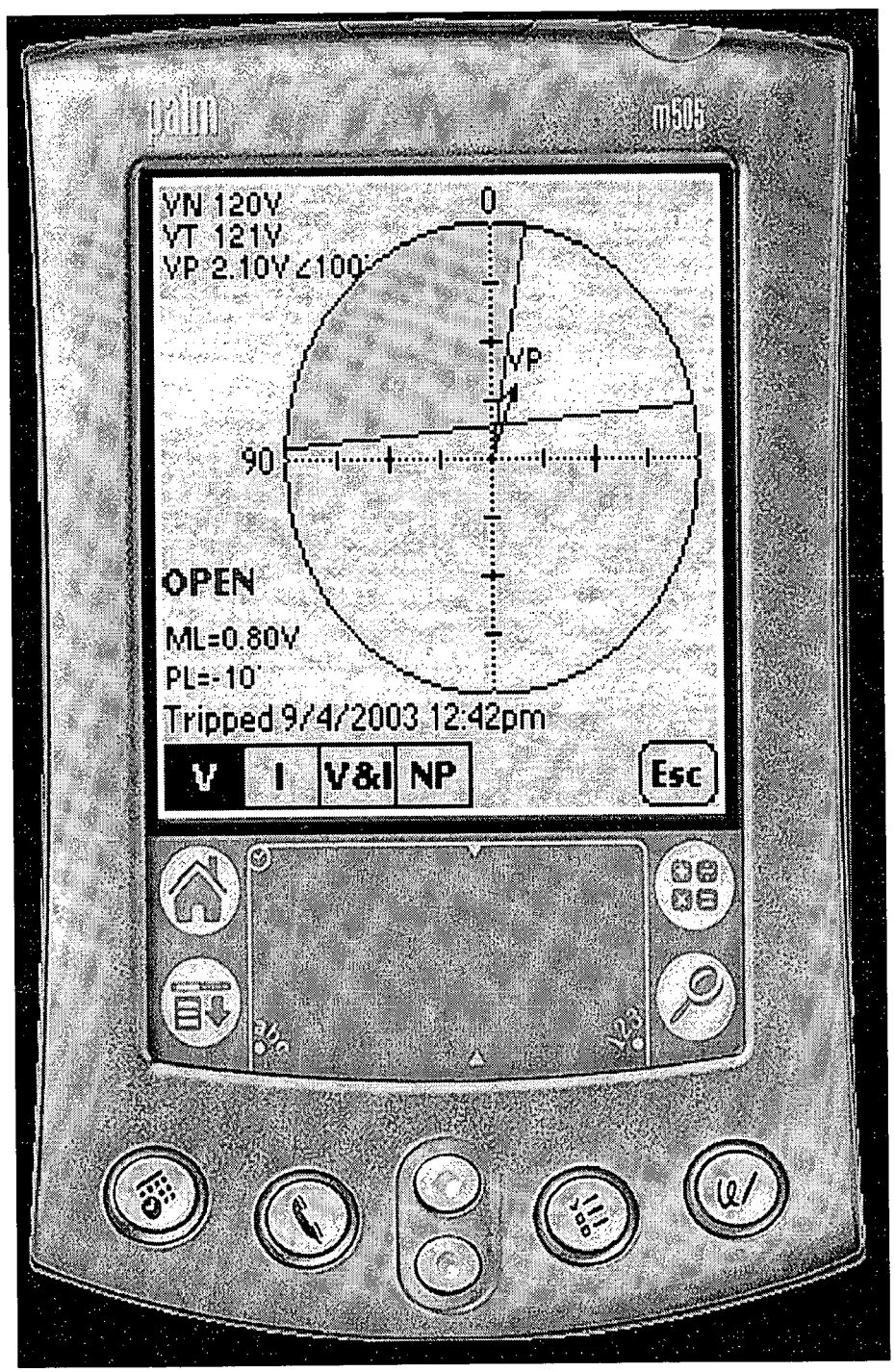
FIG. 19C is an example of information presentation available from the NP graph process utilized by the remote power monitoring system of the present invention, as shown in FIGS. 19A and 19B.

At step 707, the graphical image of the network protector region and computed Vp are displayed on the service device. An example of the graph is illustrated in FIG. 19C. At step 708, it is determined if there are additional graphs to be performed. If it is determined at step 708 that there are more graphs to be performed, then the NP graph process 700 returns to repeat steps 702 through 708. Otherwise, the NP graph process 700 exits at step 709.

FIG. 19B is a flow chart illustrating an example of the operation of the NP graph agent 720 utilized in the remote monitoring device 20 and utilized by the remote power monitoring system 100 of the present invention, as shown in FIGS. 2B, 3B, 3C and 4B. The NP graph agent 720 enables a user to visualize whether or not the illustrated power device network protector is operating within a preferred range as defined by the power distribution system devices parameters which may be extracted from the device itself or as user predetermined factors. The NP graph agent 720 example is illustrated for example purposes only as to what types of information could be useful to a user in analyzing a power distribution device. It is understood that other types of information for other types of devices could be acquired and provided for later analysis.

First at step 721, the NP graph agent 720 is initialized. This initialization includes the startup routines and processes embedded in the BIOS of the remote monitoring device 20. The initialization also includes the establishment of data values for particular data structures utilized in the NP graph agent 720.

At step 722, the establish communication link agent is performed. The establish communication link agent is described in further detail with regard to FIG. 18B. The establish communication link agent enables a user to poll for operational remote monitoring devices 20.

At step 723, the NP graph agent 700 acquires set point data from the illustrated network protector if available. The set point data is used in creating a graphical image for the user to determine if the network protector is operating within a desired region. At step 724, the set point data is sent to the service device if available.

At step 725, all the voltages on the network protector side and voltages across each relay are acquired and then sent to service device 11 at step 726. At step 707, it is determined if any additional data is required. If it is determined at step 707 that more data is required, then the NP graph agent 700 returns to repeat steps 702 through 707. Otherwise, the NP graph agent 700 exits at step 709.

Figure 20:
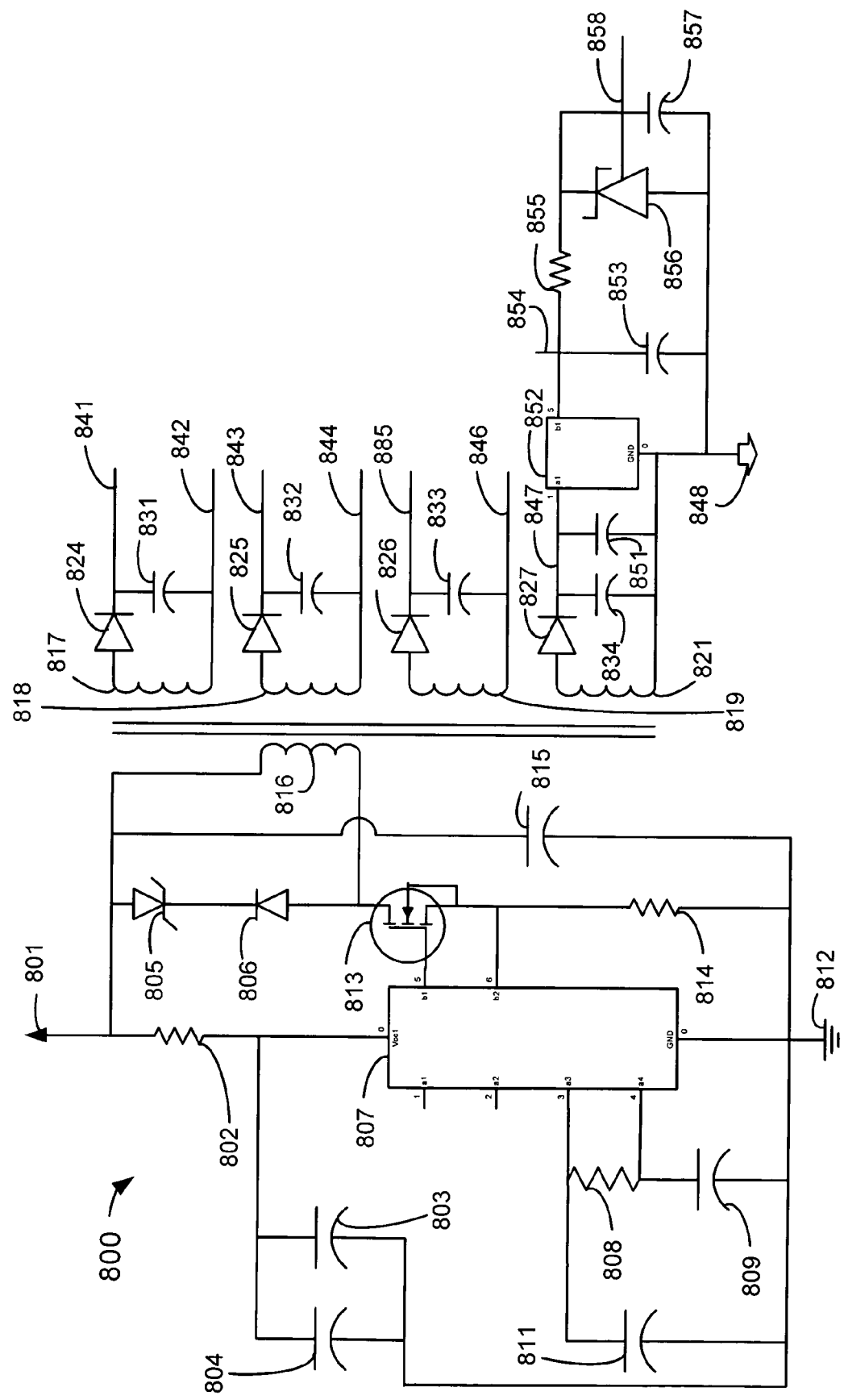
FIG. 20 is a schematic diagram illustrating an example of an isolated power supply 400 for the power quality monitoring the remote monitoring system 100 of the present invention, as shown in FIG. 2C.

FIG. 20 is a schematic diagram illustrating an example of an isolated power supply 800 for the power quality monitoring the remote monitoring system 100 of the present invention, as shown in FIG. 2C. The isolated power supply 800 converts the B+ input power supply voltage to four separate, isolated supply voltages V1–V4 B+, to power each of the four isolated voltage signal conditioning and A/D converter systems.

The illustrated example of a quad-isolated power supply 800 includes voltage outputs (841–848), and the regulated supply voltage and analog to digital (A/D) reference voltage circuitry for one channel (851–857). The isolators which isolate the signal and control lines to the A/Ds are herein described in further detail with regard to FIG. 25.

Switching power supply chip 807 uses transformer winding 816 to provide voltage to isolated transformer windings 817, 818, 819, and 821, whose outputs are rectified by diodes 824–827, and filtered by capacitors 831–834, to provide four isolated DC power outputs. An example of one set of isolated DC power output is leads 847 and 848. These outputs are regulated by circuitry in each voltage channel to provide clean DC power to each channel. Each set of isolated DC power outputs is isolated from other power outputs and well as the remaining circuitry of the remote monitoring device 100.

Components 851–857 are representative regulation circuits for a single channel, based on linear regulator 852, to create the regulated voltage signal 858. It is understood that the regulation circuitry would be duplicated for each channel being monitored, for example connections to lines for 841–846. It is understood that other configurations of circuitry may be utilized to obtain the same result.

Figure 21:
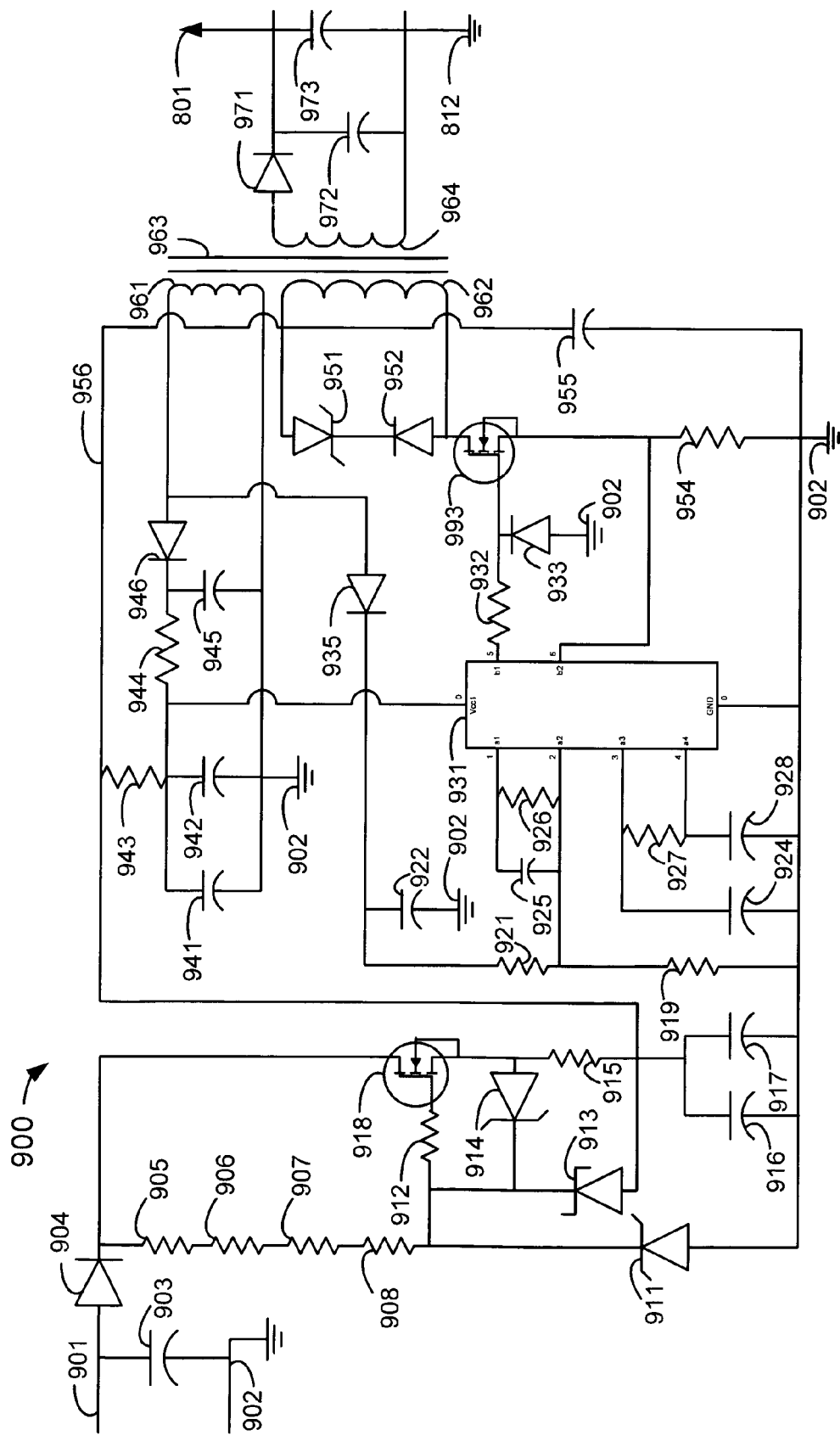
FIG. 21 is a schematic diagram illustrating an example of a pre-regulator component in the remote power monitoring system of the present invention, as shown in FIG. 2B.

FIG. 21 is a schematic diagram illustrating an example of a pre-regulator component 900 in the power quality monitoring the remote monitoring system 100 of the present invention, as shown in FIG. 2B. The pre-regulator components 900 converts AC input voltage to a rectified DC voltage.

Capacitor 903 provides across-the-line noise filtering. Rectifier diode 904 converts the bipolar AC input voltage on line 901 to half-wave rectified DC voltage, thereby producing a voltage magnitude at the cathode of rectifier diode 904 equal to the peak voltage of the input AC supply on line 901. This half-wave rectified DC voltage feeds gate bias circuitry for a series pass regulator implemented by FET 918. For each positive half cycle of the input AC waveform, the voltage rises on the input or drain of FET 918 and the gate of FET 918 as provided by bias resistors 905, 906, 907, and 908. As the voltage rises on the gate of FET 918, producing sufficient gate-to-source voltage for FET 91 8 conduction, FET 918 passes current to the pre-regulator output (i.e. power supply load) through current limiting resistor 915, thereby charging bulk storage capacitors 916 and 917. It is understood that other configurations of circuitry may be utilized to obtain the same result.

As the input AC voltage on line 901 continues to rise, Zener diode 911 will eventually conduct, limiting the rectifier diode 904 gate voltage to approximately 185V. As the rectifier diode 904 output (source lead) rises and approaches this gate-limited voltage, rectifier diode 904 begins to turn off due to the reducing gate-to-source voltage. This limits the pre-regulator output voltage across capacitors 916 and 917 to approximately 180VDC. In this manner the power supply output is self-limiting or regulating, as determined by the voltage of Zener diode 911. It is understood that other configurations of circuitry may be utilized to obtain the same result.

Components 912–914 comprise a protection circuit for FET 918 by limiting the gate-to-source voltage and gate current of FET 918. Resistor 915 further protects FET 918 by limiting the inrush current through FET 918 on supply startup, especially at input AC line voltages approaching 600V. It is understood that other configurations of circuitry may be utilized to obtain the same result.

Components 941 through 946 interact with transformer winding 961. Diode 946, resistor 943, and capacitors 941, 942 and 945 form a bootstrap power supply to power switching regulator 931. It is understood that other configurations of circuitry may be utilized to obtain the same result.

Components 922–935 and 951–955 interact with transformer winding 962. These components are used by power switching regulator 931 and transformer 963 to step the DC voltage 956 to a low AC voltage across winding 964. This is rectified by diode 971 and filtered by capacitors 972 and 973 for creating B+ voltage 401 (FIG. 10) which feeds to all other circuits. It is understood that other configurations of circuitry may be utilized to obtain the same result.

Figure 22:
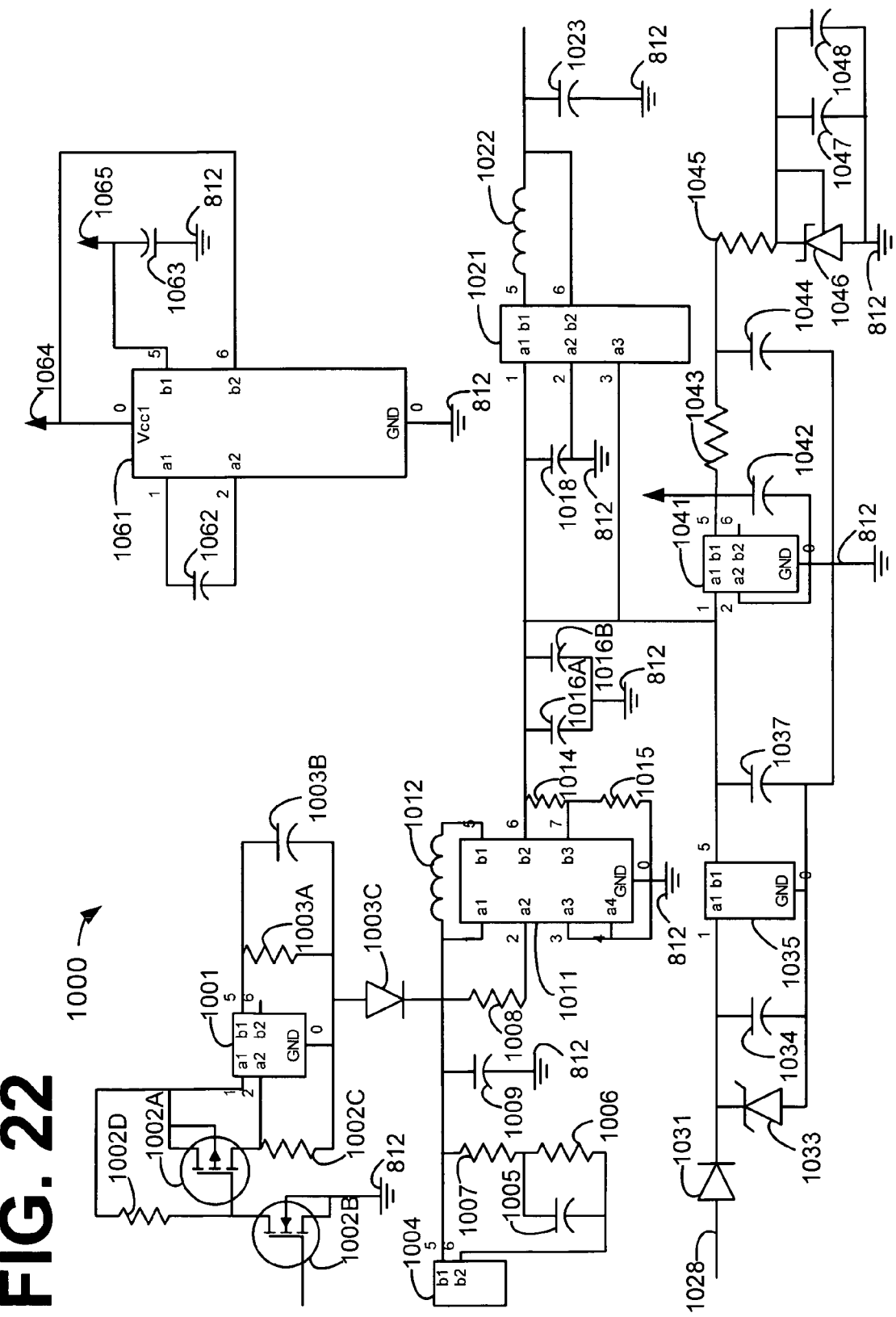
FIG. 22 is a schematic diagram illustrating an example of a multi-source power supply component in the remote power monitoring system of the present invention, as shown in FIG. 2B.

FIG. 22 is a schematic diagram illustrating an example of a multi-source power supply component 1000 in the power quality monitoring of the remote monitoring system 100 of the present invention, as shown in FIG. 2C. This multi-source power supply component 1000 can supply a regulated voltage to the main circuitry, and is fed from multiple sources, including an external wall adapter, an internal rechargeable battery, and the voltage being monitored on one channel. Each of these sources feeds into a separate power supply, which regulates the voltage to a level suitable for feeding the supply in FIG. 22. Electrical isolation is maintained in each power source and grounds (812, 842, 844, 846, 848 (FIG. 20) & 902 (FIG. 21)), as needed.

Power can be supplied from a battery 1004, such as for example but not limited to, one or more rechargeable or non-rechargeable batteries. Examples of rechargeable batteries include, but are not limited to, NiCad, Lithium-Ion or Nickel-Metal-Hydride batteries. Examples of non-rechargeable batteries include but are not limited to alkaline or lithium batteries. Voltage from battery 1004 enters through a connector and is doubled by voltage converter 1011 to provide a 5.5V DC voltage into the common DC bus B+ voltage 801 (FIG. 10) which is read by the DSP 1410 (FIG. 26A) to determine remaining battery life. Capacitor 1005 smoothes the value to allow lower noise A/D readings.

Regulator 1001 is used to provide a constant current charge into the battery; this chip is controlled by the DSP 910 so that charging does not occur when the remote monitoring device 20 is operating under battery power. The switching FETs 10021A and 1002B are used in conjunction with the resistors 1002C and 1002D to enable DSP 910 to control regulator 1001. The resistor 1003A is utilized to sets the charge current given regulator 1001 fixed output voltage. Capacitor 1003B is utilized to provide stability for the output of regulator 1001. Diode 1003C is utilized to prevent current from following from the battery 1004 into regulator 1001. It is understood that other configurations of circuitry may be utilized to obtain the same result.

A wall adapter or other DC input 1028, referred to hereafter as input 1028, may also power the remote monitoring device 20 through diode 1031. This input 1028 comes from an external connector on the device. A voltage of up to 15V may be applied here, and is regulated to 5V by linear regulator 1035 through capacitor 1034 and Zener diode 1033. Diode 1036 diode-OR's the output from linear regulator 1035 into B+ voltage 801. The B+ voltage 801 may also be fed from the output of FIG. 11. In any case, the B+ voltage 801 then feeds the isolated system in FIG. 20, and regulators 1021 and 1041 in FIG. 22.

Regulator 1021 is a switching regulator which provides 1.8V DC to the DSP core and Bluetooth module core, while regulator 1041 provides the preferred 3V DC to other circuitry including the SRAM 1121 and digital logic. This 3V power is filtered by resistor 1043 and capacitor 1044 to provide a quiet DC voltage to power the analog electronics used for current signal conditioning. It is understood that other configurations of circuitry may be utilized to obtain the same result.

In an alternative embodiment, it is considered a novel aspect that the B+ voltage 801 may be fed from either the wall transformer from FIG. 12, AC line voltage from FIG. 11, or the battery from FIG. 12, while maintaining isolation as needed for safety.

Another circuit is a power converter 1061–1065 for converting positive power components into negative power components. This circuit is utilized to power external accessories, and not utilized for the components within the preferred invention as illustrated in FIGS. 20 through 26B.

Figure 23:
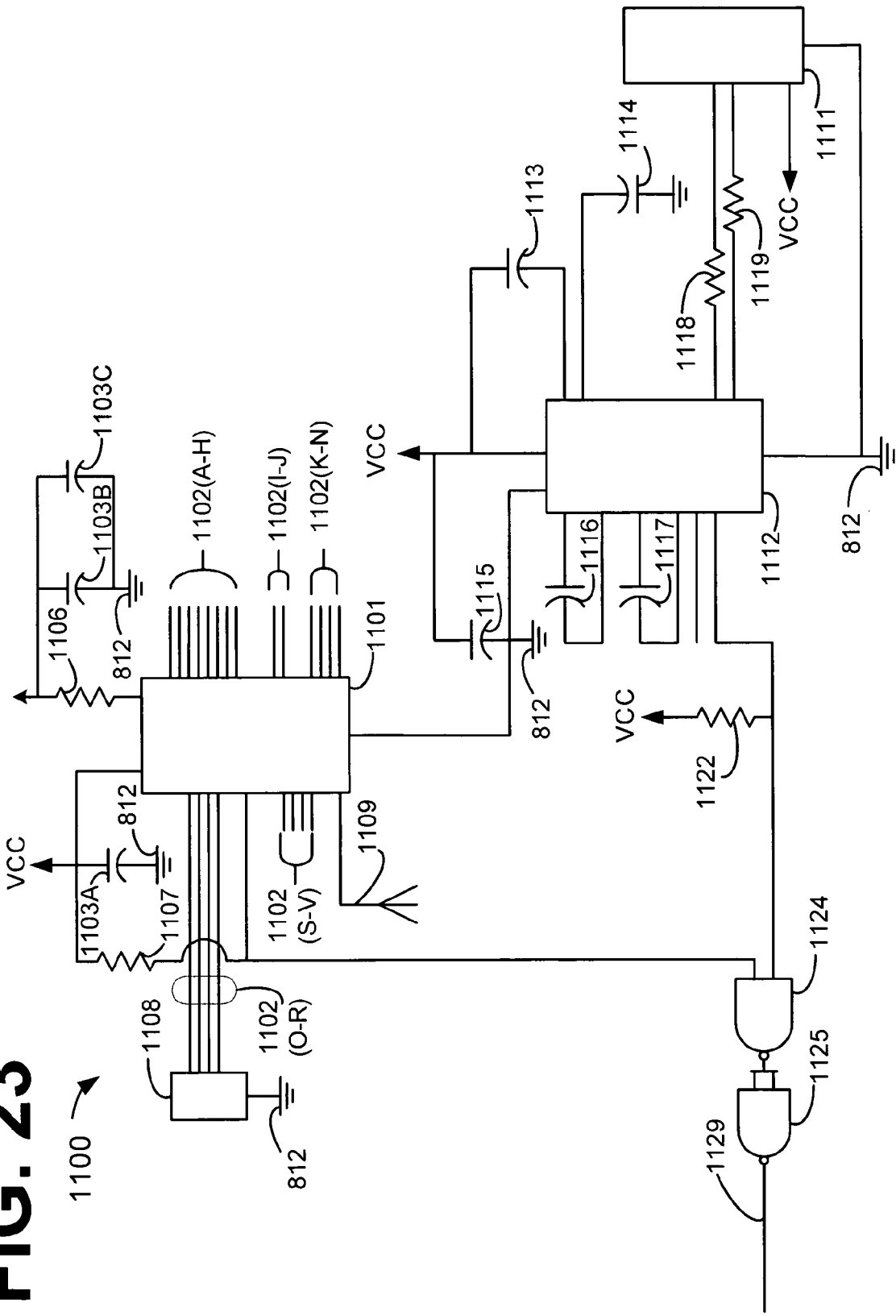
FIG. 23 is a schematic diagram illustrating an example of a transmitter component in the remote power monitoring system of the present invention, as shown in FIG. 2B.

FIG. 23 is a schematic diagram illustrating an example of a transmitter component 1100 in the power quality monitoring the remote monitoring system 100 of the present invention, as shown in FIGS. 2B. Preferably, the transmitter component 1100 includes at least one mode of wireless communication. In the illustrated example shown below, the wireless communication described is the short-range Bluetooth communication system. However, other types of wireless communication can be utilized in conjunction with or instead of the Bluetooth communication system. The other types include, but are not limited to: SI-FL, cellular, RF and the like.

The transmitter component 1100 in this illustrated example has both a wireless Bluetooth interface comprising components 1101–1109, and wired RS-232 port comprising components 1111–1117. These interfaces are multiplexed with logic gates 1125 and 1124, and resistor 1122. Both interfaces are connected to the digital signal processor (DSP) 1410 (FIG. 26A), allowing communication through either interface. DSP 1410 can also act as a bridge between the interfaces.

In addition, each interface (for example Bluetooth or RS-232) may be shut down at DSP 1410 control in order to save power in certain modes of operation. Module 1101 is preferably an embedded Bluetooth module which contains an on-board processor, FLASH memory, and RF interface and modulation circuitry (not shown). Module 1101 uses antenna 1109 to transmit and receive RF signals.

Capacitors 1103(A–C) filter the power supply lines so that RF transmission does not impose noise onto them. I/O lines 1102(A–H) are used to interface with the DSP 1410 so the DSP 1410 and Bluetooth module 701–109 can exchange setup and control parameters. The DSP 1410 can set Bluetooth parameters such as, but not limited to, a discovery name, idle time, baud rate, and other radio parameters via these I/O lines 1102(A–H). The Bluetooth module 701–709 can signal to the DSP 1410 that it is connected to a Bluetooth master, and is ready for data transmission. In the preferred embodiment, the DSP 1410 can thus sense whether inbound data is coming in through the Bluetooth module 1101 or the RS-232 port.

Other communication and control lines from module 1101 include a universal serial bus control lines 1102 (I–J) and PC and pulse control modulation (PCM) signals 1102 (K–N). In an alternative embodiment, the PCM signals 1102(K–N) can be used for voice or analog data communication. Module 1101 further includes communication and control lines for UART connections 1102 (S–V), SPI control lines 1102 (O–R). It is understood that other configurations of circuitry may be utilized to obtain the same result.

Transceiver 1112 is a voltage shifting chip which converts the RS-232 signal levels from connector 1111 to standard logical levels. Transceiver 1112 utilizes charge pump capacitors 1113–1117 to generate the RS-232 voltage levels. The logical-level signals are fed into logic gates 1124 and 1125. These logic gates combine the outputs from the Bluetooth module 1101 and transceiver 1112 so that only one may signal the DSP 910 at any one time. It is understood that other configurations of circuitry may be utilized to obtain the same result.

Figure 24:
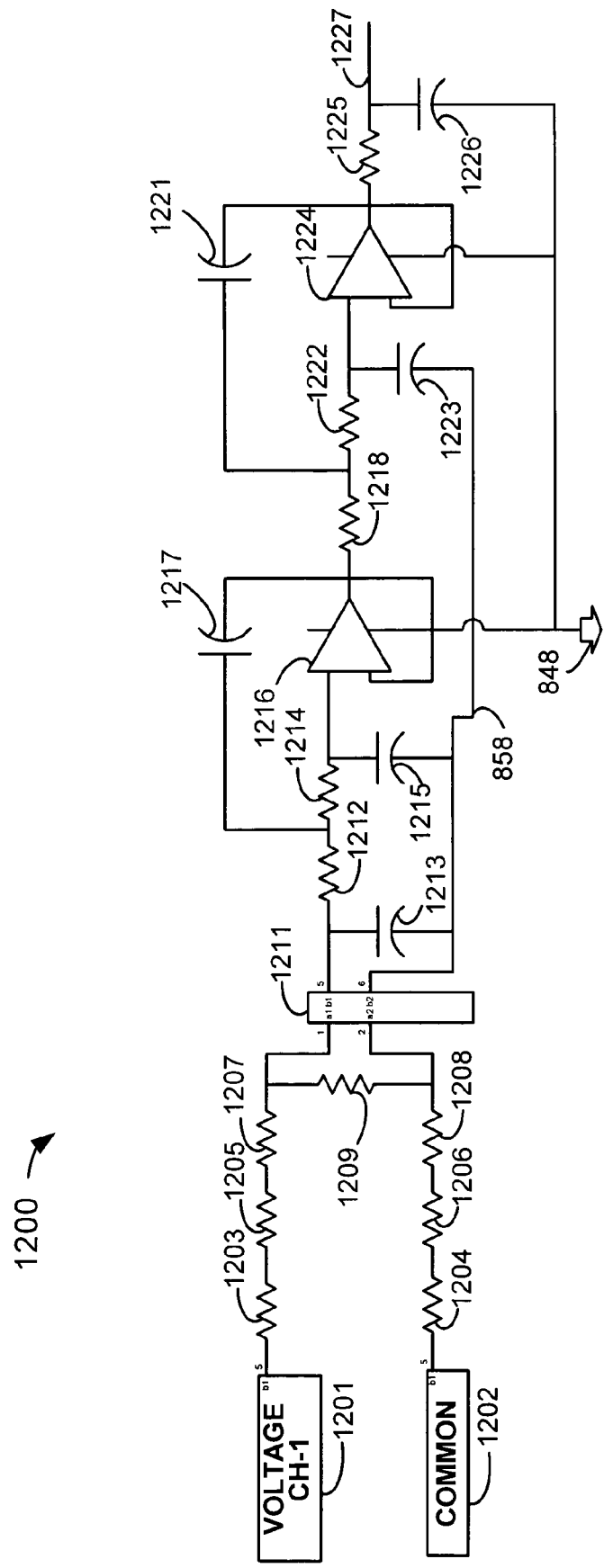
FIG. 24 is a schematic diagram illustrating an example of a voltage input and scaling component in the remote power monitoring system of the present invention, as shown in FIG. 2B.

FIG. 24 is a schematic diagram illustrating an example of a voltage input and scaling component 800 in the power quality monitoring of the remote monitoring system 100 of the present invention, as shown in FIG. 2C. This signal chain converts the 1000V max AC input into a low-voltage scaled, filtered signal suitable for digitizing by the voltage A/D converter for that channel.

Voltage is applied to terminals 801 and 802. The divider resistors 803–809 scale the voltage from up to 1000V down to around 1V that is suitable for further conditioning. It is understood that other configurations of circuitry may be utilized to obtain the same result. These divider resistors 803–809 also form an RC filter that protects isolators 931–932 and 933–934 (FIG. 25) from high voltage transients, in combination with transformer winding 421 (FIG. 20). Requirements for IEC Cat III demand protection from 15,000 volt transients; whereas the isolators used are only rated to 4000 volts, since higher voltage isolators suitable for this application do not exist.

The resistance of these divider resistors 803–809 combined with the winding capacitance of transformer winding 821 forms an RC circuit which filters the transient such that the peak voltage seen by the isolators is within their specifications. It is understood that multiple voltage input and scaling components are needed to monitor additional signals. For instances, at least three voltage input and scaling components are needed to monitor 3 phase circuits.

Figure 25:
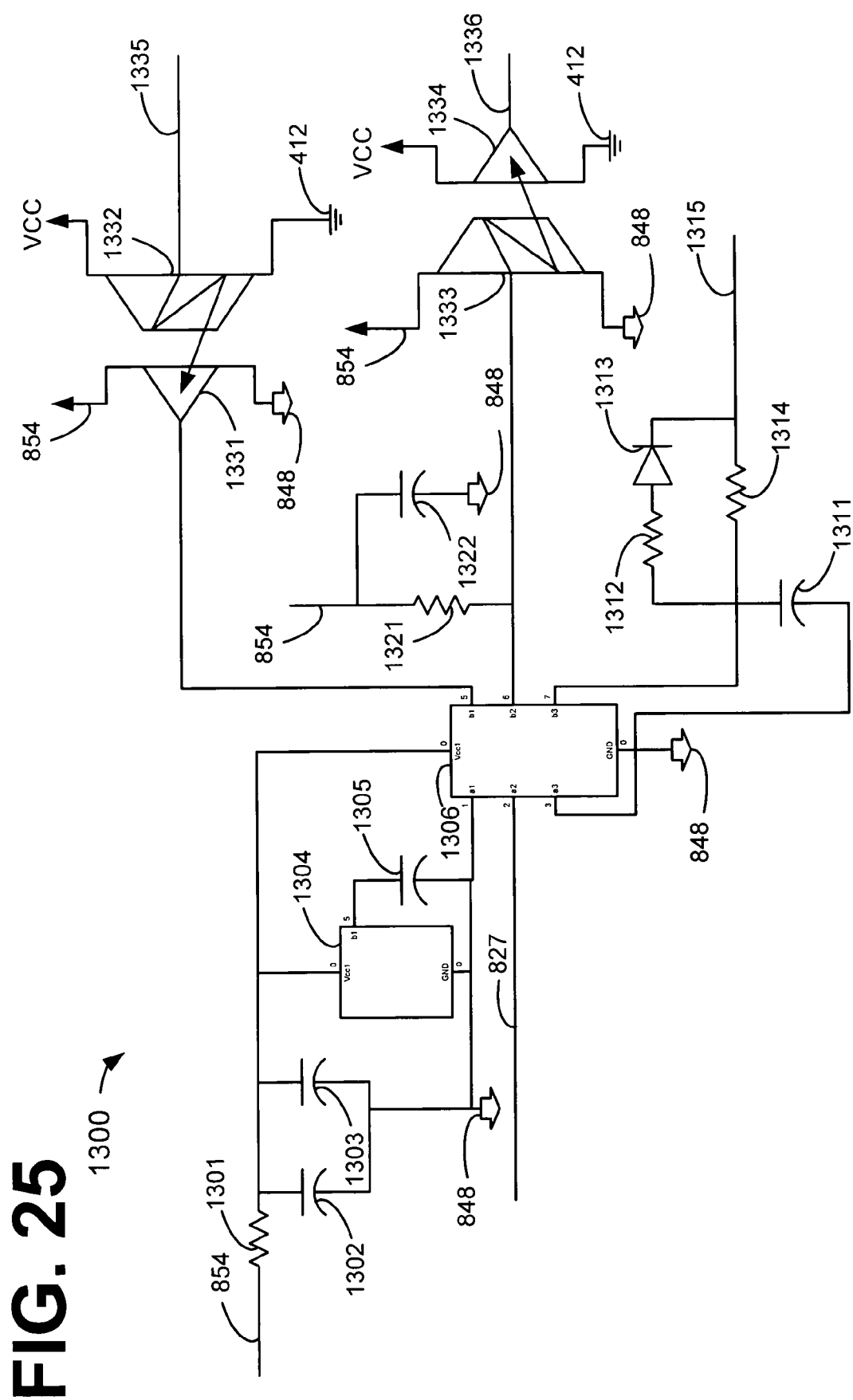
FIG. 25 is a schematic diagram illustrating an example of an A/D converter component in the remote power monitoring system of the present invention, as shown in FIG. 2B.

The circuitry 811–826 provides low pass filtering and analog signal conditioning using conventional techniques, before feeding the voltage signal 827 into the A/D converter 906 in FIG. 25. It is understood that other configurations of circuitry may be utilized to obtain the same result.

Current filtering and signal conditioning circuitry may be implemented utilizing well-known components or component 811 through 826 of the voltage input and scaling component 800 by utilizing slightly different values for the resistors and capacitors. When utilizing the circuit diagram of the voltage input and scaling component 800 for current filtering and signal conditioning, it would be obvious to one of ordinary skill in the art as to the approximate component values to acquire the desired bandwidth.

The FIG. 25 is a schematic diagram illustrating an example of an A/D converter component 1300 in the power quality monitoring of the remote monitoring system 100 of the present invention, as shown in FIG. 2C. This device digitizes the incoming analog signal for processing with the signal processing component of FIG. 26A, using conventional techniques.

In order to achieve the required size and performance, three conventional control lines needed to interface the A/D converter to the signal processor could not be used. In the preferred embodiment, a novel multiplexing scheme was devised to derive the A/D chip select signal for A/D converter 1306 from the A/D clock signal for A/D converter 1306, using a combination of RC delays and a diode, as shown in FIG. 25.

When the clock signal goes low, the RC constant formed by capacitor 1311 and resistor 1312 insures that the chip select line on A/D converter 1306 goes low for at least 55 nanoseconds after the clock line, thus meeting required setup times on the A/D converter. As the A/D clock toggles high and low, the RC time constant formed by resistor 1314 and capacitor 1311, in combination with diode 1313 insures that the chip select line stays low during the entire A/D conversion sequence. This is provided that the clock period is significantly faster than the RC time of approximately 6 microseconds.

When the conversion is complete, the clock line on A/D converter 1306 gets asserted (i.e. goes high), and approximately 6 microseconds later, the chip select on A/D converter 1306 also gets asserted (i.e. goes high), thus deselecting the A/D converter 1306, and making it ready for a new conversion. In this way, a separate chip select signal is not needed, and a prior required third digital isolator is eliminated. It is understood that other configurations of circuitry may be utilized to obtain the same result.

Digital isolators represented by component pair 1331–1332 and 1333–1334 maintain galvanic isolation between each of the voltage channels and the remaining circuitry of the remote monitoring device 100.

Figure 26A:
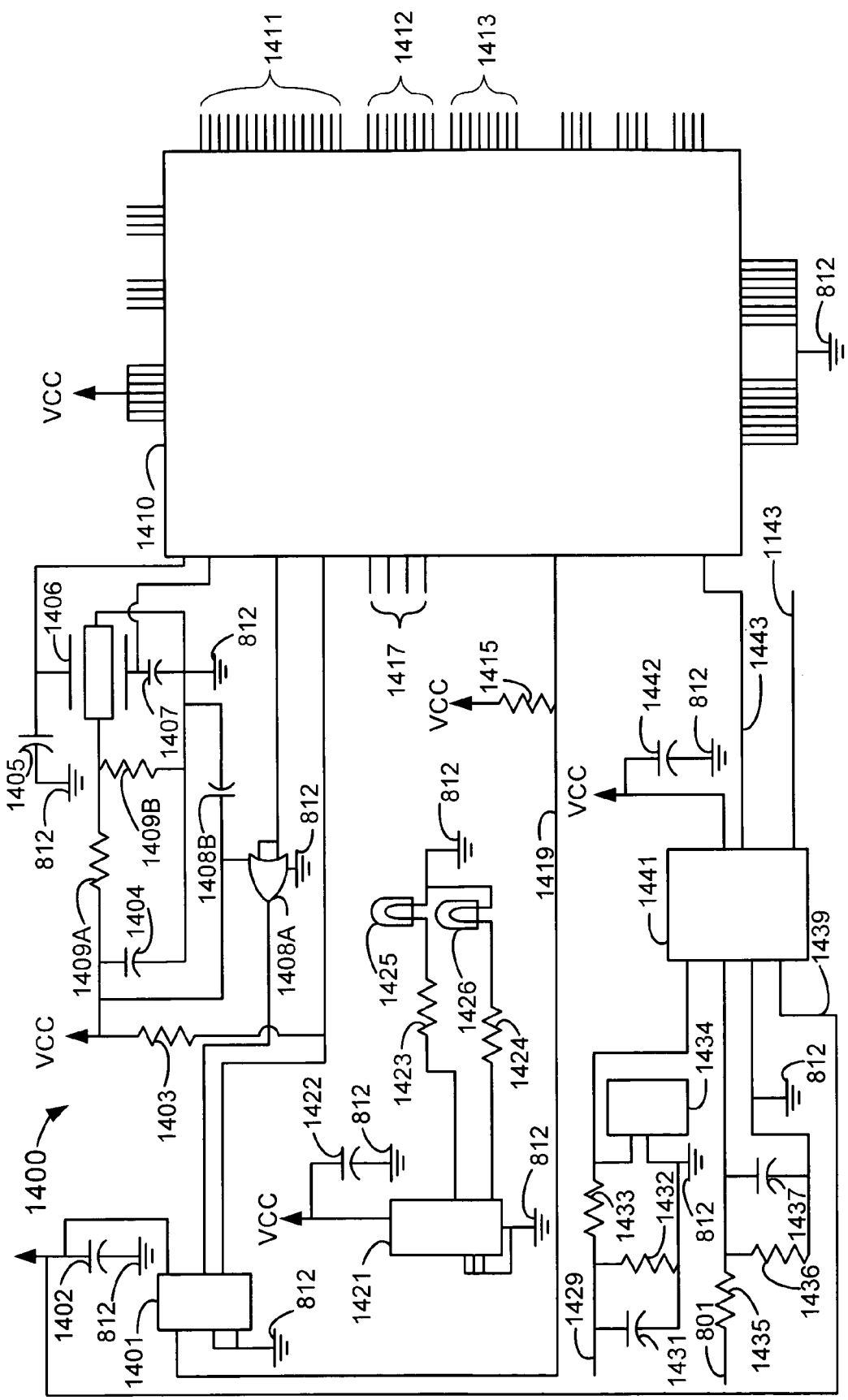
FIG. 26A is a schematic diagram illustrating an example of a signal processor component in the remote power monitoring system of the present invention, as shown in FIG. 2B.

FIG. 26A is a schematic diagram illustrating an example of a signal processor component in the power quality monitoring of the remote power monitoring system of the present invention, as shown in FIG. 2B. This processor (DSP) 1410 handles all signal processing, measurement, recording, and communications functions. It also decides when to switch to rechargeable battery power (based on the absence of power supply voltage from a wall adapter or voltage on channel one), and when to shut itself off to avoid complete discharge of the battery.

In the preferred embodiment, a real-time clock 1401 is used to store accurate system time. This real-time clock 1401 is battery-backed by a 3V lithium battery in the preferred embodiment. The once-per-second output 1419 from real-time clock 1401 is fed to the DSP through pull-up resistor 1415. The DSP 1410 uses this once-per-second output 1419 from real-time clock 901 to start the one-second tasks.

An input/output (I/O) expander 1421 provides for extra I/O lines for the DSP 910. These extra I/O lines can be utilized for expanded addresses for data lines. The light emitting diodes (LEDs) 1425 and 1426 provide indicators to the user of device state through different color combinations and blinking rates. In the preferred embodiment, LEDs 1425 and 1426 are integrated into a single LED. Other outputs from I/O expander 1421 include charge and shutdown lines (not shown) to the rechargeable battery 1434, and interface lines (not shown) to the wireless Bluetooth module. It is understood that other configurations of circuitry may be utilized to obtain the same result.

A power supervisory chip 1441 provides the master reset output 1503, and gives a low power warning to the DSP 1410 through the PFO line 1443. The power supervisory chip 1441 senses the system VCC voltage, and the B+ voltage 801 (FIG. 10) through the resistive divider of resistors 1435 and 1436, which is filtered by capacitor 1437. If the B+ voltage 801 drops to a low level, the power supervisory chip 1441 asserts the warning on PFO line 1443 to the DSP 1410.

The power supervisory chip 941 also feeds the 3V battery 1434 voltage to the SRAM and real time clock 901 through the VBACK line 1439. When the VCC voltage drops to a low level, the power supervisory chip 1441 switches the VBACK line 1439 from VCC to the voltage in battery 1434 on line 1429. This battery voltage is also divided by resistors 1432 and 1433 for sensing by the DSP 1410 through an auxiliary A/D. The user is warned then the voltage in battery 1434 is too low to maintain memory and time. It is understood that other configurations of circuitry may be utilized to obtain the same result.

The crystal 906 forms an oscillator using capacitors 1405 and 1407, along with the DSP 910. This oscillator drives the DSP 1410, and may also be the reference oscillator for any frequency measurement. It is understood that other configurations of circuitry may be utilized to obtain the same result.

Memory lines 1411 and 1413 provide addressing for SRAM 1521 and flash 1501 memory (FIG. 26B); while data lines 1412 provide data to the memory devices. The memory is herein described in further detail with regard to the description of FIG. 26B.

Figure 26B:
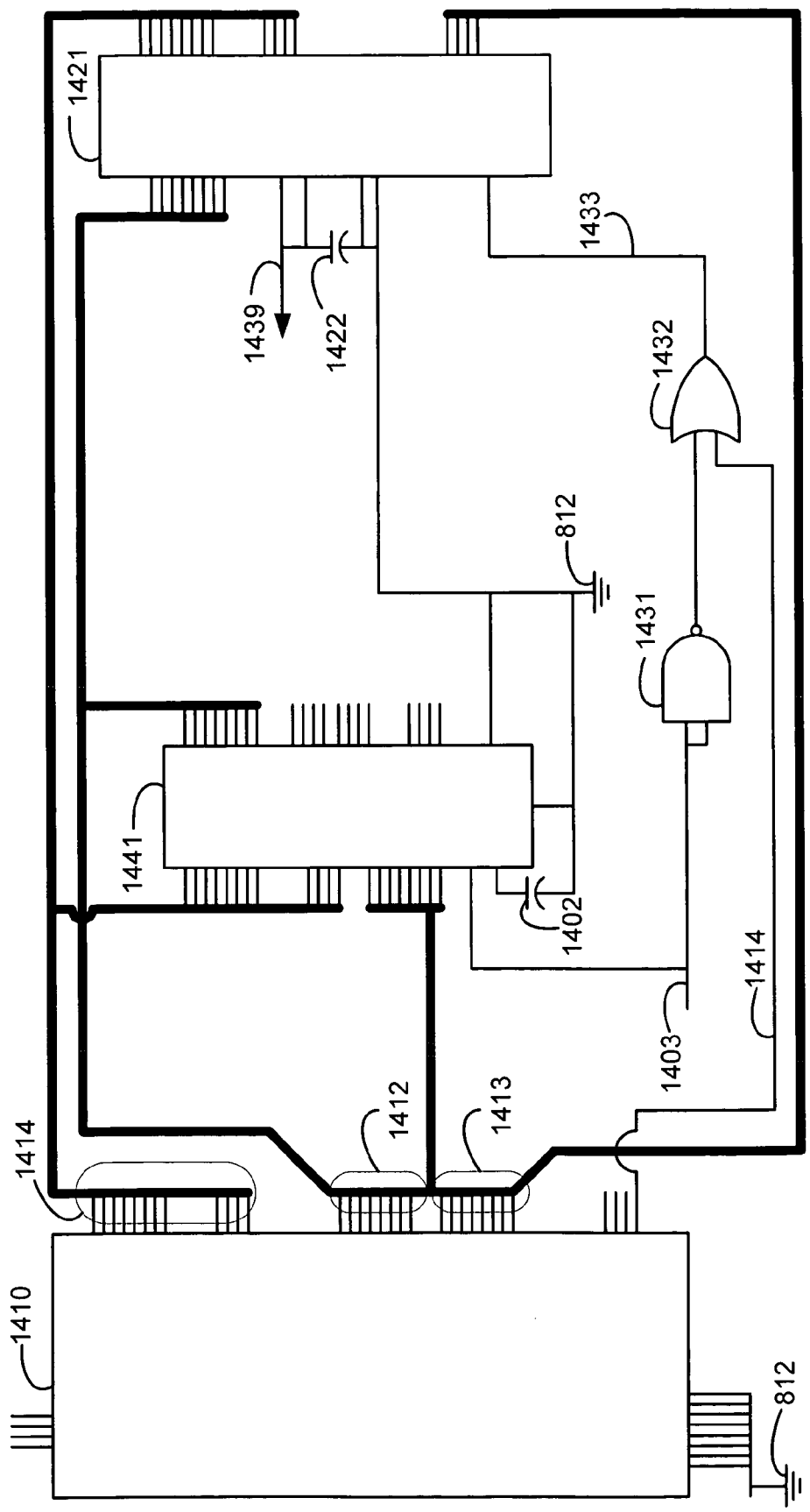
FIG. 26B is a schematic diagram illustrating an example of a fast non-volatile memory and static memory components connect to the signal processor component in the remote power monitoring system of the present invention, as shown in FIG. 2B.

FIG. 26B is a schematic diagram illustrating examples of a fast non-volatile memory, i.e. flash memory 1501, and static memory 1521 components. These components connect to the DSP 1410 in the power quality monitoring of the remote monitoring system 100 of the present invention, as shown in FIG. 2B. Flash memory 1501 and static memory 1521 components examples are illustrated with a limited number of address and data lines for simplicity of illustration only, and it is understood that any number of such address and data line are utilized in these components. This memory 1500 is used to store executable code, scratchpad variables, setup parameters, status, and recorded data.

In the preferred embodiment, flash memory 1501 stores both firmware code and recorded data using two independent banks. Calibration data can also stored in flash memory 1501, in a separate memory page. SRAM chip 1521 is utilized to store other recorded data, in addition to scratchpad and temporary values. Data which changes quickly (histogram data, waveform capture, etc.) are stored in SRAM 1521, while data which changes or is updated slowly is stored the flash 1501. Preferably, data is stored as strip chart data. Gates 1531 and 1532 insure that the SRAM 1521 is not enabled during a reset condition using not reset signal 1503 to avoid false writes during startup or bad power conditions. The not reset signal 1503 is generated by the power supervisory chip 1441 (FIG. 26A). The flash memory 1101 has internal circuitry to utilize the not reset signal 1503.

Any process descriptions or blocks in flow charts should be understood as representing modules, segments, or portions of code which include one or more executable instructions for implementing specific logical functions or steps in the process, and alternate implementations are included within the scope of the preferred embodiment of the present invention in which functions may be executed out of order from that shown or discussed, including substantially concurrently or in reverse order, depending on the functionality involved, as would be understood by those reasonably skilled in the art of the present invention.

It will be apparent to those skilled in the art that many modifications and variations may be made to embodiments of the present invention, as set forth above, without departing substantially from the principles of the present invention. All such modifications and variations are intended to be included herein within the scope of the present invention, as defined in the claims that follow.

What is claimed is:

1. A method comprising:
   detecting a power condition of a power device;
   computing an electrical value for the power device;
   displaying the computed electrical value in conjunction with operational parameters on a service device, the service device being located remotely from the power device; and
   receiving a request from the service device to adjust a system parameter in a monitoring device.

2. The method of claim 1, further comprising the step of:
   formatting the electrical value describing the power condition of the power device.

3. The method of claim 1, further comprising the steps of:
   sending the request to adjust the system parameter to the monitoring device.

4. The method of claim 3, further comprising the step of:
   providing adjustment of the system parameter in a connected remote monitoring device.

5. The method of claim 1, wherein the computed electrical value is selected from the group consisting of waveform values, RMS voltage, current, real power, apparent power, harmonics, phase angle, reactive power, power factor, displaced power factor, total harmonic distortion, total power quantities, total real power, reactive power, total power factors, phase angles, cycle histograms, cycle event changes, flicker, abnormal voltages, power outages, power device parameters, stray voltages, logs, current device status, set up parameters, calibration data, temperature, humidity, pressure, smoke content, security status, transformer temperature, oil level, and status.

6. The method of claim 1, further comprising the step of:
   acquiring a plurality of set points of the power device; and
   wherein the electrical value is computed in relation to the plurality of set points of the power device.

7. The method of claim 6, further comprising the step of:
   computing a power device operating region with the plurality of set points of the power device.

8. The method of claim 1, further comprising the step of:
   determining a power device operating status from the power condition of the power device.

9. The method of claim 8, further comprising the step of:
   providing a control instruction to command the monitoring device to provide a requested data.

10. A system comprising:
    a service device further comprising a transceiver circuitry that receives information of a power condition from a power device, the service device being located remotely from the power device;
    a computation circuitry to compute an electrical value for the power device;
    a display circuitry that displays the computed electrical value in conjunction with operational parameters of the power device; the transceiver circuitry being configured to transmit a request from the service device to adjust a system parameter in a monitoring device.

11. The system of claim 10, wherein the computation circuitry further comprises:
    a format circuitry that formats the electrical value for display.

12. The system of claim 10, wherein the computation circuitry further comprises:
    a data input circuitry that receives a command from a user to adjust the system parameter in the monitoring device.

13. The system of claim 10, wherein the computed electrical value is selected from the group consisting of waveform values, RilvJS voltage, current, real power, apparent power, harmonics, phase angle, reactive power, power factor, displaced power factor, total harmonic distortion, total power quantities, total real power, reactive power, total power factors, phase angles, cycle histograms, cycle event changes, flicker, abnormal voltages, power outages, power device parameters, stray voltages, logs, current device status, set up parameters, calibration data, temperature, humidity, pressure, smoke content, security status, transformer temperature, oil level, and status.

14. The system of claim 10, wherein the transceiver acquires a plurality of set points of the power device; and wherein the computation circuitry computes the electrical value in relation to the plurality of set points of the power device.

15. The system of claim 14, wherein the computation circuitry computes an operating region of the power device with the plurality of set points.

16. The system of claim 14, wherein the computation circuitry determines a power device operating status from the power condition of the power device.

17. The system of claim 10, wherein the transceiver sends a control instruction to command the power device to provide a requested data.

18. A system comprising:
    a monitoring device further comprising a detection circuitry that monitors a power device for at least one power condition; and
    a transceiver circuitry that transmits information of at least one power condition of the power device to a service device, the service device being located remotely from the power device, the transceiver circuitry being configured to receive a request from the service device to adjust a system parameter in the monitoring device.

19. The system of claim 18, wherein the transceiver circuitry further comprises:
    a receiver circuitry that receives a command from the service device to provide a requested data.

20. A system for providing remote monitoring of a power comprising:
means for detecting a power condition of a power device;
means for computing an electrical value for the power device;
means for displaying the computed electrical value in conjunction with operational parameters; and
means for receiving a request from a service device to adjust a system parameter in a monitoring device, the service device being located remotely from the power device.

21. The system of claim 20, further comprising:
means for formatting the electrical value describing the power condition of the power device.

22. The system of claim 20, wherein the transmitting means further comprises:
means for sending the request to adjust the system parameter to the monitoring device.

23. The system of claim 20, further comprising:
means for providing adjustment of the system parameter in a connected remote monitoring device.

24. The system of claim 20, wherein the computed electrical value is selected from the group consisting of waveform values, RMS voltage, current, real power, apparent power, harmonics, phase angle, reactive power, power factor, displaced power factor, total harmonic distortion, total power quantities, total real power, reactive power, total power factors, phase angles, cycle histograms, cycle event changes, flicker, abnormal voltages, power outages, power device parameters, stray voltages, logs, current device status, set up parameters, calibration data, temperature, humidity, pressure, smoke content, security status, transformer temperature, oil level, and status.

25. The system of claim 20, further comprising:
means for acquiring a plurality of set points of the power device; and wherein the electrical value is computed in relation to the plurality of set points of the power device.

26. The system of claim 20, wherein the computing means further comprises:
means for computing an operating region with the plurality of set points of the power device.

27. The system of claim 26, wherein the operating region computing means further comprises:
means for determining a power device operating status from the power condition of the power device.

28. The system of claim 20, wherein the transmitting means further comprises:
means for providing a control instruction to a connected remote monitoring device.

29. A computer readable medium for a logic comprising:
logic for detecting a power condition of a power device;
logic for computing an electrical value for the power device;
logic for displaying the computed electrical value in conjunction with operational parameters; and
logic for receiving a request from a service device to adjust a system parameter in the power device, the service device being located remotely from the power device.

30. The computer readable medium of claim 29, further comprising:
logic for formatting the electrical value describing the power condition of the power device.

31. The computer readable medium of claim 29, further comprising:
logic for sending the request to adjust the system parameter to the power device.

32. The computer readable medium of claim 29, further comprising:
logic for providing adjustment of the system parameter in a connected remote power device.

33. The computer readable medium of claim 29, wherein the computed electrical value is selected from the group consisting of waveform values, RMS voltage, current, real power, apparent power, harmonics, phase angle, reactive power, power factor, displaced power factor, total harmonic distortion, total power quantities, total real power, reactive power, total power factors, phase angles, cycle histograms, cycle event changes, flicker, abnormal voltages, power outages, power device parameters, stray voltages, logs, current device status, set up parameters, calibration data, temperature, humidity, pressure, smoke content, security status, transformer temperature, oil level, and status.

34. The computer readable medium of claim 29, further comprising:
logic for acquiring a plurality of set points of the power device; and wherein the electrical value is computed in relation to the plurality of set points of the power device.

35. The computer readable medium of claim 29, further comprising:
logic for computing an operating region with the plurality of set points of the power device.

36. The computer readable medium of claim 29, further comprising:
logic for determining a operating status of the power device from the power condition.

37. The computer readable medium of claim 29, further comprising:
logic for providing a control instruction to a connected remote monitoring device.

* * * * *